(12) United States Patent
Wu et al.

(10) Patent No.: US 7,780,789 B2
(45) Date of Patent: Aug. 24, 2010

(54) VORTEX CHAMBER LIDS FOR ATOMIC LAYER DEPOSITION

(75) Inventors: Dien-Yeh Wu, San Jose, CA (US);
Puneet Bajaj, Bangalore (IN);
Xiaoxiong Yuan, San Jose, CA (US);
Steven H. Kim, Union City, CA (US);
Schubert S. Chu, San Francisco, CA (US); Paul F. Ma, Santa Clara, CA (US);
Joseph F. Aubuchon, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/923,589

(22) Filed: Oct. 24, 2007

(65) Prior Publication Data
US 2008/0107809 A1 May 8, 2008

Related U.S. Application Data

(63) Continuation-in-part of application No. 11/077,753, filed on Mar. 11, 2005, which is a continuation of application No. 10/032,284, filed on Dec. 21, 2001, now Pat. No. 6,916,398, and application No. 11/923,589, which is a continuation-in-part of application No. 11/680,995, filed on Mar. 1, 2007, now Pat. No. 7,402,210, which is a continuation of application No. 10/712,690, filed on Nov. 13, 2003, now Pat. No. 7,204,886.

(60) Provisional application No. 60/862,764, filed on Oct. 24, 2006, provisional application No. 60/346,086, filed on Oct. 26, 2001, provisional application No. 60/426,134, filed on Nov. 14, 2002.

(51) Int. Cl.
*C23C 16/00* (2006.01)
*H01L 21/306* (2006.01)

(52) U.S. Cl. .................. 118/715; 156/345.33

(58) Field of Classification Search .................. 118/715
See application file for complete search history.

(56) References Cited

U.S. PATENT DOCUMENTS 5,951,771 A * 9/1999 Raney et al. .......... 118/723 ER (Continued)

FOREIGN PATENT DOCUMENTS

| JP | 4087323 | 3/1992 |
| JP | 2001020075 | 1/2001 |

OTHER PUBLICATIONS

Notice of Reasons for Rejection dated Mar. 3, 2009 for Japanese Application No. 2003/538423.

*Primary Examiner*—Karla Moore
(74) *Attorney, Agent, or Firm*—Patterson & Sheridan, LLP

(57) ABSTRACT

Embodiments of the invention relate to apparatuses and methods for depositing materials on substrates during atomic layer deposition processes. In one embodiment, a chamber for processing substrates is provided which includes a chamber lid assembly containing an expanding channel extending along a central axis at a central portion of the chamber lid assembly and a tapered bottom surface extending from the expanding channel to a peripheral portion of the chamber lid assembly. The tapered bottom surface may be shaped and sized to substantially cover the substrate receiving surface. The chamber lid assembly further contains a conduit coupled to a gas passageway, another conduit coupled to another gas passageway, and both gas passageways circumvent the expanding channel. Each of the passageways has a plurality of inlets extending into the expanding channel and the inlets are positioned to provide a circular gas flow through the expanding channel.

24 Claims, 37 Drawing Sheets

U.S. PATENT DOCUMENTS

| | | |
|---|---|---|
| 6,143,077 A | 11/2000 | Ikeda et al. |
| 6,562,140 B1 | 5/2003 | Bondestam et al. |
| 6,734,020 B2 * | 5/2004 | Lu et al. .................. 436/55 |
| 6,797,108 B2 | 9/2004 | Wendling |
| 6,821,563 B2 | 11/2004 | Yudovsky |
| 6,866,746 B2 | 3/2005 | Lei et al. |
| 6,916,398 B2 | 7/2005 | Chen et al. |
| 6,951,804 B2 | 10/2005 | Seutter et al. |
| 7,066,194 B2 | 6/2006 | Ku et al. |
| 7,094,680 B2 | 8/2006 | Seutter et al. |
| 7,175,713 B2 | 2/2007 | Thakur et al. |
| 7,204,886 B2 | 4/2007 | Chen et al. |
| 7,228,873 B2 | 6/2007 | Ku et al. |
| 7,402,210 B2 | 7/2008 | Chen et al. |
| 7,408,225 B2 | 8/2008 | Shinriki et al. |
| 2002/0104481 A1 | 8/2002 | Chiang et al. |
| 2003/0121608 A1 | 7/2003 | Chen et al. |
| 2005/0139160 A1 | 6/2005 | Lei et al. |
| 2005/0173068 A1 | 8/2005 | Chen et al. |
| 2005/0252449 A1 | 11/2005 | Nguyen et al. |
| 2005/0271812 A1 | 12/2005 | Myo et al. |
| 2005/0271813 A1 | 12/2005 | Kher et al. |
| 2006/0030148 A1 | 2/2006 | Seutter et al. |
| 2006/0216928 A1 | 9/2006 | Chung et al. |
| 2007/0003698 A1 | 1/2007 | Chen et al. |
| 2007/0026147 A1 | 2/2007 | Chen et al. |
| 2007/0059948 A1 | 3/2007 | Metzner et al. |
| 2007/0095285 A1 | 5/2007 | Thakur et al. |
| 2007/0119370 A1 | 5/2007 | Ma et al. |
| 2007/0119371 A1 | 5/2007 | Ma et al. |
| 2007/0128862 A1 | 6/2007 | Ma et al. |
| 2007/0128863 A1 | 6/2007 | Ma et al. |
| 2007/0128864 A1 | 6/2007 | Ma et al. |
| 2008/0038463 A1 | 2/2008 | Chen et al. |
| 2008/0041307 A1 | 2/2008 | Nguyen et al. |
| 2008/0041313 A1 | 2/2008 | Chen et al. |
| 2008/0044569 A1 | 2/2008 | Myo et al. |
| 2008/0102203 A1 | 5/2008 | Wu et al. |
| 2008/0120208 A1 | 5/2008 | Berkooz |
| 2008/0268171 A1 | 10/2008 | Ma et al. |
| 2008/0274299 A1 | 11/2008 | Chen et al. |

* cited by examiner

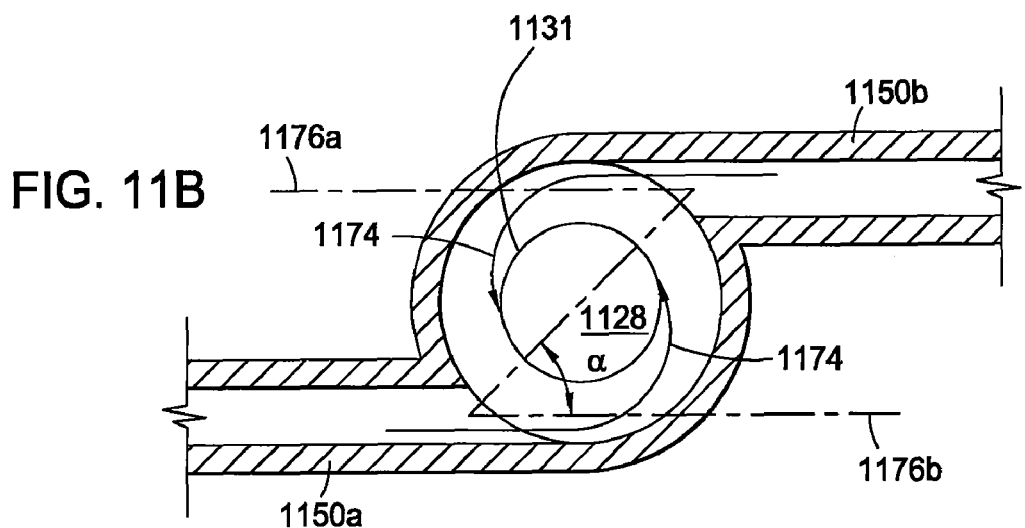
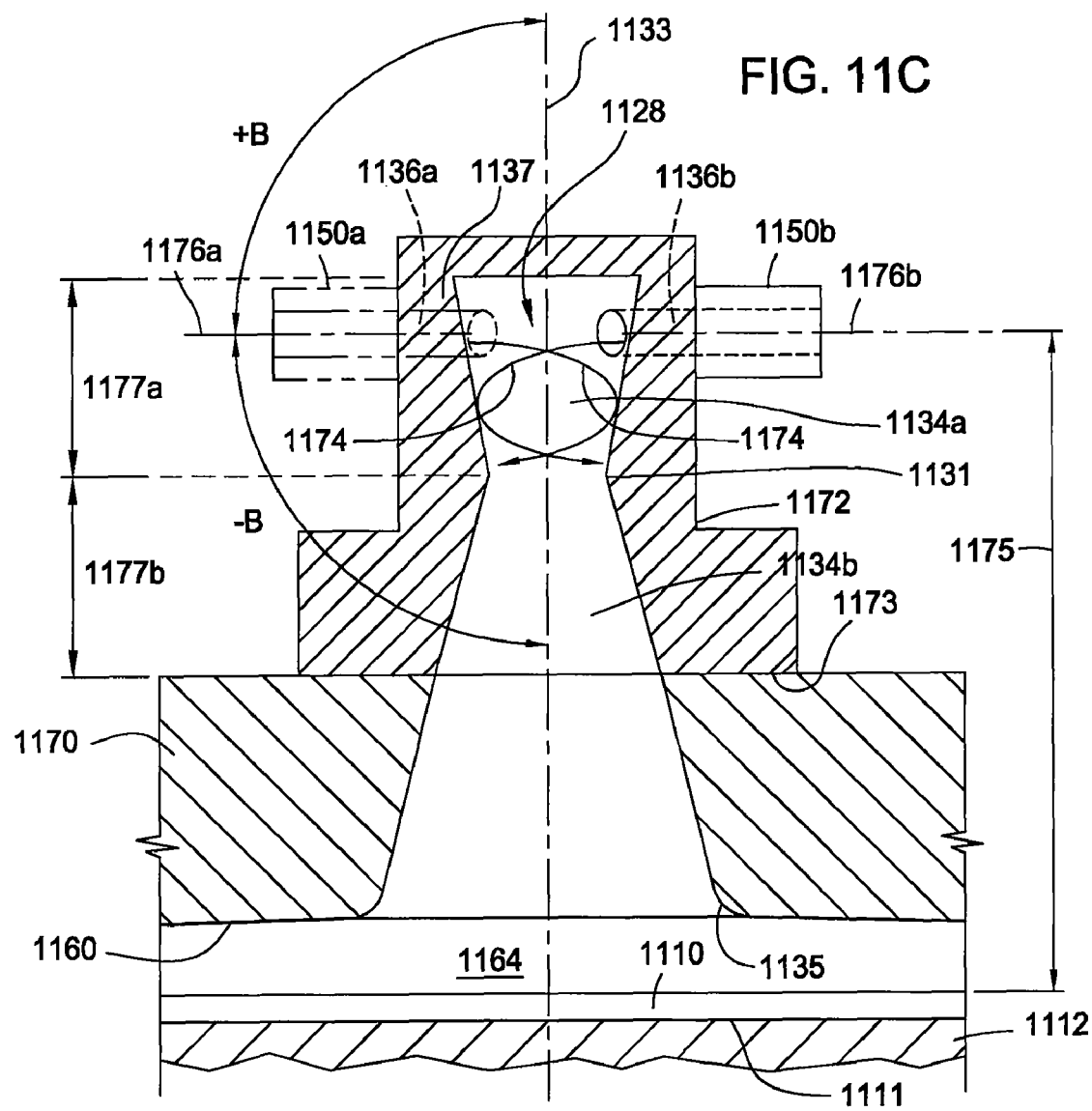

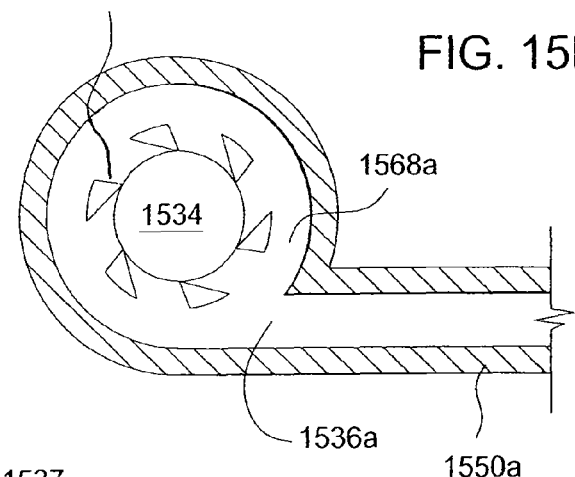
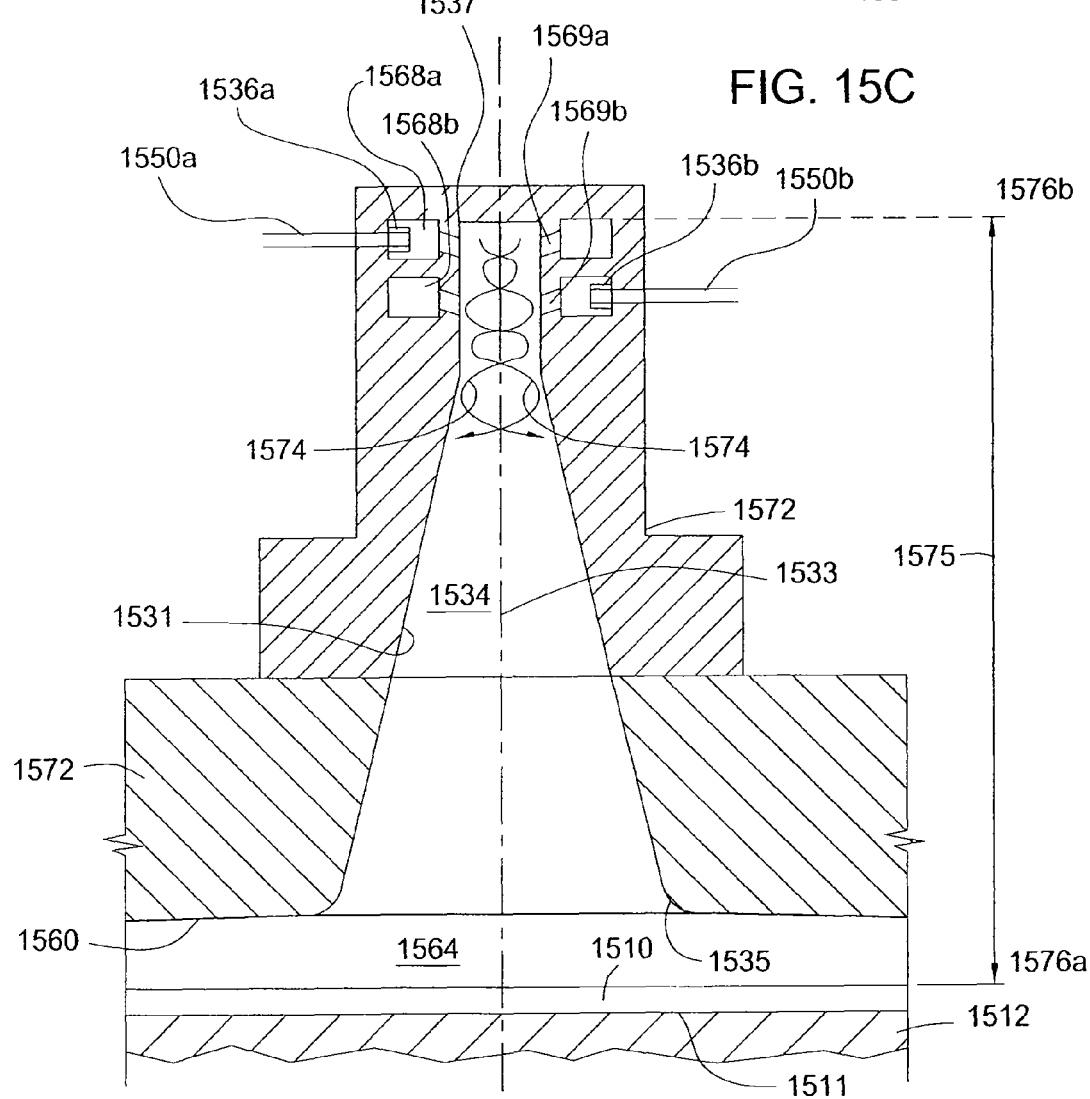

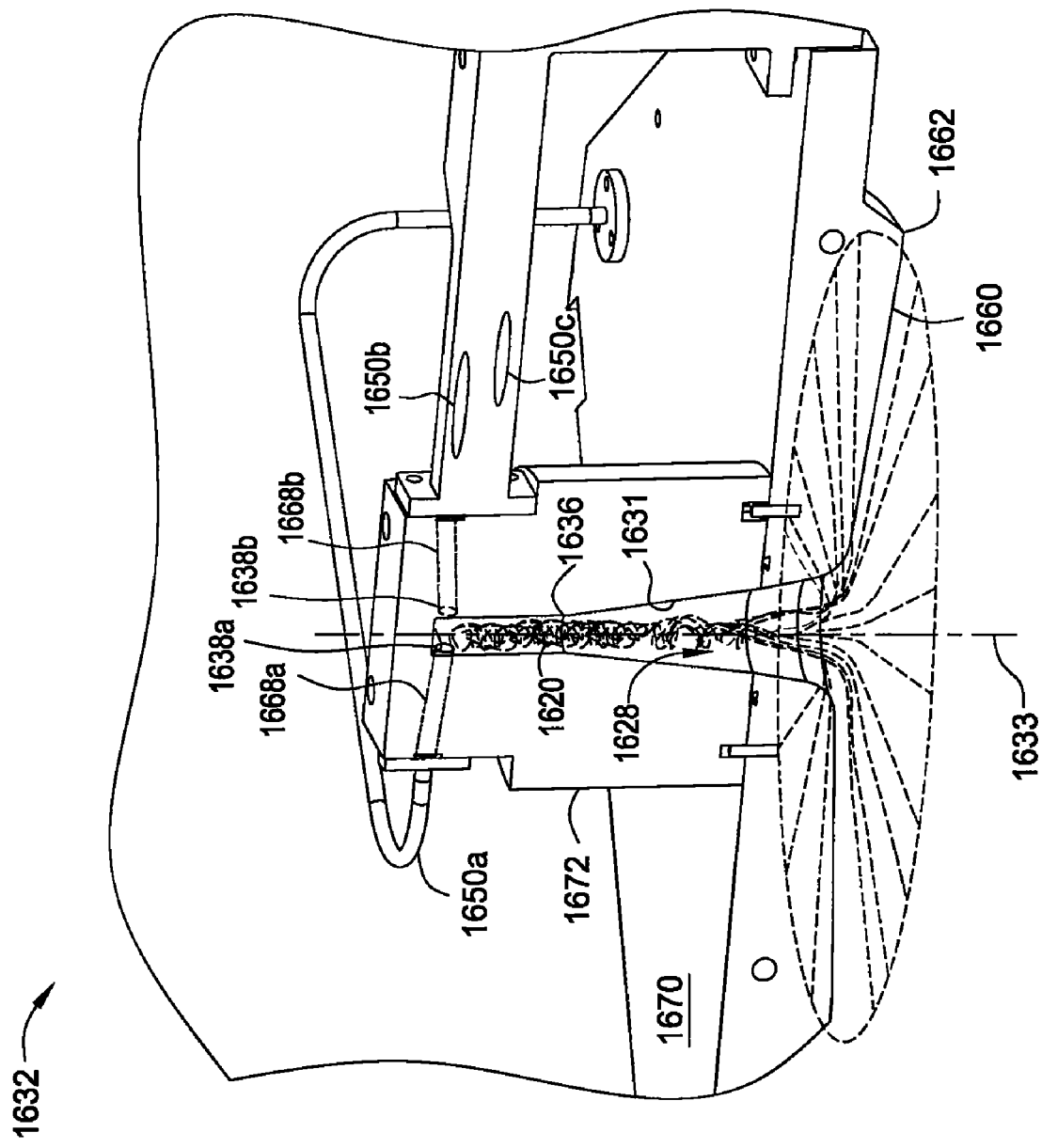

VORTEX CHAMBER LIDS FOR ATOMIC LAYER DEPOSITION

CROSS-REFERENCE TO RELATED APPLICATIONS

This application claims benefit of U.S. Ser. No. 60/862,764 (APPM/011546L), filed Oct. 24, 2006, which is herein incorporated by reference in its entirety.

This application is also a continuation-in-part of U.S. Ser. No. 11/077,753, filed Mar. 11, 2005, which is a continuation of U.S. Ser. No. 10/032,284, filed Dec. 21, 2001, and issued as U.S. Pat. No. 6,916,398, which claims benefit of U.S. Ser. No. 60/346,086, filed Oct. 26, 2001, which are herein incorporated by reference in their entirety.

This application is also a continuation-in-part of U.S. Ser. No. 11/680,995, filed Mar. 1, 2007, now U.S. Pat. No. 7,402,210 which is a continuation of U.S. Ser. No. 10/712,690, filed Nov. 13, 2003, and issued as U.S. Pat. No. 7,204,886, which claims benefit of U.S. Ser. No. 60/426,134, filed Nov. 14, 2002, which are herein incorporated by reference in their entirety.

BACKGROUND OF THE INVENTION

1. Field of the Invention

Embodiments of the invention generally relate to an apparatus and method for atomic layer deposition. More particularly, embodiments of the invention relate to an improved gas delivery apparatus and method for atomic layer deposition.

2. Description of the Related Art

Reliably producing submicron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of interconnects, such as vias, trenches, contacts, and other features, as well as the dielectric materials between, decrease to 45 nm and 32 nm dimensions, whereas the thickness of the dielectric layers remain substantially constant, with the result of increasing the aspect ratios of the features. Many traditional deposition processes have difficulty filling submicron structures where the aspect ratio exceeds 4:1, and particularly where the aspect ratio exceeds 10:1. Therefore, there is a great amount of ongoing effort being directed at the formation of substantially void-free and seam-free submicron features having high aspect ratios.

Atomic layer deposition (ALD) is a deposition technique being explored for the deposition of material layers over features having high aspect ratios. One example of an ALD process includes the sequential introduction of pulses of gases. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality of gases. Sequential introduction of separate pulses of the first reactant and the second reactant may result in the alternating self-limiting absorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

Therefore, there is a need for apparatuses and methods used to deposit material films during ALD processes.

SUMMARY OF THE INVENTION

Embodiments of the invention relate to apparatuses and methods for uniformly depositing materials on a substrate during an atomic layer deposition (ALD) process. The high degree of uniformity for the deposited materials may be attributed to exposing the substrate to a deposition gas having circular gas flow pattern, such as a vortex pattern. In one embodiment, a process chamber contains a chamber lid assembly containing a centralized expanding channel and a tapered bottom surface extending from the expanding channel to a peripheral portion of the chamber lid assembly. The tapered bottom surface is shaped and sized to substantially cover the substrate receiving surface. Another embodiment of a chamber includes a chamber lid assembly containing a centralized gas dispersing channel containing a converging channel and a diverging channel. Another embodiment of a chamber includes a chamber lid assembly containing at least two gas passageways circumventing an expanding channel. A plurality of inlets extend from each gas passageway into the expanding channel and are positioned to provide a circular gas flow pattern through the expanding channel.

In one embodiment, a chamber for processing substrates is provided which includes a substrate support containing a substrate receiving surface and a chamber lid assembly. The chamber lid assembly contains a gas dispersing channel at a central portion of the chamber lid assembly, wherein a converging portion of the gas dispersing channel tapers towards a central axis of the gas dispersing channel, a diverging portion of the gas dispersing channel tapers away from the central axis, and a tapered bottom surface extending from the diverging portion of the gas dispersing channel to a peripheral portion of the chamber lid assembly, wherein the tapered bottom surface is shaped and sized to substantially cover the substrate receiving surface. The chamber lid assembly further contains a first conduit coupled to a first gas inlet within the converging portion of the gas dispersing channel and a second conduit coupled to a second gas inlet within the converging portion of the gas dispersing channel, wherein the first conduit and the second conduit are positioned to provide a circular gas flow pattern through the gas dispersing channel.

In one example, the first conduit and the second conduit are independently positioned to direct gas at an inner surface of the converging portion of the gas dispersing channel. The circular gas flow pattern contains a flow pattern of a vortex, a helix, a spiral, a twirl, a twist, a coil, a whirlpool, derivatives thereof, or combinations thereof. In some examples, the circular gas flow pattern extends at least about 1 revolution around the central axis of the gas dispersing channel, preferably about 1.5, about 2, about 3, about 4, or more revolutions around the central axis of the gas dispersing channel.

In some embodiments, a first valve is coupled to the first conduit and a second valve is coupled to the second conduit, and a first gas source is in fluid communication to the first valve and a second gas source is in fluid communication to the second valve. The first and second valves enable an atomic layer deposition process with a pulse time of about 2 seconds or less, such as within a range from about 0.05 seconds to about 0.5 seconds. In other examples, the first conduit and the second conduit are independently positioned at an angle greater than 0° from the central axis of the gas dispersing channel in order to form a circular gas flow.

In one example, the process chamber may contain a reaction zone having a volume of about 3,000 cm$^3$ or less, wherein the reaction zone is defined between the tapered bottom surface and the substrate receiving surface. Other examples provide that the volume may be about 1,500 cm$^3$ or less, such as about 600 cm$^3$ or less.

In another embodiment, a chamber for processing substrates is provided which includes a chamber lid assembly containing a gas dispersing channel at a central portion of the chamber lid assembly, wherein a converging portion of the gas dispersing channel tapers towards a central axis of the gas dispersing channel and a diverging portion of the gas dispersing channel tapers away from the central axis, a first conduit coupled to a first gas inlet within the converging portion of the gas dispersing channel, a second conduit coupled to a second gas inlet within the converging portion of the gas dispersing channel, wherein the first conduit and the second conduit are positioned to provide a circular gas flow pattern, and a first valve coupled to the first conduit and a second valve coupled to the second conduit, where the first and second valves enable an atomic layer deposition process with a pulse time of about 2 seconds or less.

In one example, the chamber lid assembly further contains a tapered bottom surface extending from the diverging portion of the gas dispersing channel to a peripheral portion of the chamber lid assembly. The tapered bottom surface may be shaped and sized to substantially cover the substrate receiving surface. In other examples, a first gas source may be in fluid communication to the first valve and a second gas source may be in fluid communication to the second valve, and the first conduit and the second conduit are independently positioned to direct gas at an inner surface of the converging portion of the gas dispersing channel. The circular gas flow pattern contains a flow pattern of a vortex, a helix, a spiral, a twirl, a twist, a coil, a whirlpool, derivatives thereof, or combinations thereof. In other examples, a mean surface roughness of the inner surface of the expanding channel increases along the central axis through the expanding channel (e.g., from the second plurality of inlets extending into the expanding channel—towards the substrate support).

In another embodiment, a method for depositing a material on a substrate is provided which includes positioning a substrate on a substrate support within a process chamber containing a chamber body and a chamber lid assembly, wherein the chamber lid assembly contains a gas dispersing channel at a central portion of the chamber lid assembly, wherein a converging portion of the gas dispersing channel tapers towards a central axis of the gas dispersing channel and a diverging portion of the gas dispersing channel tapers away from the central axis, a tapered bottom surface extending from the diverging portion of the gas dispersing channel to a peripheral portion of the chamber lid assembly, wherein the tapered bottom surface is shaped and sized to substantially cover the substrate, a first conduit coupled to a first gas inlet within the converging portion of the gas dispersing channel, and a second conduit coupled to a second gas inlet within the converging portion of the gas dispersing channel, wherein the first conduit and the second conduit are positioned to provide a circular gas flow pattern, flowing at least one carrier gas through the first and second conduits to form a circular flowing gas, exposing the substrate to the circular flowing gas, pulsing at least one precursor into the circular flowing gas, and depositing a material containing at least one element derived from the at least one precursor onto the substrate.

In another embodiment, a chamber for processing substrates is provided which includes a chamber lid assembly containing an expanding channel extending along a central axis at a central portion of the chamber lid assembly, a tapered bottom surface extending from the expanding channel to a peripheral portion of the chamber lid assembly, wherein the tapered bottom surface is shaped and sized to substantially cover the substrate receiving surface. The chamber lid assembly further contains a first conduit coupled to a first gas passageway, wherein the first gas passageway circumvents the expanding channel and contains a first plurality of inlets extending into the expanding channel, and a second conduit coupled to a second gas passageway, wherein the second gas passageway circumvents the expanding channel, contains a second plurality of inlets extending into the expanding channel, and the first plurality of inlets and the second plurality of inlets are positioned to provide a circular gas flow pattern through the expanding channel.

In one example, the first gas passageway may be positioned directly above the second gas passageway and the first gas passageway and the second gas passageway are both circumventing an upper portion of the expanding channel. The first plurality of inlets and the second plurality of inlets may be independently positioned to direct gas at an inner surface of the expanding channel. The circular gas flow pattern contains a flow pattern of a vortex, a helix, a spiral, a twirl, a twist, a coil, a whirlpool, derivatives thereof, or combinations thereof. In other examples, a first valve may be coupled to the first conduit and a second valve may be coupled to the second conduit, and a first gas source is in fluid communication to the first valve and a second gas source is in fluid communication to the second valve. The first and second valves enable an atomic layer deposition process with a pulse time of about 2 seconds or less, such as about 1 second or less, or within a range from about 0.05 seconds to about 0.5 seconds.

In another embodiment, a chamber for processing substrates is provided which includes a chamber lid assembly containing an expanding channel extending along a central axis at a central portion of the chamber lid assembly, a first conduit coupled to a first gas passageway, wherein the first gas passageway circumvents the expanding channel and contains a first plurality of inlets extending into the expanding channel, a second conduit coupled to a second gas passageway, wherein the second gas passageway circumvents the expanding channel, contains a second plurality of inlets extending into the expanding channel, and the first plurality of inlets and the second plurality of inlets are positioned to provide a circular gas flow pattern through the expanding channel, and a first valve coupled to the first conduit and a second valve coupled to the second conduit, where the first and second valves enable an atomic layer deposition process with a pulse time of about 2 seconds or less, such as about 1 second or less, or within a range from about 0.05 seconds to about 0.5 seconds.

In another embodiment, a method for depositing a material on a substrate is provided which includes positioning a substrate on a substrate support within a process chamber containing a chamber lid assembly which contains an expanding channel extending along a central axis at a central portion of the chamber lid assembly, a tapered bottom surface extending from the expanding channel to a peripheral portion of the chamber lid assembly, wherein the tapered bottom surface is shaped and sized to substantially cover the substrate receiving surface, a first conduit coupled to a first gas passageway, wherein the first gas passageway circumvents the expanding channel and contains a first plurality of inlets extending into the expanding channel, and a second conduit coupled to a second gas passageway, wherein the second gas passageway circumvents the expanding channel, contains a second plurality of inlets extending into the expanding channel, and the first plurality of inlets and the second plurality of inlets are positioned to provide a circular gas flow pattern through the expanding channel, forming a circular flowing gas by flowing at least one carrier gas through the first plurality of inlets or the second plurality of inlets, exposing the substrate to the circular flowing gas, pulsing at least one precursor into the circular flowing gas, and depositing a material containing at least one element derived from the at least one precursor onto the substrate.

In another embodiment, a chamber for processing substrates is provided which includes a chamber lid assembly containing an expanding channel at a central portion of the chamber lid assembly, wherein an upper portion of the expanding channel extends substantially parallel along a central axis of the expanding channel and an expanding portion of the expanding channel tapers away from the central axis, an inner surface within the upper portion of the expanding channel has a lower mean surface roughness than an inner surface within the expanding portion of the expanding channel, a tapered bottom surface extending from the expanding portion of the expanding channel to a peripheral portion of the chamber lid assembly, wherein the tapered bottom surface is shaped and sized to substantially cover the substrate receiving surface, a first conduit coupled to a first gas inlet within the upper portion of the expanding channel, and a second conduit coupled to a second gas inlet within the upper portion of the expanding channel, wherein the first conduit and the second conduit are positioned to provide a circular gas flow pattern through the expanding channel.

In other embodiments, the chamber for processing substrates is provided which includes a chamber lid assembly containing an expanding channel at a central portion of the chamber lid assembly, wherein an upper portion of the expanding channel extends substantially parallel along a central axis of the expanding channel and an expanding portion of the expanding channel tapers away from the central axis, a first conduit coupled to a first gas inlet within the upper portion of the expanding channel, a second conduit coupled to a second gas inlet within the upper portion of the expanding channel, wherein the first conduit and the second conduit are positioned to provide a circular gas flow pattern, and a first valve coupled to the first conduit and a second valve coupled to the second conduit, where the first and second valves enable an atomic layer deposition process with a pulse time of about 2 seconds or less. The chamber lid assembly further contains a tapered bottom surface extending from the expanding portion of the expanding channel to a peripheral portion of the chamber lid assembly.

In another embodiment, a method for depositing a material on a substrate is provided which includes positioning a substrate on a substrate support within a process chamber containing a chamber body and a chamber lid assembly, wherein the chamber lid assembly contains an expanding channel at a central portion of the chamber lid assembly, wherein an upper portion of the expanding channel extends substantially parallel along a central axis of the expanding channel and an expanding portion of the expanding channel tapers away from the central axis, a tapered bottom surface extending from the expanding portion of the expanding channel to a peripheral portion of the chamber lid assembly, wherein the tapered bottom surface is shaped and sized to substantially cover the substrate, a first conduit coupled to a first gas inlet within the upper portion of the expanding channel, and a second conduit coupled to a second gas inlet within the upper portion of the expanding channel, wherein the first conduit and the second conduit are positioned to provide a circular gas flow pattern, flowing at least one carrier gas through the first and second conduits to form a circular flowing gas, exposing the substrate to the circular flowing gas, pulsing at least one precursor into the circular flowing gas, and depositing a material containing at least one element derived from the at least one precursor onto the substrate. The circular gas flow pattern contains a flow pattern of a vortex, a helix, a spiral, a twirl, a twist, a coil, a whirlpool, derivatives thereof, or combinations thereof.

In some examples, the first conduit and the second conduit may be independently positioned to direct gas at an inner surface of the converging portion of the gas dispersing channel. Therefore, the first conduit and the second conduit may be independently positioned at an angle (e.g., >0°) from the central axis of the gas dispersing channel. Alternatively, the first plurality of inlets and the second plurality of inlets may be independently positioned to direct gas at an inner surface of the expanding channel. Therefore, the first plurality of inlets and the second plurality of inlets may be independently positioned at an angle (e.g., >0°) from the central axis of the expanding channel. The circular gas flow pattern may contain a flow pattern, such as a vortex pattern, a helix pattern, a spiral pattern, a twirl pattern, a twist pattern, a coil pattern, a whirlpool pattern, or derivatives thereof. The circular gas flow pattern may extend at least about 1.5 revolutions around the central axis of the gas dispersing channel or the expanding channel, preferably, about 2 revolutions, more preferably, about 3 revolutions, and more preferably, about 4 revolutions. In other examples, the chamber may contain a reaction zone defined between the tapered bottom surface and the substrate receiving surface. The reaction zone may have a volume of about 3,000 cm$^3$ or less. In one example, the volume may be about 1,500 cm$^3$ or less. In another example, the volume may be about 600 cm$^3$ or less. The volume may be adjusted by laterally positioning the substrate support.

In another embodiment, a method for depositing a material on a substrate is provided which includes positioning a substrate on a substrate support within a process chamber containing a chamber body and a chamber lid assembly, wherein the chamber lid assembly contains a gas dispersing channel at a central portion of the chamber lid assembly. The gas dispersing channel may contain a converging portion of the gas dispersing channel that tapers towards a central axis of the gas dispersing channel and a diverging portion of the gas dispersing channel that tapers away from the central axis. The chamber lid assembly may further contain a tapered bottom surface extending from the diverging portion of the gas dispersing channel to a peripheral portion of the chamber lid assembly. The tapered bottom surface may be shaped and sized to substantially cover the substrate. Also, the chamber lid assembly may further contain a first conduit coupled to a first gas inlet within the converging portion of the gas dispersing channel and a second conduit coupled to a second gas inlet within the converging portion of the gas dispersing channel. The first conduit and the second conduit may be positioned to provide a circular gas flow pattern.

The method further provides flowing at least one carrier gas through the first and second conduits to form a circular flowing gas, exposing the substrate to the circular flowing gas, pulsing at least one precursor into the circular flowing gas, and depositing a material containing at least one element derived from the at least one precursor onto the substrate. In one example, at least two chemical precursors are sequentially pulsed into the circular flowing gas during an atomic layer deposition process. In another example, at least three chemical precursors are sequentially pulsed into the circular flowing gas during the atomic layer deposition process.

In another embodiment, a method for depositing a material on a substrate is provided which includes positioning a substrate on a substrate support within a process chamber containing a chamber body and a chamber lid assembly, wherein the chamber lid assembly contains an expanding channel extending along a central axis at a central portion of the chamber lid assembly. The chamber lid assembly may further contain a tapered bottom surface extending from the expanding channel to a peripheral portion of the chamber lid assembly, wherein the tapered bottom surface is shaped and sized to substantially cover the substrate receiving surface. Also, the chamber lid assembly may further contain a first conduit coupled to a first gas passageway, wherein the first gas passageway circumvents the expanding channel and contains a first plurality of inlets extending into the expanding channel, and a second conduit coupled to a second gas passageway, wherein the second gas passageway circumvents the expanding channel, contains a second plurality of inlets extending into the expanding channel, and the first plurality of inlets and the second plurality of inlets are positioned to provide a circular gas flow pattern through the expanding channel.

The method further provides forming a circular flowing gas by flowing at least one carrier gas through the first plurality of inlets or the second plurality of inlets, exposing the substrate to the circular flowing gas, pulsing at least one precursor into the circular flowing gas, and depositing a material containing at least one element derived from the at least one precursor onto the substrate. In one example, at least two chemical precursors are sequentially pulsed into the circular flowing gas during an atomic layer deposition process. In another example, at least three chemical precursors are sequentially pulsed into the circular flowing gas during the atomic layer deposition process.

In another embodiment, a method for depositing a material layer over a substrate structure is provided which includes delivering a first reactant gas and a first purge gas through a first gas conduit in which the first reactant gas is provided in pulses and the first purge gas is provided in a continuous flow. The method further contains delivering a second reactant gas and a second purge through a second gas conduit in which the second reactant gas is provided in pulses and the second purge gas is provided in a continuous flow.

In another embodiment, a method for depositing a material layer over a substrate structure is provided which includes delivering gases to a substrate in a substrate processing chamber contains providing one or more gases into the substrate processing chamber, reducing a velocity of the gases through non-adiabatic expansion, providing the gases to a central portion of the substrate, and directing the gases radially across the substrate from the central portion of the substrate to a peripheral portion of the substrate.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 11A-11C depict a schematic cross-sectional view of a process chamber including a lid assembly and a gas delivery apparatus adapted for atomic layer deposition as described in another embodiment herein;

FIGS. 15A-15C depict a schematic cross-sectional view of a process chamber including a lid assembly and a gas delivery apparatus adapted for atomic layer deposition as described in another embodiment herein;

FIGS. 16A-16E depict schematic views of a process chamber lid assembly adapted for atomic layer deposition as described in another embodiment herein;

DETAILED DESCRIPTION

Embodiments of the invention provide apparatuses and methods that may be used to deposit materials during an atomic layer deposition (ALD) process. Embodiments include ALD process chambers and gas delivery systems which contain an expanding channel lid assembly, a converge-diverge lid assembly, a multiple injection lid assembly, or an extended cap lid assembly. Other embodiments provide methods for depositing materials using these gas delivery systems during ALD processes.

Expanding Channel Lid Assembly

Figure 1:
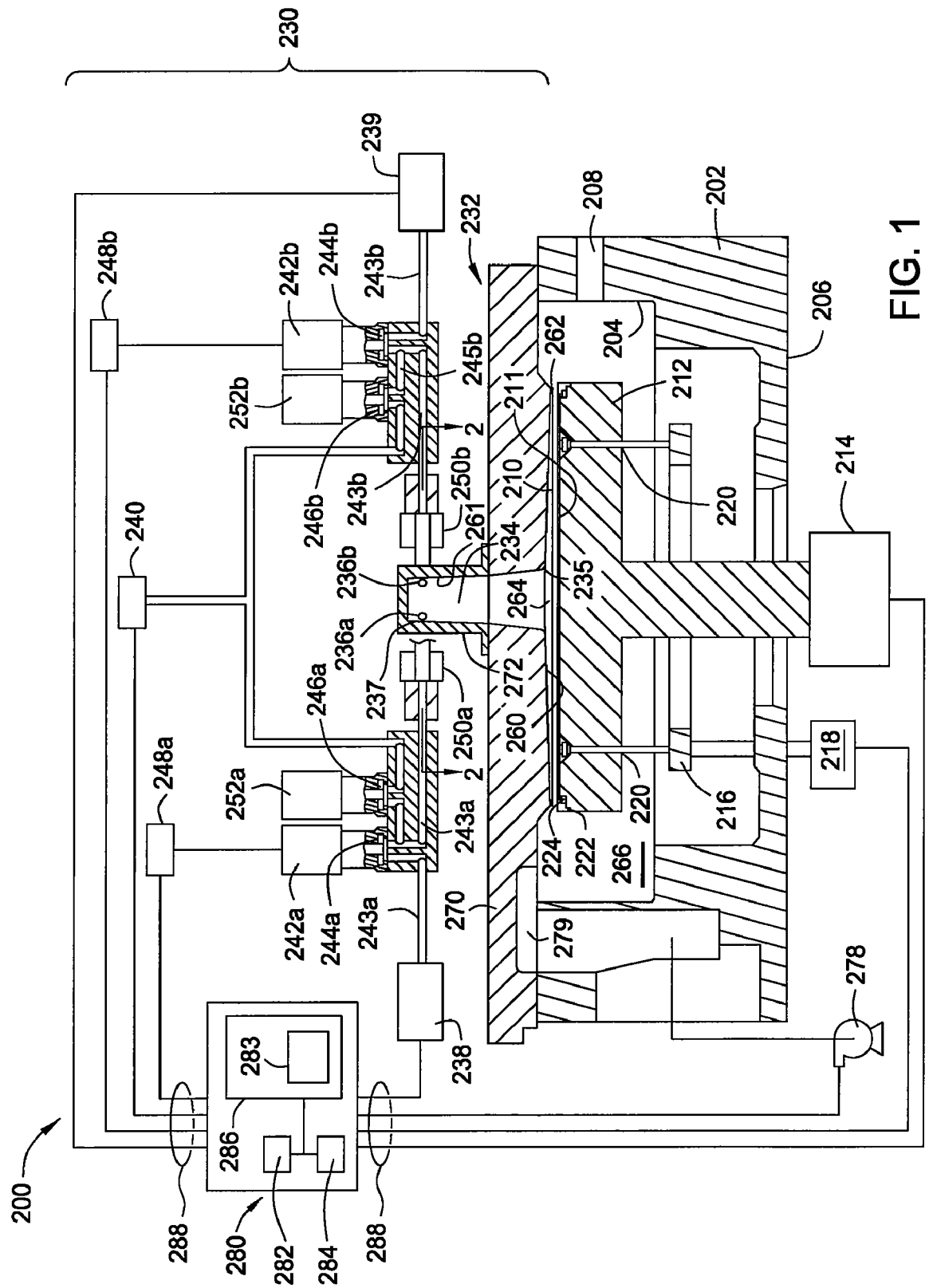
FIG. 1 depicts a schematic cross-sectional view of a process chamber including a gas delivery apparatus adapted for atomic layer deposition as described in an embodiment herein.

FIG. 1 is a schematic cross-sectional view of one embodiment of process chamber 200 including gas delivery system 230 adapted for ALD or sequential layer deposition. Process chamber 200 contains a chamber body 202 having sidewalls 204 and bottom 206. Slit valve 208 in process chamber 200 provides access for a robot (not shown) to deliver and retrieve substrate 210, such as a 200 mm or 300 mm semiconductor wafer or a glass substrate, to and from process chamber 200.

A substrate support 212 supports substrate 210 on a substrate receiving surface 211 in process chamber 200. Substrate support 212 is mounted to a lift motor 214 to raise and lower substrate support 212 and a substrate 210 disposed thereon. Lift plate 216 connected to lift motor 218 is mounted in process chamber 200 and raises and lowers lift pins 220 movably disposed through substrate support 212. Lift pins 220 raise and lower substrate 210 over the surface of substrate support 212. Substrate support 212 may include a vacuum chuck (not shown), an electrostatic chuck (not shown), or a clamp ring (not shown) for securing substrate 210 to substrate support 212 during processing.

Substrate support 212 may be heated to heat a substrate 210 disposed thereon. For example, substrate support 212 may be heated using an embedded heating element, such as a resistive heater (not shown), or may be heated using radiant heat, such as heating lamps (not shown) disposed above substrate support 212. A purge ring 222 may be disposed on substrate support 212 to define a purge channel 224 which provides a purge gas to a peripheral portion of substrate 210 to prevent deposition thereon.

Gas delivery system 230 is disposed at an upper portion of chamber body 202 to provide a gas, such as a process gas and/or a purge gas, to process chamber 200. Vacuum system 278 is in communication with a pumping channel 279 to evacuate any desired gases from process chamber 200 and to help maintain a desired pressure or a desired pressure range inside pumping zone 266 of process chamber 200.

In one embodiment, the gas delivery system 230 contains a chamber lid assembly 232. Chamber lid assembly 232 includes an expanding channel 234 extending from a central portion of chamber lid assembly 232 and a lower surface 260 extending from expanding channel 234 to a peripheral portion of chamber lid assembly 232. Lower surface 260 is sized and shaped to substantially cover substrate 210 disposed on substrate support 212. Expanding channel 234 has gas inlets 236a, 236b to provide gas flows from two similar pairs of valves 242a/252a, 242b/252b, which may be provided together and/or separately.

In one configuration, valve 242a and valve 242b are coupled to separate reactant gas sources but are preferably coupled to the same purge gas source. For example, valve 242a is coupled to reactant gas source 238 and valve 242b is coupled to reactant gas source 239, and both valves 242a, 242b are coupled to purge gas source 240. Each valve 242a, 242b includes a delivery line 243a, 243b having a valve seat assembly 244a, 244b and each valves 252a, 252b includes a purge line 245a, 245b having a valve seat assembly 246a, 246b. Delivery line 243a, 243b is in fluid communication with reactant gas source 238, 239 and is in fluid communication with gas inlet 236a, 236b of expanding channel 234. Valve seat assembly 244a, 244b of delivery line 243a, 243b controls the flow of the reactant gas from reactant gas source 238, 239 to expanding channel 234. Purge line 245a, 245b is in fluid communication with purge gas source 240 and intersects delivery line 243a, 243b downstream of valve seat assembly 244a, 244b of delivery line 243a, 243b. Valve seat assembly 246a, 246b of purge line 245a, 245b controls the flow of the purge gas from purge gas source 240 to expanding channel 234. If a carrier gas is used to deliver reactant gases from reactant gas source 238, 239, preferably the same gas is used as a carrier gas and a purge gas (i.e., an argon gas used as a carrier gas and a purge gas).

Each valve seat assembly 244a, 244b, 246a, 246b may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 248a, 248b may be coupled to valves 242a, 242b to control actuation of the diaphragms of the valve seat assemblies 244a, 244b, 246a, 246b of valves 242a, 242b. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 242a, 242b may be a zero dead volume valve to enable flushing of a reactant gas from delivery line 243a, 243b when valve seat assembly 244a, 244b is closed. For example, purge line 245a, 245b may be positioned adjacent valve seat assembly 244a, 244b of delivery line 243a, 243b. When valve seat assembly 244a, 244b is closed, purge line 245a, 245b may provide a purge gas to flush delivery line 243a, 243b. In the embodiment shown, purge line 245a, 245b is positioned slightly spaced from the valve seat assembly 244a, 244b of delivery line 243a, 243b so that a purge gas is not directly delivered into valve seat assembly 244a, 244b when open. A zero dead volume valve as used herein is defined as a valve which has negligible dead volume (i.e., not necessary zero dead volume).

Each valve pair 242a/252a, 242b/252b may be adapted to provide a combined gas flow and/or separate gas flows of the reactant gas and the purge gas. In reference to valve pair 242a/252a, one example of a combined gas flow of the reactant gas and the purge gas includes a continuous flow of a purge gas from purge gas source 240 through purge line 245a and pulses of a reactant gas from reactant gas source 238 through delivery line 243a. The continuous flow of the purge gas may be provided by leaving the diaphragm of valve seat assembly 246a of the purge line 245a open. The pulses of the reactant gas from reactant gas source 238 may be provided by opening and closing the diaphragm of valve seat assembly 244a of delivery line 243a. In reference to valve pair 242a/252a, one example of separate gas flows of the reactant gas and the purge gas includes pulses of a purge gas from purge gas source 240 through purge line 245a and pulses of a reactant gas from reactant gas source 238 through delivery line 243a. The pulses of the purge gas may be provided by opening and closing the diaphragm of valve seat assembly 246a of purge line 245a. The pulses of the reactant gas from reactant gas source 238 may be provided by opening and closing the diaphragm of valve seat assembly 244a of delivery line 243a.

Delivery lines 243a, 243b of valves 242a, 242b may be coupled to gas inlets 236a, 236b through gas conduits 250a, 250b. Gas conduits 250a, 250b may be integrated or may be separate from valves 242a, 242b. In one aspect, valves 242a, 242b are coupled in close proximity to expanding channel 234 to reduce any unnecessary volume of delivery line 243a, 243b and gas conduits 250a, 250b between valves 242a, 242b and gas inlets 236a, 236b.

Figure 3:
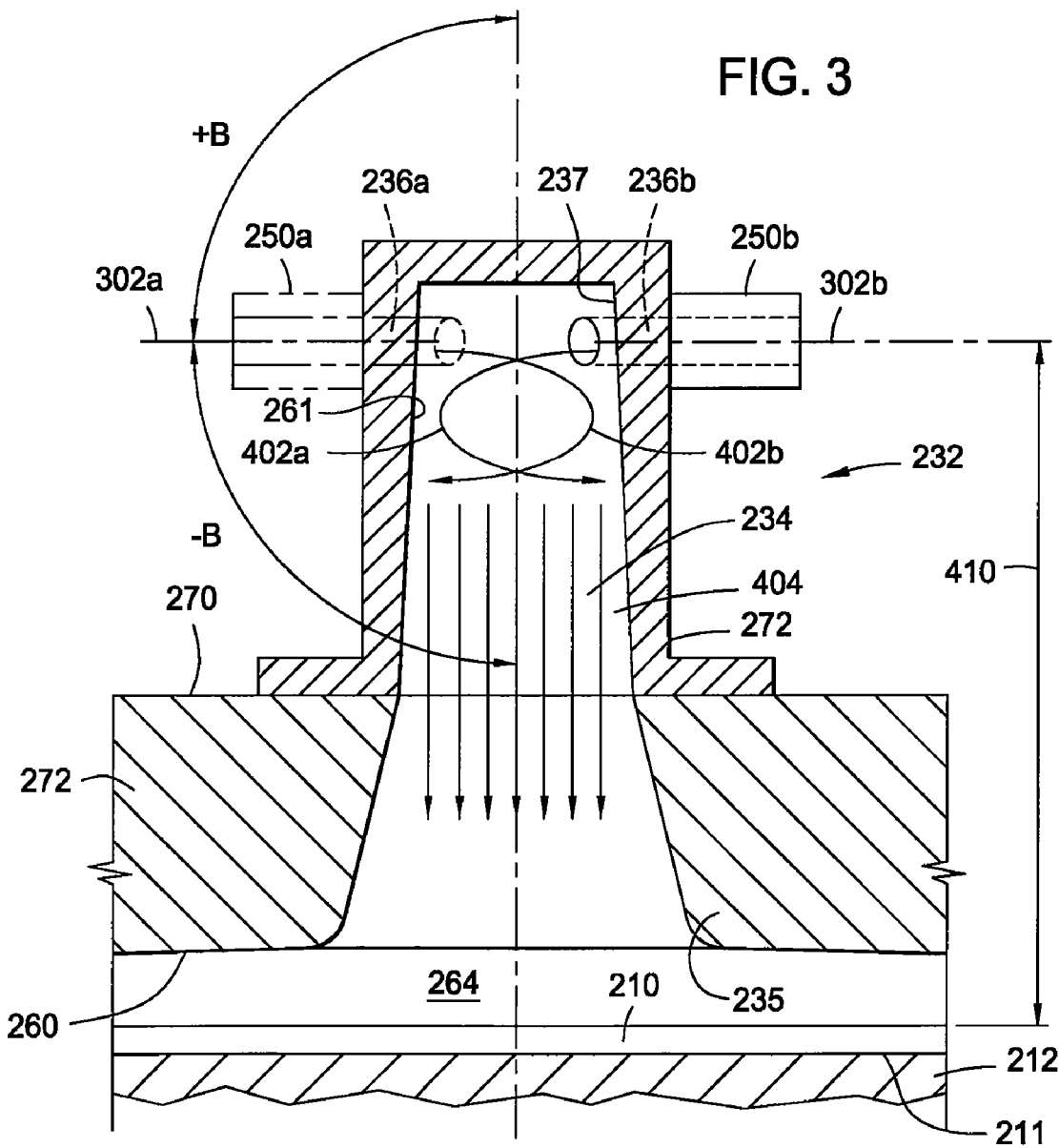
FIG. 3 depicts a cross-sectional view of the expanding channel of the chamber lid of FIG. 1.

In reference to FIG. 3, each gas conduit 250a or 250b and gas inlet 236a or 236b may be positioned in any relationship to longitudinal axis 290 of expanding channel 234. Each gas conduits 250a or 250b and gas inlet 236a, 236b are preferably positioned normal (in which $+\beta$, $-\beta=90°$) to the longitudinal axis 290 or positioned at an angle $+\beta$ or an angle $-\beta$ (in which $0°<+\beta<90°$ or $0°<-\beta<90°$) from the centerline 302a, 302b of gas conduits 250a and 250b to the longitudinal axis 290. Therefore, gas conduits 250a and 250b may be positioned horizontally normal to the longitudinal axis 290 as shown in FIG. 3, may be angled downwardly at an angle $+\beta$, or may be angled upwardly at an angle $-\beta$ to provide a gas flow towards the walls of expanding channel 234 rather than directly downward towards substrate 210 which helps reduce the likelihood of blowing off reactants adsorbed on the surface of substrate 210. In addition, the diameter of gas conduits 250a, 250b may be increasing from delivery lines 243a, 243b of valves 242a, 242b to gas inlet 236a, 236b to help reduce the velocity of the gas flow prior to its entry into expanding channel 234. For example, gas conduits 250a, 250b may contain an inner diameter which is gradually increasing or may contain a plurality of connected conduits having increasing inner diameters.

Referring to FIG. 1, expanding channel 234 contains a channel which has an inner diameter which increases from an upper portion 237 to a lower portion 235 of expanding channel 234 adjacent lower surface 260 of chamber lid assembly 232. In one specific embodiment, the inner diameter of expanding channel 234 for a chamber adapted to process 200 mm diameter substrates is between about 0.2 inches and about 1.0 inch, preferably between about 0.3 inches and about 0.9 inches, and more preferably between about 0.3 inches and about 0.5 inches at upper portion 237 of expanding channel 234 and between about 0.5 inches and about 3.0 inches, preferably between about 0.75 inches and about 2.5 inches, and more preferably between about 1.1 inches and about 2.0 inches at lower portion 235 of expanding channel 234. In another specific embodiment, the inner diameter of expanding channel 234 for a chamber adapted to process 300 mm diameter substrates is between about 0.2 inches and about 1.0 inch, preferably between about 0.3 inches and about 0.9 inches, and more preferably between about 0.3 inches and about 0.5 inches at the upper portion 237 of expanding channel 234 and between about 0.5 inches and about 3.0 inches, preferably between about 0.75 inches and about 2.5 inches, and more preferably between about 1.2 inches and about 2.2 inches at lower portion 235 of expanding channel 234. In general, the above dimension apply to an expanding channel adapted to provide a total gas flow of between about 500 sccm and about 3,000 sccm. In other specific embodiments, the dimension may be altered to accommodate a certain gas flow therethrough. In general, a larger gas flow will require a larger diameter expanding channel. In one embodiment, expanding channel 234 may be shaped as a truncated cone (including shapes resembling a truncated cone). Whether a gas is provided toward the walls of expanding channel 234 or directly downward towards substrate 210, the velocity of the gas flow decreases as the gas flow travels through expanding channel 234 due to the expansion of the gas. The reduction of the velocity of the gas flow helps reduce the likelihood the gas flow will blow off reactants adsorbed on the surface of substrate 210.

Not wishing to be bound by theory, it is believed that the diameter of expanding channel 234, which is gradually increasing from upper portion 237 to lower portion 235 of expanding channel 234, allows less of an adiabatic expansion of a gas through expanding channel 234 which helps to control the temperature of the gas. For instance, a sudden adiabatic expansion of a gas delivered through gas inlet 236a, 236b into expanding channel 234 may result in a drop in the temperature of the gas which may cause condensation of the gas and formation of droplets. On the other hand, a gradually expanding channel 234 according to embodiments of the invention is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 232). The gradually expanding channel 234 may contain one or more tapered inner surfaces, such as a tapered straight surface, a concave surface, a convex surface, or combinations thereof or may contain sections of one or more tapered inner surfaces (i.e., a portion tapered and a portion non-tapered).

In one embodiment, gas inlets 236a, 236b are located adjacent upper portion 237 of expanding channel 234. In other embodiments, one or more gas inlets 236a, 236b may be located along the length of expanding channel 234 between upper portion 237 and lower portion 235.

Figure 2:
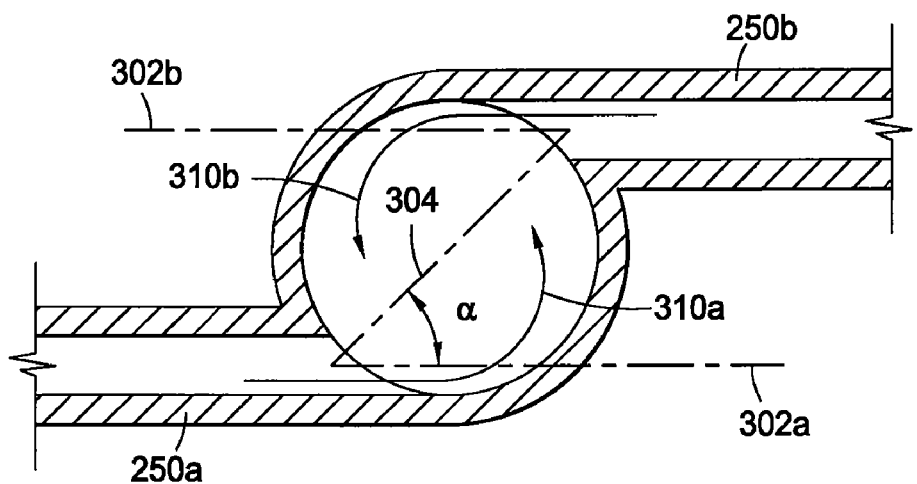
FIG. 2 depicts a top cross-sectional view of the expanding channel of the chamber lid of FIG. 1.

FIG. 2 is a top cross-sectional view of one embodiment of the expanding channel 234 of chamber lid assembly 232 of FIG. 1. Each gas conduits 250a or 250b may be positioned at an angle $\alpha$ from centerline 302a, 302b of gas conduits 250a and 250b and from a radius line 304 from the center of expanding channel 234. Entry of a gas through gas conduits 250a and 250b preferably positioned at an angle $\alpha$ (i.e., when $\alpha>0°$) causes the gas to flow in a circular direction as shown by arrows 310a and 310b. Providing gas at an angle $\alpha$ as opposed to directly straight-on to the walls of the expanding channel (i.e., when $\alpha=0°$) helps to provide a more laminar flow through expanding channel 234 rather than a turbulent flow. It is believed that a laminar flow through expanding channel 234 results in an improved purging of the inner surface of expanding channel 234 and other surfaces of chamber lid assembly 232. In comparison, a turbulent flow may not uniformly flow across the inner surface of expanding channel 234 and other surfaces and may contain dead spots or stagnant spots in which there is no gas flow. In one aspect, gas conduits 250a, 250b and the corresponding gas inlets 236a, 236b are spaced out from each other and direct a flow in the same circular direction (i.e., clockwise or counter-clockwise).

Not wishing to be bound by theory, FIG. 3 is a cross-sectional view of expanding channel 234 of a chamber lid assembly 232 showing simplified representations of two gas flows therethrough. Although the exact flow pattern through expanding channel 234 is not known, it is believed that circular flow 310 (FIG. 2, arrows 310a and 310b) may travel through expanding channel 234 as shown by arrows 402a, 402b (hereinafter "vortex" flow 402) with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof.

As shown in FIG. 3, the circular flow may be provided in a "processing region" as opposed to in a compartment separated from substrate 210. In one aspect, the vortex flow may help to establish a more efficient purge of expanding channel 234 due to the sweeping action of the vortex flow pattern across the inner surface of expanding channel 234.

In one embodiment, distance 410 between gas inlets 236a, 236b and substrate 210 is made long enough that vortex flow 402 dissipates to a downwardly flow as shown by arrows 404 as a spiral flow across the surface of substrate 210 may not be desirable. It is believed that vortex flow 402 and the downwardly flow 404 proceeds in a laminar manner efficiently purging the surface of chamber lid assembly 232 and substrate 210. In one specific embodiment the length of distance 410 between upper portion 237 of expanding channel 234 and substrate 210 is within a range from about 3 inches to about 8 inches, preferably, from about 3.5 inches to about 7 inches, and more preferably, from about 4 inches to about 6 inches, such as about 5 inches.

Referring to FIG. 1, at least a portion of lower surface 260 of chamber lid assembly 232 may be tapered from expanding channel 234 to a peripheral portion of chamber lid assembly 232 to help provide an improved velocity profile of a gas flow from expanding channel 234 across the surface of substrate 210 (i.e., from the center of the substrate to the edge of the substrate). Lower surface 260 may contain one or more tapered surfaces, such as a straight surface, a concave surface, a convex surface, or combinations thereof. In one embodiment, lower surface 260 is tapered in the shape of a funnel.

Figure 4:
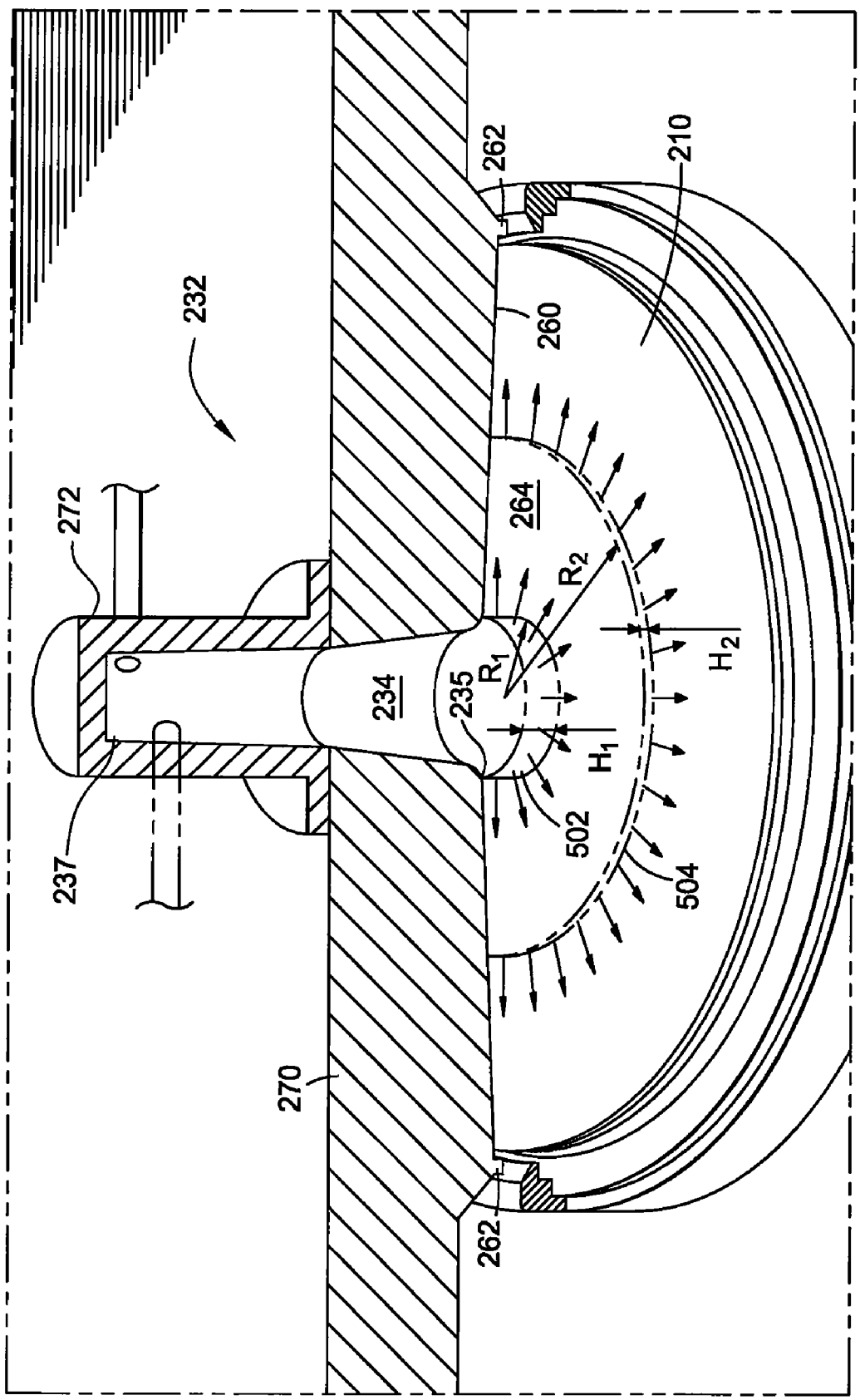
FIG. 4 depicts a schematic cross-sectional view illustrating the flow of a gas at two different positions between the surface of a substrate and the bottom surface of the chamber lid of FIG. 1.

Not wishing to be bound by theory, FIG. 4 is schematic view illustrating the flow of a gas at two different positions 502, 504 between lower surface 260 of chamber lid assembly 232 and the surface of substrate 210. The velocity of the gas at a certain position is theoretically determined by the equation below:

$$Q/A = V \quad (1)$$

In which, "Q" is the flow of the gas, "A" is the area of the flow section, and "V" is the velocity of the gas. The velocity of the gas is inversely proportional to the area "A" of the flow section ($H_x 2\pi R$), in which "H" is the height of the flow section and "$2\pi R$" is the circumference of the flow section having a radius "R". In other words, the velocity of a gas is inversely proportional to the height "H" of the flow section and the radius "R" of the flow section.

Comparing the velocity of the flow section at position 502 and position 504, assuming that the flow "Q" of the gas at all positions between lower surface 260 of chamber lid assembly 232 and the surface of substrate 210 is equal, the velocity of the gas may be theoretically made equal by having the area "A" of the flow sections equal. For the area of flow sections at position 502 and position 504 to be equal, the height $H_1$ at position 502 must be greater than the height $H_2$ at position 504.

In one aspect, lower surface 260 is downwardly sloping to help reduce the variation in the velocity of the gases as it travels between lower surface 260 of chamber lid assembly 232 and substrate 210 to help provide uniform exposure of the surface of substrate 210 to a reactant gas. In one embodiment, the ratio of the maximum area of the flow section over the minimum area of the flow section between a downwardly sloping lower surface 260 of chamber lid assembly 232 and the surface of substrate 210 is less than about 2, preferably less than about 1.5, more preferably less than about 1.3, and most preferably about 1.

Not wishing to be bound by theory, it is believed that a gas flow traveling at a more uniform velocity across the surface of substrate 210 helps provide a more uniform deposition of the gas on substrate 210. It is believed that the velocity of the gas is directly proportional to the concentration of the gas which is in turn directly proportional to the deposition rate of the gas on substrate 210 surface. Thus, a higher velocity of a gas at a first area of the surface of substrate 210 versus a second area of the surface of substrate 210 is believed to provide a higher deposition of the gas on the first area. It is believed that chamber lid assembly 232 having a downwardly sloping lower surface 260 provides for more uniform deposition of the gas across the surface of substrate 210 because the downwardly sloping lower surface 260 provides a more uniform velocity and, thus, a more uniform concentration of the gas across the surface of substrate 210.

Figure 9A:
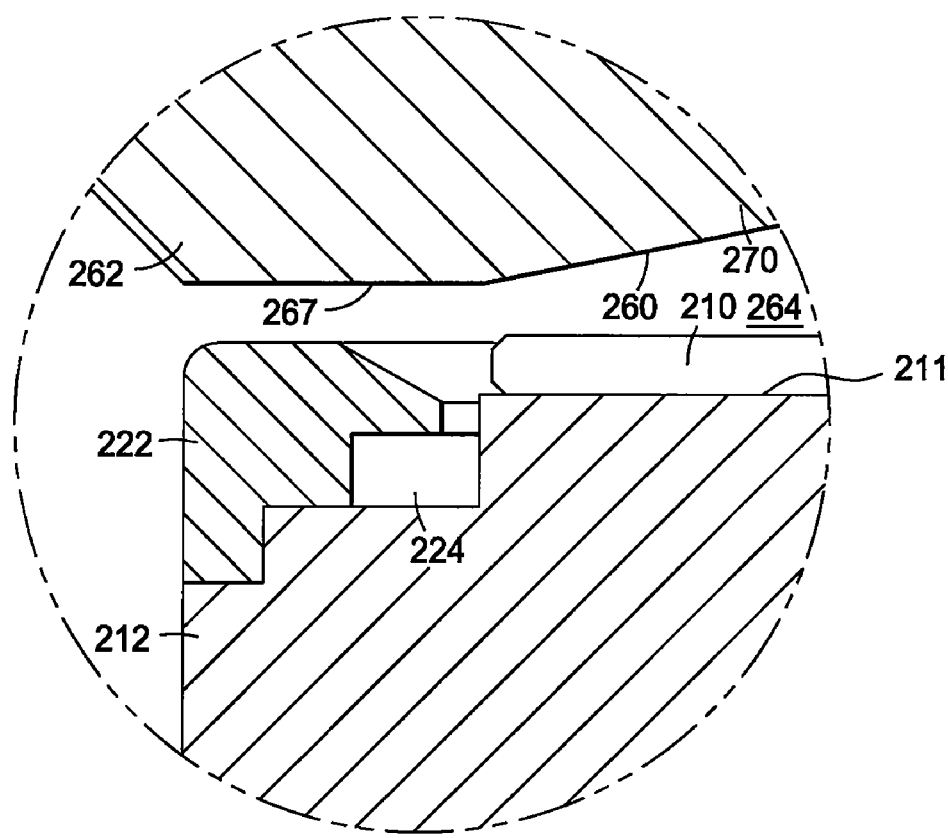
FIGS. 9A-9B depict schematic cross-sectional views of chamber lid chokes as described in other embodiments herein.
Figure 9B:
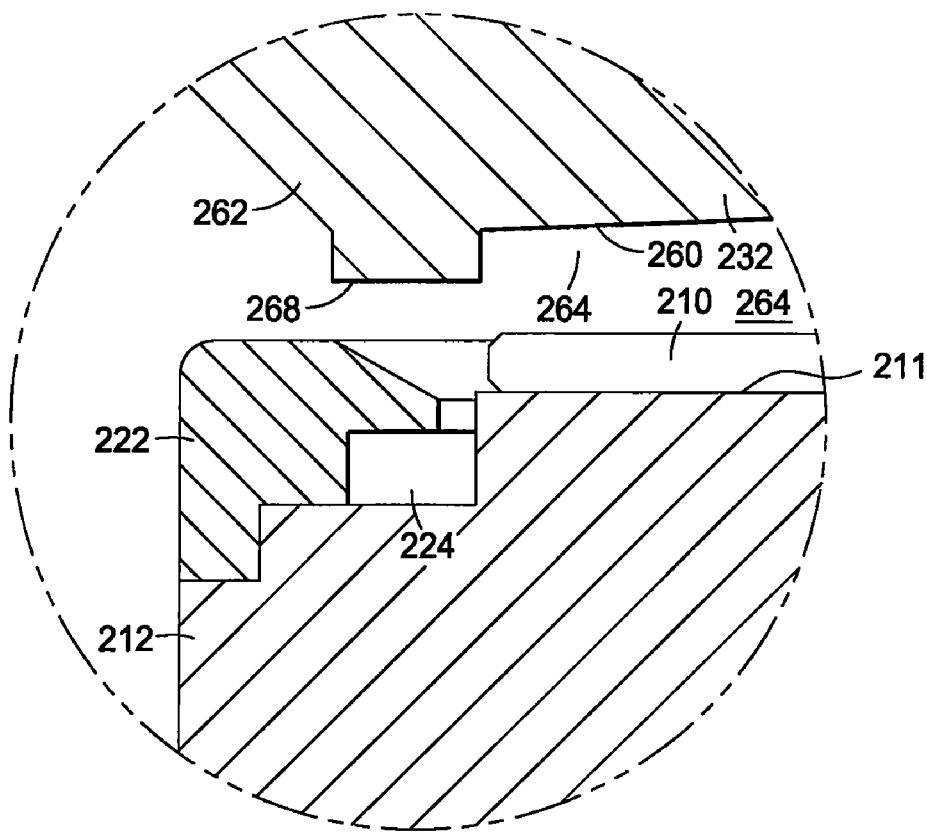

FIG. 1 depicts choke 262 located at a peripheral portion of chamber lid assembly 232 adjacent the periphery of substrate 210. Choke 262, when chamber lid assembly 232 is assembled to form a processing zone around substrate 210, contains any member restricting the flow of gas therethrough at an area adjacent the periphery of substrate 210. FIG. 9A is a schematic cross-sectional view of one embodiment of choke 262. In this embodiment, choke 262 contains a circumferential lateral portion 267. In one aspect, purge ring 222 may be adapted to direct a purge gas toward the lateral portion 267 of choke 262. FIG. 9B is a schematic cross-sectional view of another embodiment of choke 262. In this embodiment, choke 262 contains a circumferential downwardly extending protrusion 268. In one aspect, purge ring 222 may be adapted to direct a purge gas toward the circumferential downwardly extending protrusion 268. In one specific embodiment, the thickness of the downwardly extending protrusion 268 is between about 0.01 inches and about 1.0 inch, more preferably between 0.01 inches and 0.5 inches.

In one specific embodiment, the spacing between choke 262 and substrate support 212 is between about 0.04 inches and about 2.0 inches, and preferably between 0.04 inches and about 0.2 inches. The spacing may vary depending on the gases being delivered and the process conditions during deposition. Choke 262 helps provide a more uniform pressure distribution within the volume or reaction zone 264 defined between chamber lid assembly 232 and substrate 210 by isolating reaction zone 264 from the non-uniform pressure distribution of pumping zone 266 (FIG. 1).

Referring to FIG. 1, in one aspect, since reaction zone 264 is isolated from pumping zone 266, a reactant gas or purge gas needs only adequately fill reaction zone 264 to ensure sufficient exposure of substrate 210 to the reactant gas or purge gas. In conventional chemical vapor deposition, prior art chambers are required to provide a combined flow of reactants simultaneously and uniformly to the entire surface of the substrate in order to ensure that the co-reaction of the reactants occurs uniformly across the surface of substrate 210. In atomic layer deposition, process chamber 200 sequentially introduces reactants to the surface of substrate 210 to provide absorption of alternating thin layers of the reactants onto the surface of substrate 210. As a consequence, atomic layer deposition does not require a flow of a reactant which reaches the surface of substrate 210 simultaneously. Instead, a flow of a reactant needs to be provided in an amount which is sufficient to adsorb a thin layer of the reactant on the surface of substrate 210.

Since reaction zone 264 may contain a smaller volume when compared to the inner volume of a conventional CVD chamber, a smaller amount of gas is required to fill reaction zone 264 for a particular process in an atomic layer deposition sequence. For example, in one embodiment, the volume of reaction zone 264 is about 1,000 cm$^3$ or less, preferably 500 cm$^3$ or less, and more preferably 200 cm$^3$ or less for a chamber adapted to process 200 mm diameter substrates. In one embodiment, the volume of reaction zone 264 is about 3,000 cm$^3$ or less, preferably 1,500 cm$^3$ or less, and more preferably 600 cm$^3$ or less for a chamber adapted to process 300 mm diameter substrates. In one embodiment, substrate support 212 may be raised or lowered to adjust the volume of reaction zone 264 for deposition. Because of the smaller volume of reaction zone 264, less gas, whether a deposition gas or a purge gas, is necessary to be flowed into process chamber 200. Therefore, the throughput of process chamber 200 is greater and the waste may be minimized due to the smaller amount of gas used reducing the cost of operation.

Chamber lid assembly 232 has been shown in FIGS. 1-4 as containing lid cap 272 and lid plate 270 in which lid cap 272 and lid plate 270 form expanding channel 234. An additional plate may be optionally disposed between lid plate 270 and lid cap 272 (not shown). The additional plate may be used to adjust (e.g., increase) the distance between lid cap 272 and lid plate 270 therefore respectively changing the length of expanding channel 234 formed therethrough. In other embodiments, expanding channel 234 may be made integrally from a single piece of material.

Chamber lid assembly 232 may include cooling elements and/or heating elements depending on the particular gas being delivered therethrough. Controlling the temperature of chamber lid assembly 232 may be used to prevent gas decomposition, deposition, or condensation on chamber lid assembly 232. For example, water channels (not shown) may be formed in chamber lid assembly 232 to cool chamber lid assembly 232. In another example, heating elements (not shown) may be embedded or may surround components of chamber lid assembly 232 to heat chamber lid assembly 232. In one embodiment, components of chamber lid assembly 232 may be individually heated or cooled. For example, referring to FIG. 1, chamber lid assembly 232 may contain lid plate 270 and lid cap 272 in which lid plate 270 and lid cap 272 form expanding channel 234. Lid cap 272 may be maintained at one temperature range and lid plate 270 may be maintained at another temperature range. For example, lid cap 272 may be heated by being wrapped in heater tape or by using another heating device to prevent condensation of reactant gases and lid plate 270 may be maintained at ambient temperature. In another example, lid cap 272 may be heated and lid plate 270 may be cooled with water channels formed therethrough to prevent thermal decomposition of reactant gases on lid plate 270.

Chamber lid assembly 232 contains components that may be made of stainless steel, aluminum, nickel-plated aluminum, nickel, or other suitable materials compatible with the processing to be performed. In one embodiment, lid cap 272 contains aluminum or stainless steel and lid plate 270 contains aluminum. In another embodiment, the optional additional plate disposed between lid plate 270 and lid cap 272 contains stainless steel.

In one embodiment, inner surface 261 of expanding channel 234 (including both inner surfaces of lid plate 270 and lid cap 272) and lower surface 260 of chamber lid assembly 232 may contain a mirror polished surface to help produce a laminar flow of a gas along expanding channel 234 and lower surface 260 of chamber lid assembly 232. In another embodiment, the inner surface of gas conduits 250a, 250b may be electropolished to help produce a laminar flow of a gas therethrough.

In an alternative embodiment, inner surface 261 of expanding channel 234 (including both inner surfaces of lid plate 270 and lid cap 272) and lower surface 260 of chamber lid assembly 232 may contain a roughened surface or machined surfaces to produce more surface area across the surfaces. Roughened surfaces provide better adhesion of undesired accumulated materials on inner surface 261 and lower surface 260. The undesired films are usually formed as a consequence of conducting a vapor deposition process and may peel or flake from inner surface 261 and lower surface 260 to contaminate substrate 210. In one example, the mean roughness ($R_a$) of lower surface 260 and/or inner surface 261 may be at least about 10 microinches (μin), such as within a range from about 10 μin (about 0.254 μm) to about 200 μin (about 5.08 μm), preferably, from about 20 μin (about 0.508 μm) to about 100 μin (about 2.54 μm), and more preferably, from about 30 μin (about 0.762 μm) to about 80 μin (about 2.032 μm). In another example, the mean roughness of lower surface 260 and/or inner surface 261 may be at least about 100 μin (about 2.54 μm), preferably, within a range from about 200 μin (about 5.08 μm) to about 500 μin (about 12.7 μm).

Returning to FIG. 1, control unit 280, such as a programmed personal computer, work station computer, or the like, may be coupled to process chamber 200 to control processing conditions. For example, control unit 280 may be configured to control flow of various process gases and purge gases from gas sources 238, 239, and 240 through valves 242a, 242b during different stages of a substrate process sequence. Illustratively, the control unit 280 contains central processing unit (CPU) 282, support circuitry 284, and memory 1186 containing associated control software 283.

The control unit 280 may be one of any form of general purpose computer processor that can be used in an industrial setting for controlling various chambers and sub-processors. The CPU 282 may use any suitable memory 1186, such as random access memory, read only memory, floppy disk drive, hard disk, or any other form of digital storage, local or remote. Various support circuits may be coupled to the CPU 282 for supporting process chamber 200. The control unit 280 may be coupled to another controller that is located adjacent individual chamber components, such as programmable logic controllers 248a, 248b of valves 242a, 242b. Bi-directional communications between the control unit 280 and various other components of process chamber 200 are handled through numerous signal cables collectively referred to as signal buses 288, some of which are illustrated in FIG. 1. In addition to control of process gases and purge gases from gas sources 238, 239, 240 and from programmable logic controllers 248a, 248b of valves 242a, 242b, control unit 280 may be configured to be responsible for automated control of other activities used in wafer processing—such as wafer transport, temperature control, chamber evacuation, among other activities, some of which are described elsewhere herein.

Referring to FIGS. 1-4, in operation, a substrate 210 is delivered to process chamber 200 through the slit valve 208 by a robot (not shown). Substrate 210 is positioned on substrate support 212 through cooperation of the lift pins 220 and the robot. Substrate support 212 raises substrate 210 into close opposition to lower surface 260 of chamber lid assembly 232. A first gas flow may be injected into expanding channel 234 of process chamber 200 by valve 242a together or separately (i.e., pulses) with a second gas flow injected into process chamber 200 by valve 242b. The first gas flow may contain a continuous flow of a purge gas from purge gas source 240 and pulses of a reactant gas from reactant gas source 238 or may contain pulses of a reactant gas from reactant gas source 238 and pulses of a purge gas from purge gas source 240. The second gas flow may contain a continuous flow of a purge gas from purge gas source 240 and pulses of a reactant gas from reactant gas source 239 or may contain pulses of a reactant gas from reactant gas source 239 and pulses of a purge gas from purge gas source 240. The gas flow travels through expanding channel 234 as a pattern of vortex flow 402 which provides a sweeping action across the inner surface of expanding channel 234. The pattern of vortex flow 402 dissipates to a downwardly flow 404 toward the surface of substrate 210. The velocity of the gas flow reduces as it travels through expanding channel 234. The gas flow then travels across the surface of substrate 210 and across lower surface 260 of chamber lid assembly 232. Lower surface 260 of chamber lid assembly 232, which is downwardly sloping, helps reduce the variation of the velocity of the gas flow across the surface of substrate 210. The gas flow then travels by choke 262 and into pumping zone 266 of process chamber 200. Excess gas, by-products, etc. flow into the pumping channel 279 and are then exhausted from process chamber 200 by vacuum system 278. In one aspect, the gas flow proceeds through expanding channel 234 and between the surface of substrate 210 and lower surface 260 of chamber lid assembly 232 in a laminar manner which aids in uniform exposure of a reactant gas to the surface of substrate 210 and efficient purging of inner surfaces of chamber lid assembly 232.

Process chamber 200 as illustrated in FIGS. 1-4 has been described herein as having a combination of features. In one aspect, process chamber 200 provides reaction zone 264 containing a small volume in compared to a conventional CVD chamber. Process chamber 200 requires a smaller amount of a gas, such as a reactant gas or a purge gas, to fill reaction zone 264 for a particular process. In another aspect, process chamber 200 provides chamber lid assembly 232 having a downwardly sloping or funnel shaped lower surface 260 to reduce the variation in the velocity profile of a gas flow traveling between the bottom surface of chamber lid assembly 232 and substrate 210. In still another aspect, process chamber 200 provides an expanding channel 234 to reduce the velocity of a gas flow introduced therethrough. In still another aspect, process chamber 200 provides gas conduits at an angle α from the center of expanding channel 234. Process chamber 200 provides other features as described elsewhere herein. Other embodiments of a chamber adapted for atomic layer deposition incorporate one or more of these features.

Figure 7:
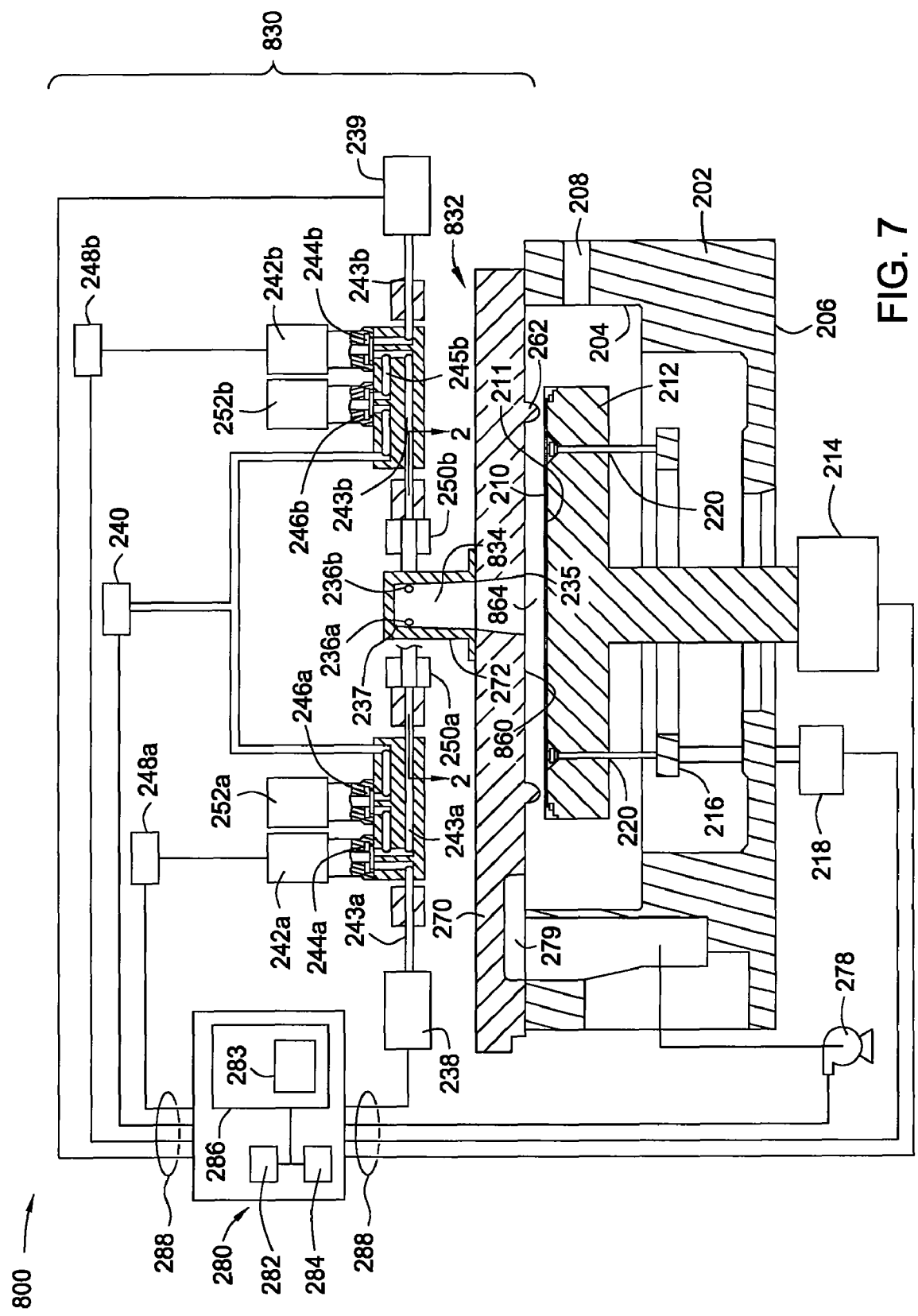
FIG. 7 depicts a schematic cross-sectional view of a process chamber including a gas delivery apparatus adapted for atomic layer deposition as described in another embodiment herein.

For example, FIG. 7 shows another embodiment of process chamber 800 including gas delivery apparatus 830 containing chamber lid assembly 832 which provides reaction zone 864 containing a small volume and which provides expanding channel 834. Some components of process chamber 800 are the same or similar to those described with reference to process chamber 200 of FIG. 1, described above. Accordingly, like numbers have been used where appropriate. The chamber lid assembly 832 contains a lower surface 860 that is substantially flat. In one embodiment, the spacing between choke 262 and substrate support 212 is between about 0.04 inches and about 2.0 inches, more preferably between about 0.04 inches and about 0.2 inches.

Figure 8:
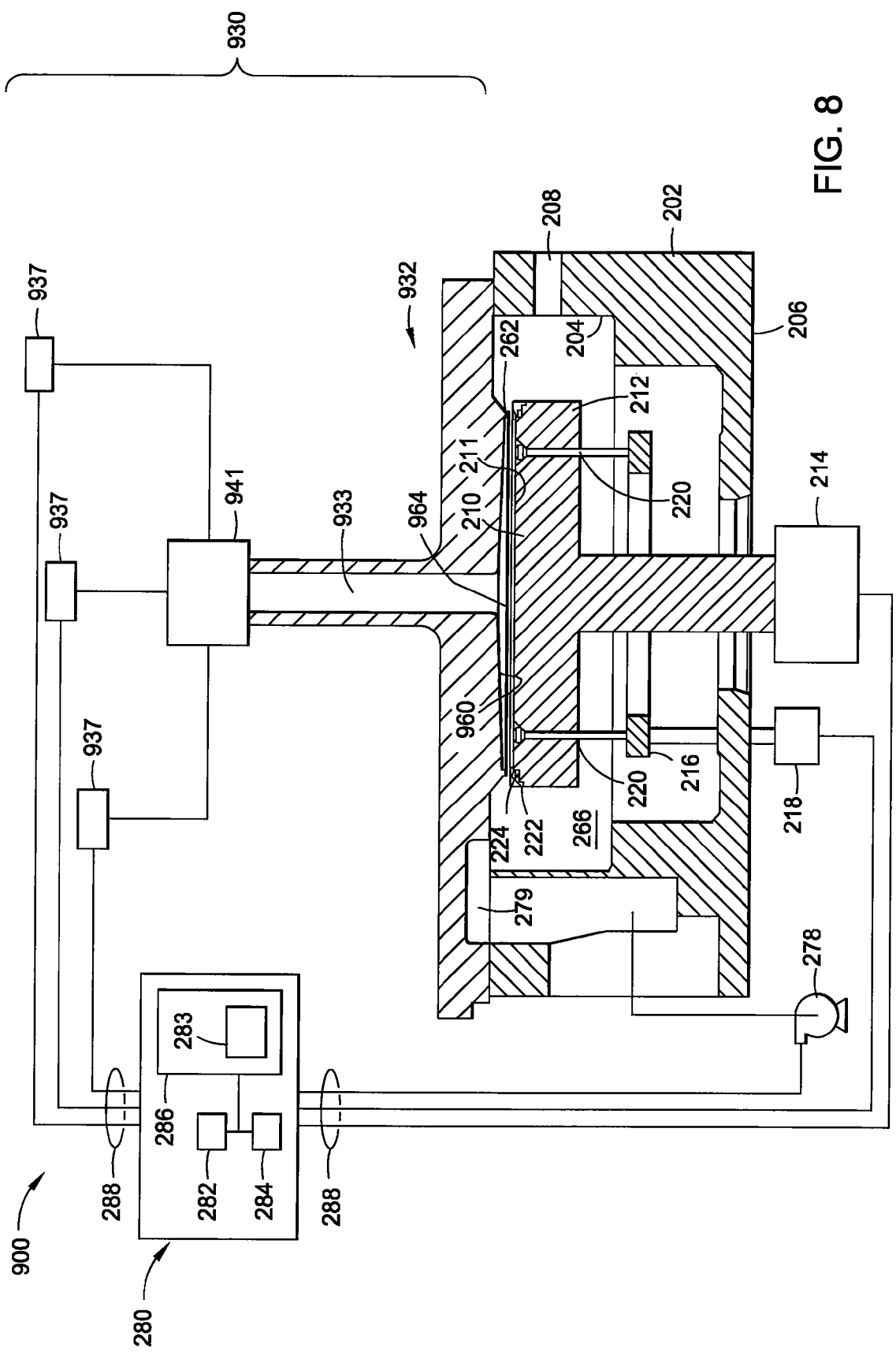
FIG. 8 depicts a schematic cross-sectional view of a process chamber including a gas delivery apparatus adapted for atomic layer deposition as described in another embodiment herein.

In another example, FIG. 8 shows another embodiment of process chamber 900 including gas delivery apparatus 930 containing chamber lid assembly 932 which provides a reaction zone 964 containing a small volume and which provides a downwardly sloping or funnel shaped lower surface 960. Some components of process chamber 900 are the same or similar to those described with reference to process chamber 200 of FIG. 1, described above. Accordingly, like numbers have been used where appropriate. Gas sources 937 are coupled to passageway 933 through one or more valves 941. In one aspect, passageway 933 contains a long length to reduce the likelihood that a gas introduced through valves 941 will blow off reactants adsorbed on the surface of substrate 210.

The gas delivery apparatuses 230, 830, 930 of FIGS. 1-8 have been described above as containing chamber lids 232, 832, 932 which act as the lid of chamber body 202. In another embodiment, chamber lids 232, 832, 932 may contain any covering member disposed over substrate support 212 delineating reaction zone 264, 864, 964 which lowers the volume in which a gas must flow during substrate processing. In other embodiments, instead of or in conjunction with substrate support 212, chamber lid assembly 232, 832, 932 may be adapted to move up and down to adjust the volume of reaction zone 264, 864, 964.

Figure 5:
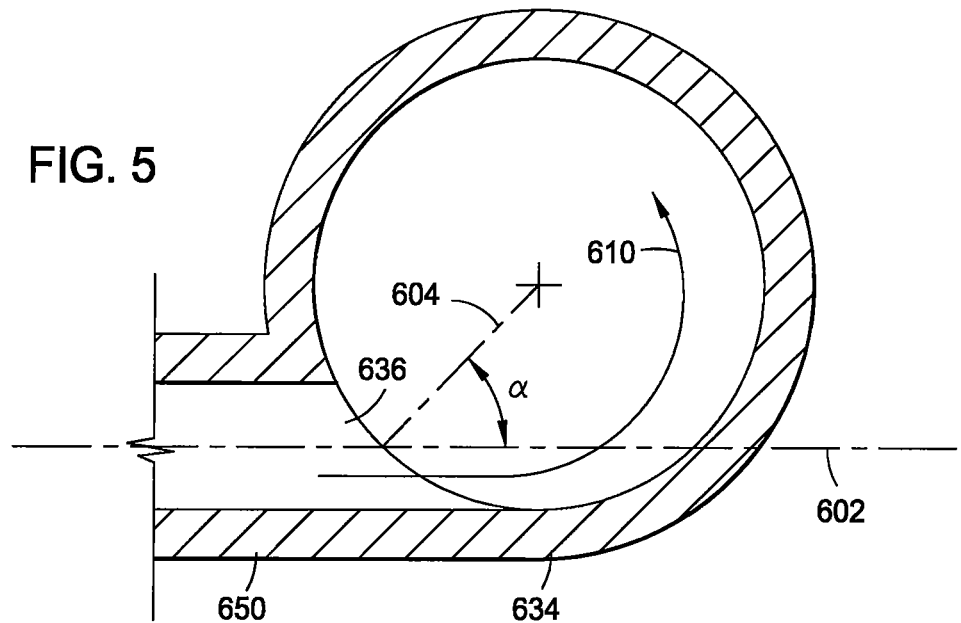
FIG. 5 depicts a top cross-sectional view of an expanding channel which is adapted to receive a single gas flow as described in an embodiment herein.
Figure 6:
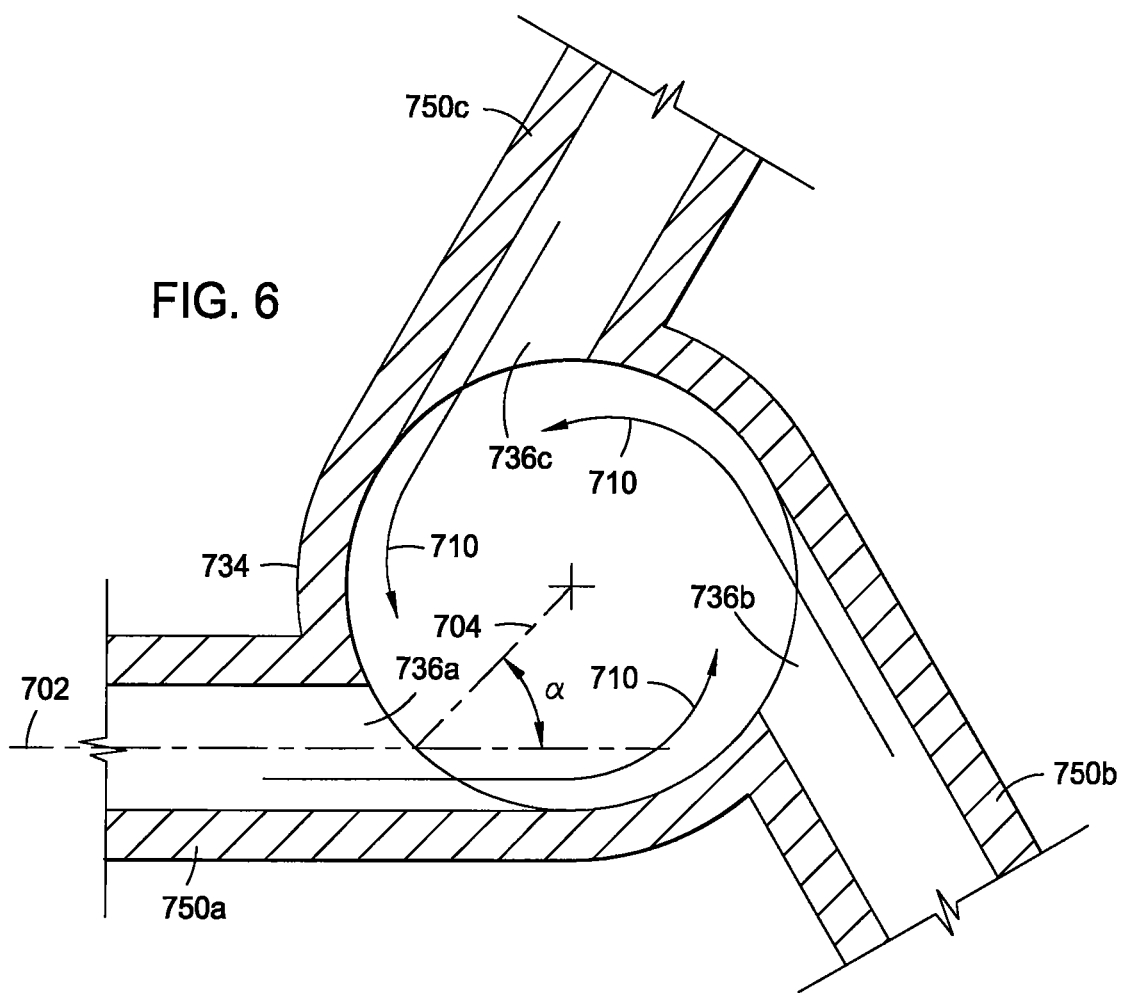
FIG. 6 depicts a top cross-sectional view of an expanding channel which is adapted to receive three gas flow as described in an embodiment herein.

Gas delivery system 230 of FIG. 1 has been described as including two pairs of valves 242a/252a, 242b/252b coupled to reactant gas source 238, 239 and purge gas source 240. In other embodiments, the gas delivery system 230 may contain one or more valves coupled to a single or a plurality of gas sources in a variety of configurations. FIGS. 1-3 show process chamber 200 adapted to provide two gas flows together or separately from two gas inlets 236a, 236b utilizing two pairs of valves 242a/252a, 242b/252b. FIG. 5 is a top cross-sectional view of another embodiment of expanding channel 634 of chamber lid assembly 232 which is adapted to receive a single gas flow through one gas inlet 636 from one gas conduit 650 coupled to a single or a plurality of valves. The gas conduit 650 may be positioned at an angle α from center line 602 of gas conduit 650 and from radius line 604 from the center of expanding channel 634. Gas conduit 650 positioned at an angle α (i.e., when α>0°) causes a gas to flow in a circular direction as shown by arrow 610. FIG. 6 is a top cross-sectional view of another embodiment of expanding channel 734 of chamber lid assembly 232 which is adapted to receive three gas flows together, partially together (i.e., two of three gas flows together), or separately through three gas inlets 736A, 736B, and 736C from three gas conduits 750a, 750b, and 750c in which each conduit is coupled to a single or a plurality of valves. Gas conduits 750a, 750b, and 750c may be positioned at an angle α from center line 702 of gas conduits 750a, 750b, and 750c and from radius line 704 from the center of expanding channel 734. Gas conduits 750a, 750b, and 750c positioned at an angle α (i.e., when α>0°) causes a gas to flow in a circular direction as shown by arrows 710.

Embodiments of chambers 200, 800, and 900 with gas delivery apparatuses 230, 830, and 930 as described in FIGS. 1-8, embodiments of chamber lid assemblies 1032, 1232, and 1632 and process chambers 1100, 1500, and 1700 as described in FIGS. 10A-17D, and embodiments of gas delivery assemblies 1800a, 1800c, 1800e, and 1800g as described in FIGS. 18A-18H may be used advantageously to implement ALD processes of elements, which include but are not limited to, tantalum, titanium, tungsten, ruthenium, hafnium, and copper, or to implement atomic layer deposition of compounds or alloys/combinations films, which include but are not limited to tantalum nitride, tantalum silicon nitride, titanium nitride, titanium silicon nitride, tungsten nitride, tungsten silicon nitride, and copper aluminum. Embodiments of chambers 200, 800, and 900 with gas delivery apparatuses 230, 830, and 930 as described in FIGS. 1-8 may also be used advantageously to implement chemical vapor deposition of various materials.

For clarity reasons, deposition of a layer by atomic layer deposition will be described in more detail in reference to the atomic layer deposition of a tantalum nitride layer utilizing process chamber 200 as described in FIGS. 1-4. In one aspect, atomic layer deposition of a tantalum nitride barrier layer includes sequentially providing pulses of a tantalum precursor and pulses of a nitrogen precursor to process chamber 200 in which each pulse is separated by a flow of a purge gas and/or chamber evacuation to remove any excess reactants to prevent gas phase reactions of the tantalum precursor with the nitrogen precursor and to remove any reaction by-products. Sequentially providing a tantalum precursor and a nitrogen precursor may result in the alternating absorption of monolayers of a tantalum precursor and of monolayers of a nitrogen precursor to form a monolayer of tantalum nitride on a substrate structure for each cycle of pulses. The term substrate structure is used to refer to the substrate as well as other material layers formed thereover, such as a dielectric layer.

It is believed that the adsorption processes used to adsorb the monolayer of the reactants, such as the tantalum precursor and the nitrogen precursor, are self-limiting in that only one monolayer may be adsorbed onto the surface of the substrate structure during a given pulse because the surface of the substrate structure has a finite number of sites for adsorbing the reactants. Once the finite number of sites is occupied by the reactants, such as the tantalum precursor or the nitrogen precursor, further absorption of the reactants will be blocked. The cycle may be repeated to a desired thickness of the tantalum nitride layer.

Pulses of a tantalum precursor, such as pentakis(dimethylamido) tantalum (PDMAT; $Ta(NMe_2)_5$), may be introduced by gas source 238 through valve 242a. The tantalum precursor may be provided with the aid of a carrier gas, which includes, but is not limited to, helium (He), argon (Ar), nitrogen ($N_2$), hydrogen ($H_2$), and combinations thereof. Pulses of a nitrogen precursor, such as ammonia, may be introduced by gas source 239 through valve 242a. A carrier gas may also be used to help deliver the nitrogen precursor. A purge gas, such as argon, may be introduced by gas source 240 through valve 242a and/or through valve 242b. In one aspect, the flow of purge gas may be continuously provided by gas source 240 through valves 242a, 242b to act as a purge gas between the pulses of the tantalum precursor and of the nitrogen precursor and to act as a carrier gas during the pulses of the tantalum precursor and the nitrogen precursor. In one aspect, delivering a purge gas through two gas conduits 250a, 250b provides a more complete purge of reaction zone 264 rather than a purge gas provided through one of gas conduit 250a or 250b. In one aspect, a reactant gas may be delivered through one of gas conduits 250a or 250b since uniformity of flow of a reactant gas, such as a tantalum precursor or a nitrogen precursor, is not as critical as uniformity of the purge gas due to the self-limiting absorption process of the reactants on the surface of substrate structures. In other embodiments, a purge gas may be provided in pulses. In other embodiments, a purge gas may be provided in more or less than two gas flows. In other embodiments, a tantalum precursor gas may be provided in more than a single gas flow (i.e., two or more gas flows). In other embodiments, a nitrogen precursor gas may be provided in more than a single gas flow (i.e., two or more gas flows).

Other examples of tantalum precursors, include, but are not limited to, other metal-organic precursors or derivatives thereof, such as pentakis(ethylmethylamido) tantalum (PEMAT; $Ta(N(Et)Me)_5$), pentakis(diethylamido) tantalum (PDEAT; $Ta(NEt_2)_5$), and derivatives of PEMAT, PDEAT, or PDMAT. Other tantalum precursors include without limitation TBTDET ($Ta(NEt_2)_3NC_4H_9$ or $C_{16}H_{39}N_4Ta$) and tantalum halides, for example $TaX_5$ where X is fluorine (F), bromine (Br) or chlorine (Cl), and/or derivatives thereof. Other nitrogen precursors may be used which include, but are not limited to, $N_xH_y$ with x and y being integers (e.g., hydrazine ($N_2H_4$)), dimethyl hydrazine (($CH_3)_2N_2H_2$), tertbutylhydrazine ($C_4H_9N_2H_3$), phenylhydrazine ($C_6H_5N_2H_3$), other hydrazine derivatives, a nitrogen plasma source (e.g., $N_2$, $N_2/H_2$, $NH_3$, or a $N_2H_4$ plasma), 2,2'-azotertbutane (($CH_3)_6C_2N_2$), ethylazide ($C_2H_5N_3$), and other suitable gases. Other examples of purge gases or carrier gases include, but are not limited to, helium (He), nitrogen ($N_2$), hydrogen ($H_2$), other gases, and combinations thereof.

The tantalum nitride layer formation is described as starting with the absorption of a monolayer of a tantalum precursor on the substrate followed by a monolayer of a nitrogen precursor. Alternatively, the tantalum nitride layer formation may start with the absorption of a monolayer of a nitrogen precursor on the substrate followed by a monolayer of the tantalum precursor. Furthermore, in other embodiments, a pump evacuation alone between pulses of reactant gases may be used to prevent mixing of the reactant gases.

The time duration for each pulse of the tantalum precursor, the time duration for each pulse of the nitrogen precursor, and the duration of the purge gas flow between pulses of the reactants are variable and depend on the volume capacity of a deposition chamber employed as well as a vacuum system coupled thereto. For example, (1) a lower chamber pressure of a gas will require a longer pulse time; (2) a lower gas flow rate will require a longer time for chamber pressure to rise and stabilize requiring a longer pulse time; and (3) a large-volume chamber will take longer to fill, longer for chamber pressure to stabilize thus requiring a longer pulse time. Similarly, time between each pulse is also variable and depends on volume capacity of the process chamber as well as the vacuum system coupled thereto. In general, the time duration of a pulse of the tantalum precursor or the nitrogen precursor should be long enough for absorption of a monolayer of the compound. In one aspect, a pulse of a tantalum precursor may still be in the chamber when a pulse of a nitrogen precursor enters. In general, the duration of the purge gas and/or pump evacuation should be long enough to prevent the pulses of the tantalum precursor and the nitrogen precursor from mixing together in the reaction zone.

Generally, a pulse time of about 1.0 second or less for a tantalum precursor and a pulse time of about 1.0 second or less for a nitrogen precursor are typically sufficient to adsorb alternating monolayers on a substrate structure. A time of about 1.0 second or less between pulses of the tantalum precursor and the nitrogen precursor is typically sufficient for the purge gas, whether a continuous purge gas or a pulse of a purge gas, to prevent the pulses of the tantalum precursor and the nitrogen precursor from mixing together in the reaction zone. Of course, a longer pulse time of the reactants may be used to ensure absorption of the tantalum precursor and the nitrogen precursor and a longer time between pulses of the reactants may be used to ensure removal of the reaction by-products.

During atomic layer deposition, substrate 210 may be maintained approximately below a thermal decomposition temperature of a selected tantalum precursor. An exemplary heater temperature range to be used with tantalum precursors identified herein is approximately between about 20° C. and about 500° C. at a chamber pressure less than about 100 Torr, preferably less than 50 Torr. When the tantalum containing gas is PDMAT, the heater temperature is preferably between about 100° C. and about 300° C., more preferably between about 175° C. and 250° C., and the chamber pressure is between about 1.0 Torr and about 5.0 Torr. In other embodiments, it should be understood that other temperatures and pressures may be used. For example, a temperature above a thermal decomposition temperature may be used. However, the temperature should be selected so that more than 50 percent of the deposition activity is by absorption processes. In another example, a temperature above a thermal decomposition temperature may be used in which the amount of decomposition during each precursor deposition is limited so that the growth mode will be similar to an atomic layer deposition growth mode.

One exemplary process of depositing a tantalum nitride layer by atomic layer deposition, in process chamber 200 of FIGS. 1-4, includes providing pulses of pentakis(dimethylamido) tantalum (PDMAT) from gas source 238 at a flow rate between about 100 sccm and about 1,000 sccm, preferably between about 100 sccm and about 400 sccm, through valve 242*a* for a pulse time of about 0.5 seconds or less, about 0.1 seconds or less, or about 0.05 seconds or less due the smaller volume of reaction zone 264. Pulses of ammonia may be provided from gas source 239 at a flow rate between about 100 sccm and about 1,000 sccm, preferably between 200 sccm and about 600 sccm, through valve 242*b* for a pulse time of about 0.5 seconds or less, about 0.1 seconds or less, or about 0.05 seconds or less due to a smaller volume of reaction zone 264. An argon purge gas at a flow rate between about 100 sccm and about 1,000 sccm, preferably, between about 100 sccm and about 400 sccm, may be continuously provided from gas source 240 through valves 242*a*, 242*b*. The time between pulses of the tantalum precursor and the nitrogen precursor may be about 0.5 seconds or less, about 0.1 seconds or less, or about 0.07 seconds or less due to the smaller volume of reaction zone 264. It is believed that a pulse time of about 0.016 seconds or more is required to fill reaction zone 264 with a reactant gas and/or a purge gas. The heater temperature preferably is maintained between about 100° C. and about 300° C. at a chamber pressure between about 1.0 Torr and about 5.0 Torr. This process provides a tantalum nitride layer in a thickness between about 0.5 Å and about 1.0 Å per cycle. The alternating sequence may be repeated until a desired thickness is achieved.

In one embodiment, the layer, such as a tantalum nitride layer, is deposited to a sidewall coverage of about 50 Å or less. In another embodiment, the layer is deposited to a sidewall coverage of about 20 Å or less. In still another embodiment, the layer is deposited to a sidewall coverage of about 10 Å or less. A tantalum nitride layer with a thickness of about 10 Å or less is believed to be a sufficient thickness in the application as a barrier layer to prevent copper diffusion. In one aspect, a thin barrier layer may be used to advantage in filling submicron (e.g., less than 0.15 μm) and smaller features having high aspect ratios (e.g., greater than 5 to 1). Of course, a layer having a sidewall coverage of greater than 50 Å may be used.

Embodiments of atomic layer deposition have been described above as absorption of a monolayer of reactants on a substrate. The invention also includes embodiments in which the reactants are deposited to more or less than a monolayer. The invention also includes embodiments in which the reactants are not deposited in a self-limiting manner. The invention also includes embodiments in which deposition occurs in mainly a chemical vapor deposition process in which the reactants are delivered sequentially or simultaneously.

Coverage-Diverge Lid Assembly

Figure 10A:
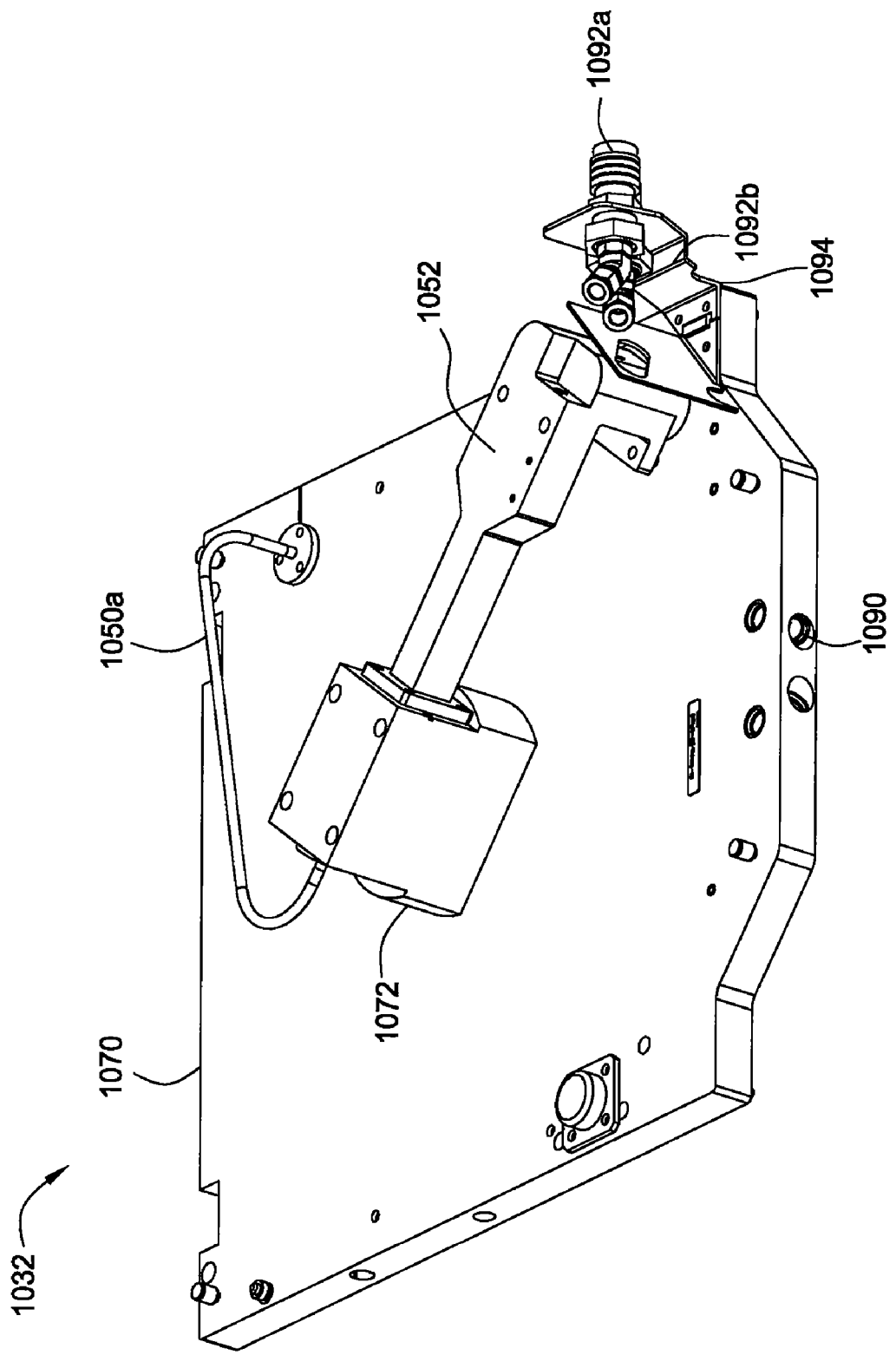
FIGS. 10A-10F depict schematic views of a process chamber lid assembly adapted for atomic layer deposition as described in another embodiment herein.
Figure 10B:
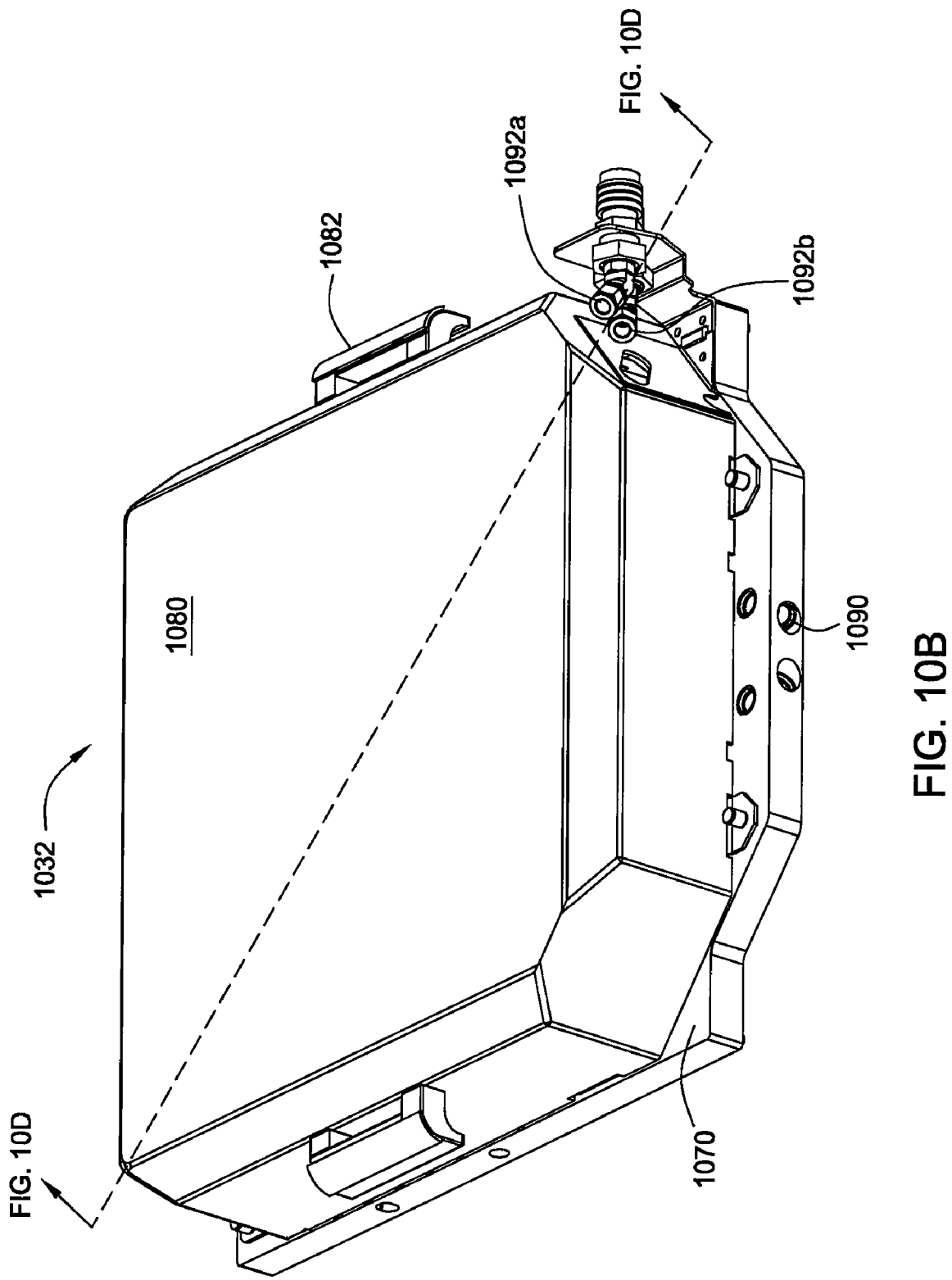
Figure 10C:
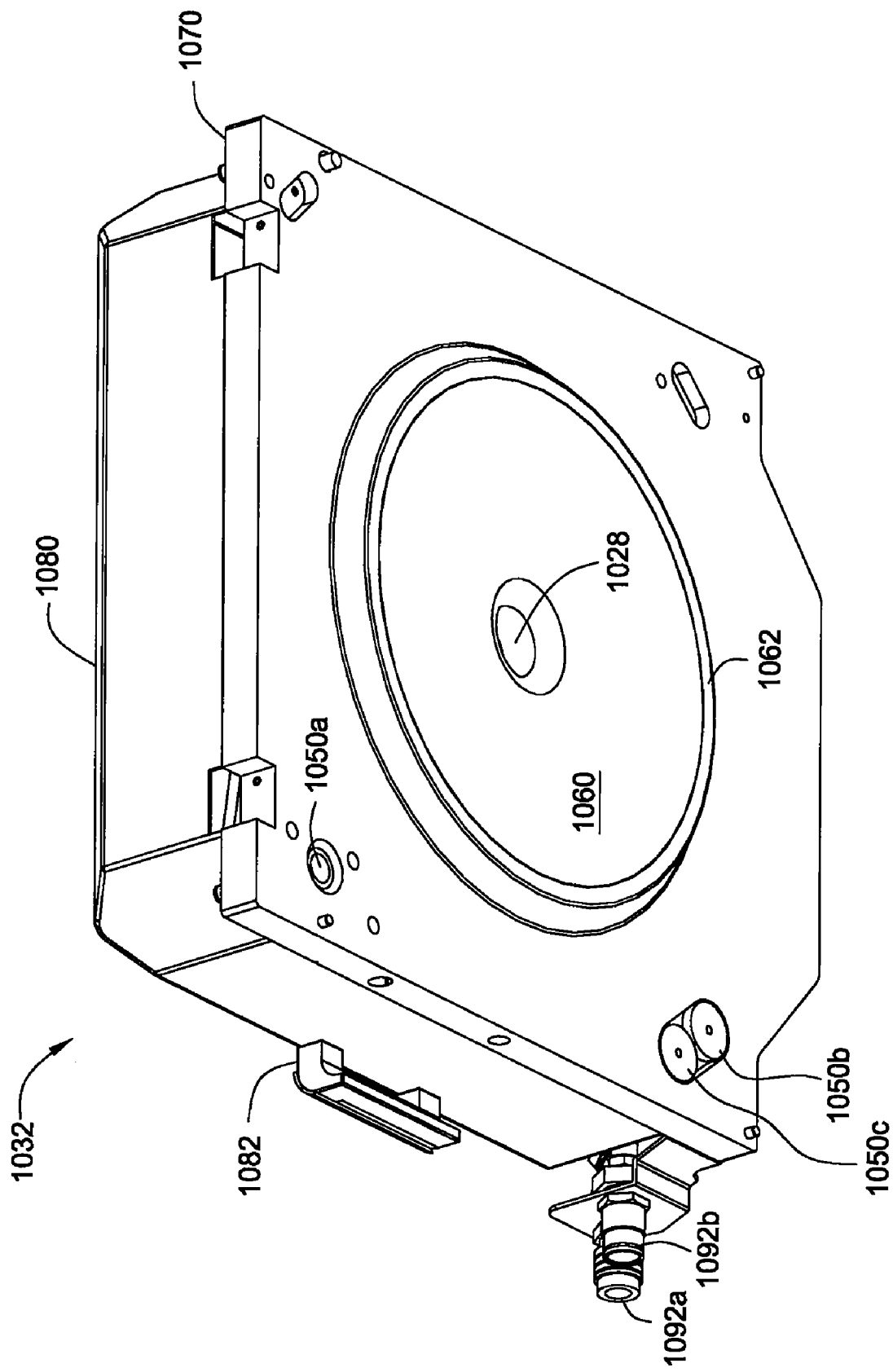
Figure 10D:
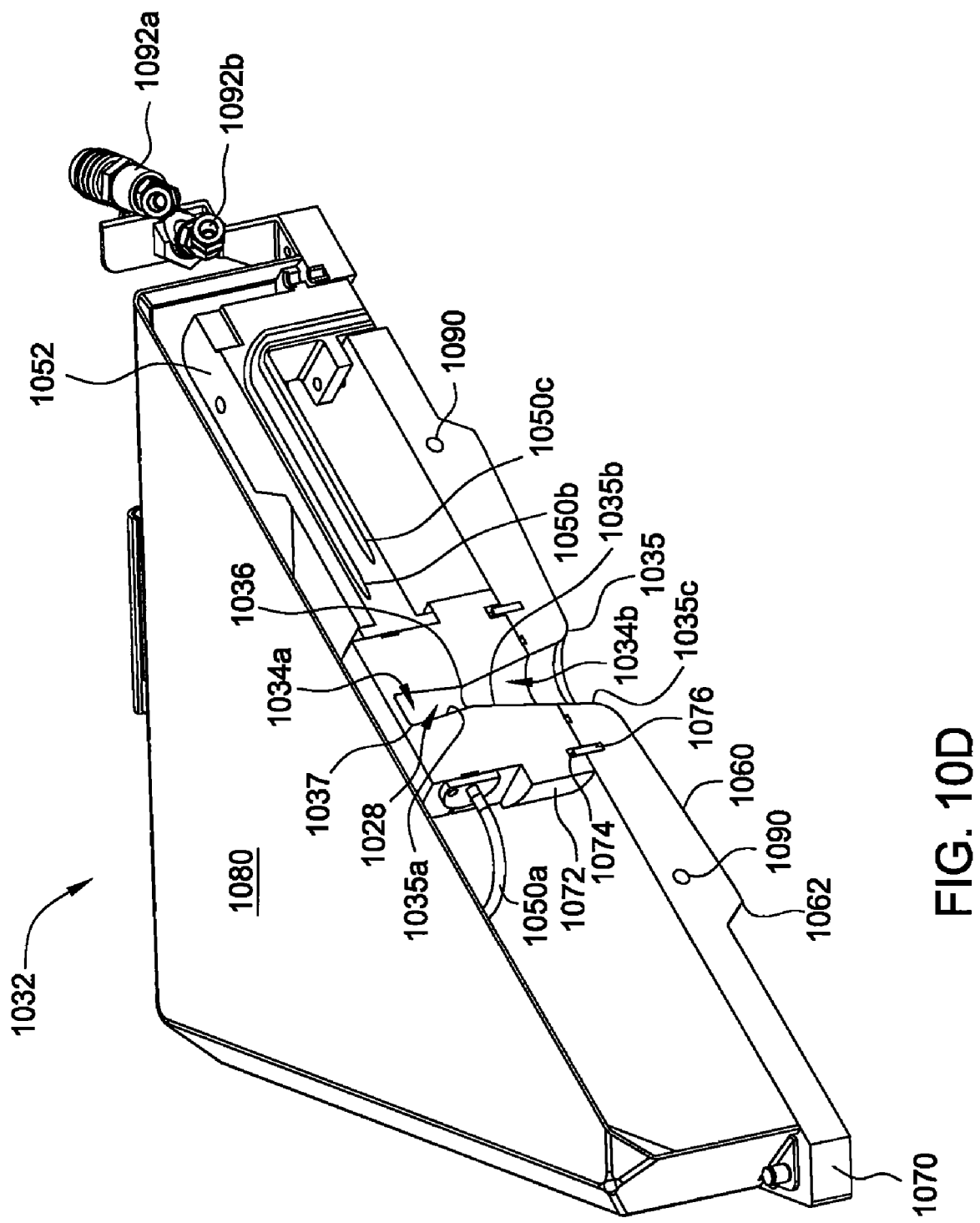
Figure 10E:
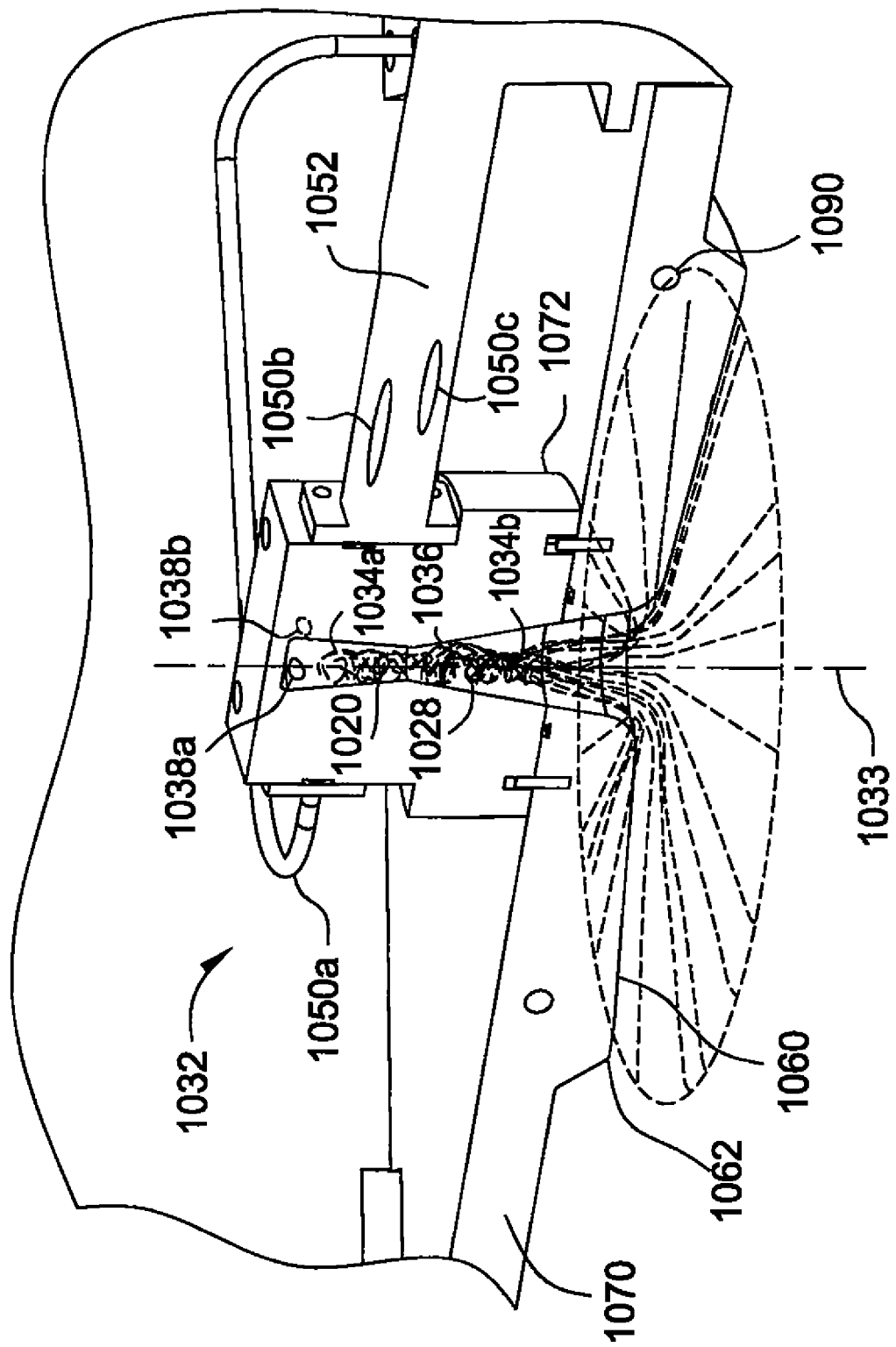
Figure 10F:
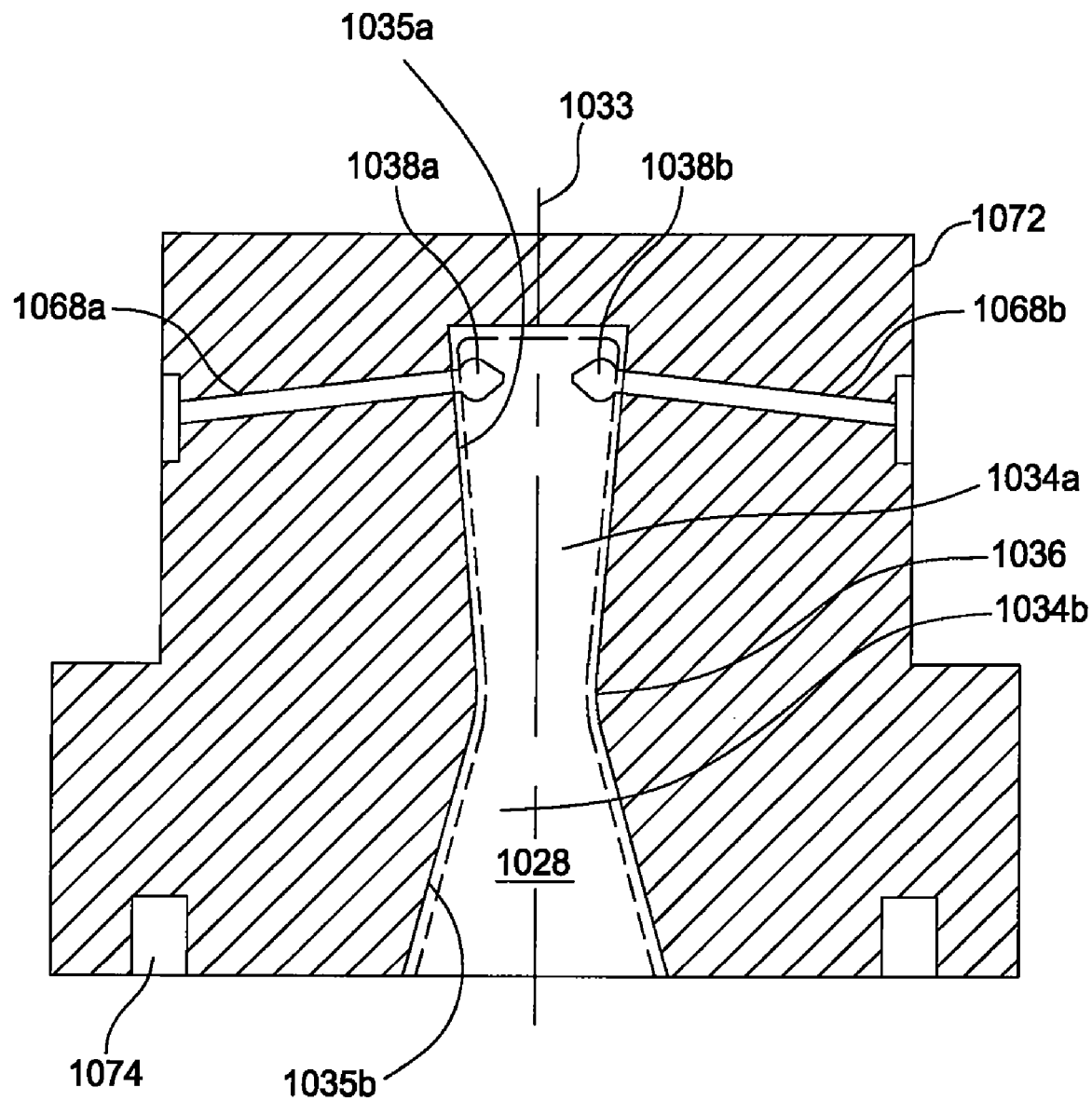

FIGS. 10A-10F depict schematic views of chamber lid assembly 1032 adapted for ALD processes as described in another embodiment herein. Chamber lid assembly 1032 contains lid cap 1072 positioned in a centralized portion of lid plate 1070, as illustrated in FIG. 10A. Gas conduit 1050*a* is coupled to and in fluid communication with lid cap 1072 on one end, while the other end of gas conduit 1050*a* extends through lid plate 1070 and may be coupled to and in fluid communication with an ALD valve and a chemical precursor source. In one embodiment, gas conduit 1050*a* may be directly coupled to and in fluid communication with gas dispersing channel 1028. Alternatively, gas conduit 1050*a* may be indirectly coupled to and in fluid communication with gas dispersing channel 1028, such as through gas conduit 1068*a* (FIG. 10F).

Gas conduit cover 1052 contains at least one gas conduit, or may contain two, three, or more gas conduits. FIGS. 10D-10E depict gas conduit cover 1052 containing gas conduits 1050*b* and 1050*c*. In one embodiment, gas conduit 1050*b* may be coupled to and in fluid communication with lid cap 1072 on one end, while the other end of gas conduit 1050*b* extends through lid plate 1070 and may be coupled to and in fluid communication with an ALD valve and a chemical precursor source. In another embodiment, gas conduit 1050*b* or 1050*c* may be directly coupled to and in fluid communication with gas dispersing channel 1028. Alternatively, gas conduit 1050*b* or 1050*c* may be indirectly coupled to and in fluid communication with gas dispersing channel 1028, such as through gas conduit 1068*b* (FIG. 10F).

Conduit 1050*c* is an optional conduit in some embodiments. Gas conduit 1050*c* may be coupled to and in fluid communication with lid cap 1072 on one end, while the other end of gas conduit 1050*c* extends through lid plate 1070 and may be coupled to and in fluid communication with an ALD valve and gas source, such as a carrier gas source, a purge gas source, a plasma gas, or a chemical precursor source. In another embodiment, conduit 1050*c* is may be coupled to and in fluid communication with the top surface of lid cap 1072. In another embodiment, conduit 1050*c* is may be combined with conduit 1050*b*, such as with a Y-joint, and may be coupled to and in fluid communication with gas conduit 1068*b*.

Chamber lid assembly 1032 has been shown in FIGS. 10A-10F as containing lid cap 1072 and lid plate 1070 in which lid cap 1072 and lid plate 1070 form gas dispersing channel 1028. An additional plate may be optionally disposed between lid plate 1070 and lid cap 1072 (not shown). Pins 1076 within grooves 1074 connect lid plate 1070 and lid cap 1072 (FIG. 10D). The additional plate may be used to adjust (e.g., increase) the distance between lid cap 1072 and lid plate 1070 therefore respectively changing the length of gas dispersing channel 1028 formed therethrough. In another embodiment, the optional additional plate disposed between lid plate 1070 and lid cap 1072 contains stainless steel. In other embodiments, gas dispersing channel 1028 may be made integrally from a single piece of material.

Chamber lid assembly 1032 may include cooling elements and/or heating elements depending on the particular gas being delivered therethrough. Controlling the temperature of chamber lid assembly 1032 may be used to prevent gas decomposition, deposition, or condensation on chamber lid assembly 1032. For example, coolant channel 1090 may be formed in chamber lid assembly 1032 to cool chamber lid assembly 1032. In another example, heating elements (not shown) may be embedded or may surround components of chamber lid assembly 1032 to heat chamber lid assembly 1032. In one embodiment, components of chamber lid assembly 1032 may be individually heated or cooled. For example, referring to FIG. 10A, chamber lid assembly 1032 may contain lid plate 1070 and lid cap 1072 in which lid plate 1070 and lid cap 1072 form gas dispersing channel 1028. Lid cap 1072 may be maintained at one temperature range and lid plate 1070 may be maintained at another temperature range. For example, lid cap 1072 may be heated by being wrapped in heater tape or by using another heating device to prevent condensation of reactant gases and lid plate 1070 may be maintained at ambient temperature. In another example, lid cap 1072 may be heated and lid plate 1070 may be cooled with water channels formed therethrough to prevent thermal decomposition of reactant gases on lid plate 1070.

Chamber lid assembly 1032 contains components that may be made of stainless steel, aluminum, nickel-plated aluminum, nickel, or other suitable materials compatible with the processing to be performed. In one embodiment, lid cap 1072 and lid plate 1070 may be independently fabricated, machined, forged, or otherwise made from a metal, such as aluminum, an aluminum alloy, steel, stainless steel, alloys thereof, or combinations thereof.

In one embodiment, gas dispersing channel 1028 and lower surface 1060 of chamber lid assembly 1032 may contain a mirror polished surface to help produce a laminar flow of a gas along gas dispersing channel 1028 and lower surface 1060 of chamber lid assembly 1032. In another embodiment, the inner surface of gas conduits 1050*a*, 1050*b*, 1150*c*, 1068*a*, or 1068*b* may be electropolished to help produce a laminar flow of a gas therethrough.

In one embodiment, inner surfaces 1035*a*, 1035*b*, and 1035*c* of dispersing channel 1028 and lower surface 1060 of chamber lid assembly 1032 may contain a mirror polished surface to help produce a laminar flow of a gas along dispersing channel 1028 and lower surface 1060 of chamber lid assembly 1032. In another embodiment, the inner surface of gas conduits 1050*a*, 1050*b*, and 1050*c* may be electropolished to help produce a laminar flow of a gas therethrough.

In an alternative embodiment, inner surfaces 1035*a*, 1035*b*, and 1035*c* of dispersing channel 1028 and lower surface 1060 of chamber lid assembly 1032 may contain a roughened surface or machined surfaces to produce more surface area across the surfaces. Roughened surfaces provide better adhesion of undesired accumulated materials on inner surfaces 1035*a*, 1035*b*, and 1035*c* and lower surface 1060. The undesired films are usually formed as a consequence of conducting a vapor deposition process and may peel or flake from inner surfaces 1035*a*, 1035*b*, and 1035*c* and lower surface 1060 to contaminate substrate 1010. In one example, the mean roughness ($R_a$) of inner surfaces 1035*a*, 1035*b*, and/or 1035*c* and lower surface 1060 may be at least about 10 μin, such as within a range from about 10 μin (about 0.254 μm) to about 200 μin (about 5.08 μm), preferably, from about 20 μin (about 0.508 μm) to about 100 μin (about 2.54 μm), and more preferably, from about 30 μin (about 0.762 μm) to about 80 μin (about 2.032 μm). In another example, the mean roughness of inner surfaces 1035*a*, 1035*b*, and/or 1035*c* and lower surface 1060 may be at least about 100 μin (about 2.54 μm), preferably, within a range from about 200 μin (about 5.08 μm) to about 500 μin (about 12.7 μm).

FIGS. 10D-10F depict a cross-sectional view of chamber lid assembly 1032 containing gas dispersing channel 1028 extending through a central portion of lid plate 1070. Gas dispersing channel 1028 is usually positioned to extend perpendicular to a substrate that is positioned below chamber lid assembly 1032 during an ALD process. Gas dispersing channel 1028 extends along central axis 1033 of lid cap 1072, through lid plate 1070, and to lower surface 1060. The geometry of gas dispersing channel 1028 may be similar to an hour glass containing a converging upper portion and a diverging lower portion. Converging channel 1034*a* is a portion of gas dispersing channel 1028 that tapers towards central axis 1033 within upper portion 1037 of gas dispersing channel 1028. Diverging channel 1034*b* is a portion of gas dispersing channel 1028 that tapers away from central axis 1033 within lower portion 1035 of gas dispersing channel 1028. Throttle 1036 is a narrow passage separating converging channel 1034*a* and diverging channel 1034*b*. Gas dispersing channel 1028 further extends pass lower surface 1060 and into reaction zone 1064. Gas dispersing channel 1028 contains inner surfaces 1035*a*-1035*c*, such that converging channel 1034*a* has inner surface 1035*a*, diverging channel 1034*b* has inner surface 1035*b*, and lid plate 1070 has inner surface 1035*c*. Lower surface 1060 extends from diverging channel 1034 to choke 1062. Lower surface 1060 is sized and shaped to substantially cover the substrate that is positioned below chamber lid assembly 1032 during the ALD process.

FIGS. 10A-10F depict chamber lid assembly 1032 configured to expose a substrate to at least two gas sources or chemical precursors. In other examples, gas delivery system 1130 may be reconfigured to expose a substrate to a single gas source (as depicted in FIG. 5) or to three or more gas sources or chemical precursors (as depicted in FIG. 6).

Processes gases, as circular gas flow 1020 depicted in FIG. 10E, are forced to make more revolutions around central axis 1033 of gas dispersing channel 1028 while passing through throttle 1036, than in similarly configured process chamber in the absence of throttle 1036. Circular gas flow 1020 may contain a flow pattern, such as a vortex pattern, a helix pattern, a spiral pattern, a twirl pattern, a twist pattern, a coil pattern, a whirlpool pattern, or derivatives thereof. Circular gas flow 1020 may extend at least about 1 revolution around central axis 1033 of gas dispersing channel 1028, preferably, at least about 1.5 revolutions, more preferably, at least about 2 revolutions, more preferably, at least about 3 revolutions, and more preferably, about 4 revolutions or more.

FIGS. 10A-10F depict gas conduits 1050*a*, 1050*b*, 1050*c*, 1068*a*, and 1068*b* and gas inlets 1038*a* and 1038*b* may be positioned in a variety of angles in relationship to central axis 1033 of gas dispersing channel 1028. Each gas conduit 1050*a*, 1050*b*, 1050*c*, 1068*a*, or 1068*b* or gas inlets 1038*a* or 1038*b* is preferably positioned normal (in which $+\beta$, $-\beta=90°$) to central axis 1033 or positioned at an angle $+\beta$ or an angle $-\beta$ (in which $0°<+\beta<90°$ or $0°<-\beta<90°$, as shown in FIG. 11C for central axis 1133) from a center line of each gas conduit 1050*a*, 1050*b*, 1050*c*, 1068*a*, or 1068*b* or gas inlets 1038*a* or 1038*b* to central axis 1033. Therefore, gas conduits 1050*a*, 1050*b*, 1050*c*, 1068*a*, and 1068*b* and gas inlets 1038*a* and 1038*b* may be positioned horizontally normal to central axis 1033 and, may be angled downwardly at an angle $+\beta$, or may be angled upwardly at an angle $-\beta$ to provide a gas flow towards the walls of gas dispersing channel 1028 rather than directly downward towards a substrate which helps reduce the likelihood of blowing off reactants adsorbed on the surface of a substrate. In addition, the diameter of gas conduits 1050*a*, 1050*b*, 1050*c*, 1068*a*, and 1068*b* may be increasing from the delivery lines or ALD valves to gas inlets 1038*a* and 1038*b* to help reduce the velocity of the gas flow prior to its entry into gas dispersing channel 1028. For example, gas conduits 1050*a*, 1050*b*, 1050*c*, 1068*a*, and 1068*b* may contain an inner diameter which is gradually increasing or may contain a plurality of connected conduits having increasing inner diameters.

FIGS. 10D-10F depict gas dispersing channel 1028 containing an inner diameter which decreases within converging channel 1034*a* from upper portion 1037, along central axis 1033, to throttle 1036. Also, gas dispersing channel 1028 contains an inner diameter which increases within diverging channel 1034b from throttle 1036, along central axis 1033, to lower portion 1035 adjacent lower surface 1060 of chamber lid assembly 1032.

In one example, chamber lid assembly 1032 adapted to process 300 mm diameter substrates may have the following diameters. The diameter at upper portion 1037 of gas dispersing channel 1028 may be within a range from about 0.5 inches to about 2 inches, preferably, from about 0.75 inches to about 1.5 inches, and more preferably, from 0.8 inches to about 1.2 inches, for example, about 1 inch. The diameter at throttle 1036 of gas dispersing channel 1028 may be within a range from about 0.1 inches to about 1.5 inches, preferably, from about 0.3 inches to about 0.9 inches, and more preferably, from 0.5 inches to about 0.8 inches, for example, about 0.66 inches. The diameter at lower portion 1035 of gas dispersing channel 1028 may be within a range from about 0.5 inches to about 2 inches, preferably, from about 0.75 inches to about 1.5 inches, and more preferably, from 0.8 inches to about 1.2 inches, for example, about 1 inch.

In general, the above dimension apply to gas dispersing channel 1028 adapted to provide a total gas flow of between about 500 sccm and about 3,000 sccm. In other specific embodiments, the dimension may be altered to accommodate a certain gas flow therethrough. In general, a larger gas flow will require a larger diameter of gas dispersing channel 1028.

Not wishing to be bound by theory, it is believed that the diameter of gas dispersing channel 1028, which is gradually decreasing from upper portion 1037 of gas dispersing channel 1028 to throttle 1036 and increasing from throttle 1036 to lower portion 1035 of gas dispersing channel 1028, allows less of an adiabatic expansion of a gas through gas dispersing channel 1028 which helps to control the temperature of the process gas contained in circular flow gas 1020. For instance, a sudden adiabatic expansion of a gas delivered through gas inlet 1038A, 1038B into gas dispersing channel 1028 may result in a drop in the temperature of the gas which may cause condensation of the gas and formation of droplets. On the other hand, gas dispersing channel 1028 that gradually tapers is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 1032). Gas dispersing channel 1028 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

In one embodiment, gas inlets 1038A, 1038B are located adjacent upper portion 1037 of gas dispersing channel 1028, as depicted in FIG. 10F. In other embodiments, one or more gas inlets 1038A, 1038B may be located along the length of gas dispersing channel 1028 between upper portion 1037 and lower portion 1035.

Each gas conduit 1050a, 1050b, 1050c, 1068a, or 1068b may be positioned at an angle α from the centerline of the gas conduit and from a radius line of gas dispersing channel 1028, similarly as depicted in FIG. 11C of each gas conduits 1150a and 1150b that may be positioned at an angle α from center lines 1146a and 1146b of gas conduits 1150a and 1150b and from radius line from the center of gas dispersing channel 1128. Entry of a gas through gas conduits 1050a, 1050b, 1050c, 1068a, and 1068b preferably positioned at an angle α (i.e., when α>0°) causes the gas to flow in a circular direction as shown by circular gas flow 1020 (FIG. 10E). Providing gas at an angle α as opposed to directly straight-on to the walls of the expanding channel (i.e., when α=0°) helps to provide a more laminar flow through gas dispersing channel 1028 rather than a turbulent flow. It is believed that a laminar flow through gas dispersing channel 1028 results in an improved purging of the inner surface of gas dispersing channel 1028 and other surfaces of chamber lid assembly 1032. In comparison, a turbulent flow may not uniformly flow across the inner surface of gas dispersing channel 1028 and other surfaces and may contain dead spots or stagnant spots in which there is no gas flow. In one aspect, gas conduits 1050a, 1050b, 1050c, 1068a, and 1068b and corresponding gas inlets 1038A, 1038B are spaced out from each other and direct a flow in the same circular direction (i.e., clockwise or counter-clockwise).

Not wishing to be bound by theory, FIG. 10E-10F is a cross-sectional view of gas dispersing channel 1028 of chamber lid assembly 1032 showing simplified representations of gas flows therethrough. Although the exact flow pattern through the gas dispersing channel 1028 is not known, it is believed that circular gas flow 1020 (FIG. 10E) may travel through gas dispersing channel 1028 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. The circular flow may be provided in a "processing region" as opposed to in a compartment separated from a substrate. In one aspect, circular gas flow 1020 may help to establish a more efficient purge of gas dispersing channel 1028 due to the sweeping action of the vortex flow pattern across the inner surface of gas dispersing channel 1028.

FIG. 10D depicts that at least a portion of lower surface 1060 of chamber lid assembly 1032 may be tapered from gas dispersing channel 1028 to a peripheral portion of chamber lid assembly 1032 to help provide an improved velocity profile of a gas flow from gas dispersing channel 1028 across the surface of a substrate (i.e., from the center of the substrate to the edge of the substrate). Lower surface 1060 may contain one or more tapered surfaces, such as a straight surface, a concave surface, a convex surface, or combinations thereof. In one embodiment, lower surface 1060 is tapered in the shape of a funnel.

In one example, lower surface 1060 is downwardly sloping to help reduce the variation in the velocity of the process gases traveling between lower surface 1060 of chamber lid assembly 1032 and a substrate while assisting to provide uniform exposure of the surface of a substrate to a reactant gas. In one embodiment, the ratio of the maximum area of the flow section over the minimum area of the flow section between a downwardly sloping lower surface 1060 of chamber lid assembly 1032 and the surface of a substrate is less than about 2, preferably, less than about 1.5, more preferably, less than about 1.3, and more preferably, about 1.

Not wishing to be bound by theory, it is believed that a gas flow traveling at a more uniform velocity across the surface of a substrate helps provide a more uniform deposition of the gas on a substrate. It is believed that the velocity of the gas is directly proportional to the concentration of the gas which is in turn directly proportional to the deposition rate of the gas on a substrate surface. Thus, a higher velocity of a gas at a first area of the surface of a substrate versus a second area of the surface of a substrate is believed to provide a higher deposition of the gas on the first area. It is believed that chamber lid assembly 1032 having lower surface 1060, downwardly sloping, provides for more uniform deposition of the gas across the surface of a substrate because lower surface 1060 provides a more uniform velocity and, thus, a more uniform concentration of the gas across the surface of a substrate.

FIGS. 10C-10E depict choke 1062 located at a peripheral portion of chamber lid assembly 1032 adjacent the periphery of where a substrate may be positioned during an ALD process. Choke 1062, when chamber lid assembly 1032 is assembled to form a processing zone around a substrate, may contain any member restricting the flow of gas therethrough at an area adjacent the periphery of the substrate.

Lid cap 1072, gas conduit 1050a, gas conduit cover 1052, and a portion of the upper surface of lid plate 1070 may be covered by chamber lid cover 1080 having handles 1082, as illustrated in FIGS. 10A-10D. The temperature of chamber lid assembly 1032 may be controlled by a liquid cooling system attached to a water jacket, such as coolant channel 1090 extending through lid plate 1070. A fluid coolant, such as water, may be passed through coolant channel 1090 to remove heat from lid plate 1070. Coolant connectors 1092a and 1092b may be connected coolant channel 1070 by a hose or a tube. The other end of coolant connectors 1092a and 1092b may be connected by a hose or a tube to a fluid source and a fluid return, such as an in-house cooling system or an independent cooling system. Coolant connectors 1092a and 1092b may be attached to lid plate 1070 by support bracket 1094. Liquids that may be flowed through coolant channel 1070 include water, oil, alcohols, glycols, glycol ethers, or other organic solvents. In one embodiment, the temperature of lid plate 1070 or chamber lid assembly 1032 may be maintained at a predetermined temperature within a range from about 0° C. to about 100° C., preferably, from about 18° C. to about 65° C., and more preferably, from about 20° C. to about 50° C.

Figure 11A:
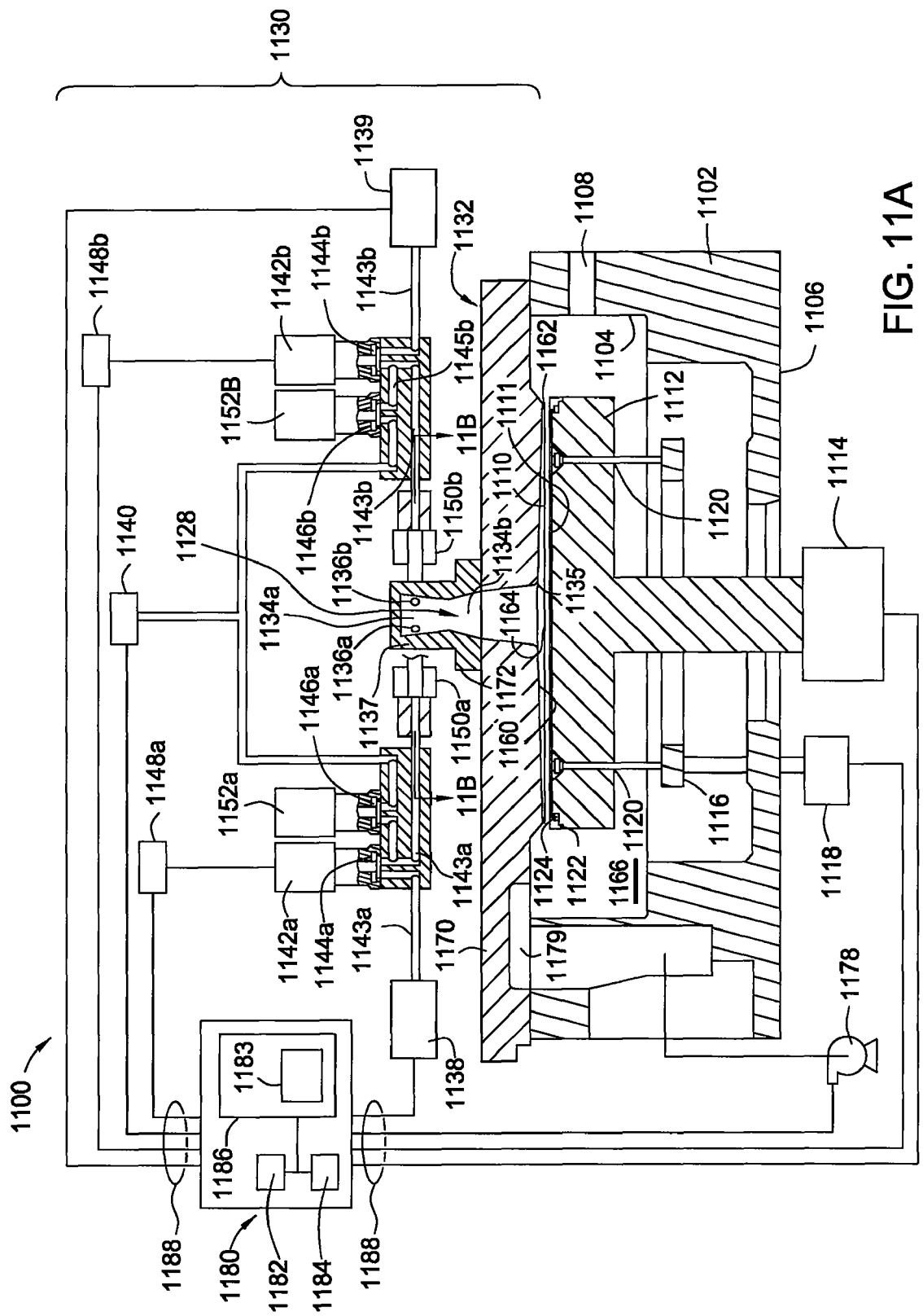

FIGS. 11A-11C are a schematic views of one embodiment of process chamber 1100 including gas delivery system 1130 adapted for ALD processes. Process chamber 1100 contains a chamber body 1102 having sidewalls 1104 and bottom 1106. Slit valve 1108 in process chamber 1100 provides access for a robot (not shown) to deliver and retrieve substrate 1110, such as a 200 mm or 300 mm semiconductor wafer or a glass substrate, to and from process chamber 1100.

Substrate support 1112 supports substrate 1110 on substrate receiving surface 1111 in process chamber 1100. Substrate support 1112 is mounted to lift motor 1114 for raising and lowering substrate support 1112 and substrate 1110 disposed thereon. Lift plate 1116 connected to lift motor 1118 is mounted in process chamber 1100 and raises and lowers lift pins 1120 movably disposed through substrate support 1112. Lift pins 1120 raise and lower substrate 1110 over the surface of substrate support 1112. Substrate support 1112 may include a vacuum chuck (not shown), an electrostatic chuck (not shown), or a clamp ring (not shown) for securing substrate 1110 to substrate support 1112 during a deposition process.

The temperature of substrate support 1112 may be adjusted to control the temperature of substrate 1110 disposed thereon. For example, substrate support 1112 may be heated using an embedded heating element, such as a resistive heater (not shown), or may be heated using radiant heat, such as heating lamps (not shown) disposed above substrate support 1112. Purge ring 1122 may be disposed on substrate support 1112 to define purge channel 1124 which provides a purge gas to a peripheral portion of substrate 1110 to prevent deposition thereon.

Gas delivery system 1130 is disposed at an upper portion of chamber body 1102 to provide a gas, such as a process gas and/or a purge gas, to process chamber 1100. FIGS. 11A-11C depict gas delivery system 1130 configured to expose substrate 1110 to at least two gas sources or chemical precursors. In other examples, gas delivery system 1130 may be reconfigured to expose substrate 1110 to a single gas source (as depicted in FIG. 5) or to three or more gas sources or chemical precursors (as depicted in FIG. 6). Vacuum system 1178 is in communication with pumping channel 1179 to evacuate any desired gases from process chamber 1100 and to help maintain a desired pressure or a desired pressure range inside pumping zone 1166 of process chamber 1100.

In one embodiment, gas delivery system 1130 contains chamber lid assembly 1132 having gas dispersing channel 1128 extending through a central portion of chamber lid assembly 1132. Gas dispersing channel 1128 extends perpendicular to substrate receiving surface 1111 and also extends along central axis 1133 of gas dispersing channel 1128, through lid plate 1170, and to lower surface 1160. Converging channel 1134a is a portion of gas dispersing channel 1128 that tapers towards central axis 1133 within upper portion 1137 of gas dispersing channel 1128. Diverging channel 1134b is a portion of gas dispersing channel 1128 that tapers away from central axis 1133 within lower portion 1135 of gas dispersing channel 1128. Throttle 1131 is a narrow passage separating converging channel 1134a and diverging channel 1134b. Gas dispersing channel 1128 further extends pass lower surface 1160 and into reaction zone 1164. Lower surface 1160 extends from diverging channel 1134 to choke 1162. Lower surface 1160 is sized and shaped to substantially cover substrate 1110 disposed on substrate receiving surface 1111 of substrate support 1112.

Processes gases, as circular gas flow 1174, are forced to make more revolutions around central axis 1133 of gas dispersing channel 1128 while passing through throttle 1131, than in similarly configured process chamber in the absence of throttle 1131. Circular gas flow 1174 may contain a flow pattern, such as a vortex pattern, a helix pattern, a spiral pattern, a twirl pattern, a twist pattern, a coil pattern, a whirlpool pattern, or derivatives thereof. Circular gas flow 1174 may extend at least about 1 revolution around central axis 1133 of gas dispersing channel 1128, preferably, at least about 1.5 revolutions, more preferably, at least about 2 revolutions, more preferably, at least about 3 revolutions, and more preferably, about 4 revolutions or more.

Gas dispersing channel 1128 has gas inlets 1136a, 1136b to provide gas flows from two similar pairs of valves 1142a/1152a, 1142b/1152b, which may be provided together and/or separately. In one configuration, valve 1142a and valve 1142b are coupled to separate reactant gas sources but are preferably coupled to the same purge gas source. For example, valve 1142a is coupled to reactant gas source 1138 and valve 1142b is coupled to reactant gas source 1139, and both valves 1142a, 1142b are coupled to purge gas source 1140. Each valve 1142a, 1142b includes delivery line 1143a, 1143b having valve seat assembly 1144a, 1144b and each valve 1152a, 1152b includes purge line 1145a, 1145b having valve seat assembly 1146a, 1146b. Delivery line 1143a, 1143b is in fluid communication with reactant gas source 1138, 1143 and is in fluid communication with gas inlet 1136a, 1136b of gas dispersing channel 1128. Valve seat assembly 1144a, 1144b of the delivery line 1143a, 1143b controls the flow of the reactant gas from reactant gas source 1138, 1143 to gas dispersing channel 1128. Purge line 1145a, 1145b is in fluid communication with purge gas source 1140 and intersects delivery line 1143a, 1143b downstream of valve seat assembly 1144a, 1144b of delivery line 1143a, 1143b. Valve seat assembly 1146a, 1146b of purge line 1145a, 1145b controls the flow of the purge gas from purge gas source 1140 to gas dispersing channel 1128. If a carrier gas is used to deliver reactant gases from reactant gas source 1138, 1143, preferably the same gas is used as a carrier gas and a purge gas (i.e., an argon gas used as a carrier gas and a purge gas).

Each valve seat assembly 1144a, 1144b, 1146a, 1146b may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 1148a, 1148b may be coupled to valves 1142a, 1142b to control actuation of the diaphragms of valve seat assemblies 1144a, 1144b, 1146a, 1146b of valves 1142a, 1142b. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 1142a, 1142b may be a zero dead volume valve to enable flushing of a reactant gas from delivery line 1143a, 1143b when valve seat assembly 1144a, 1144b is closed. For example, purge line 1145a, 1145b may be positioned adjacent valve seat assembly 1144a, 1144b of delivery line 1143a, 1143b. When valve seat assembly 1144a, 1144b is closed, purge line 1145a, 1145b may provide a purge gas to flush delivery line 1143a, 1143b. In one embodiment, purge line 1145a, 1145b is positioned slightly spaced from valve seat assembly 1144a, 1144b of delivery line 1143a, 1143b so that a purge gas is not directly delivered into valve seat assembly 1144a, 1144b when open. A zero dead volume valve as used herein is defined as a valve which has negligible dead volume (i.e., not necessary zero dead volume).

Each valve pair 1142a/1152a, 1142b/1152b may be adapted to provide a combined gas flow and/or separate gas flows of the reactant gas and the purge gas. In reference to valve pair 1142a/1152a, one example of a combined gas flow of the reactant gas and the purge gas includes a continuous flow of a purge gas from purge gas source 1140 through purge line 1145a and pulses of a reactant gas from reactant gas source 1138 through delivery line 1143a. The continuous flow of the purge gas may be provided by leaving the diaphragm of valve seat assembly 1146a of purge line 1145a open. The pulses of the reactant gas from reactant gas source 1138 may be provided by opening and closing the diaphragm of valve seat assembly 1144a of delivery line 1143a. In reference to valve pair 1142a/1152a, one example of separate gas flows of the reactant gas and the purge gas includes pulses of a purge gas from purge gas source 1140 through purge line 1145a and pulses of a reactant gas from reactant gas source 1138 through delivery line 1143a. The pulses of the purge gas may be provided by opening and closing the diaphragm of valve seat assembly 1146a of purge line 1145a. The pulses of the reactant gas from reactant gas source 1138 may be provided by opening and closing the diaphragm of valve seat assembly 1144a of delivery line 1143a.

Delivery lines 1143a, 1143b of valves 1142a, 1142b may be coupled to gas inlets 1136a, 1136b through gas conduits 1150a, 1150b. Gas conduits 1150a, 1150b may be integrated or may be separate from valves 1142a, 1142b. In one aspect, valves 1142a, 1142b are coupled in close proximity to gas dispersing channel 1128 to reduce any unnecessary volume of delivery line 1143a, 1143b and gas conduits 1150a, 1150b between valves 1142a, 1142b and gas inlets 1136a, 1136b.

FIG. 11C depicts each gas conduit 1150a and 1150b and gas inlet 1136a and 1136b positioned in a variety of angles in relationship to central axis 1133 of gas dispersing channel 1128. Each gas conduit 1150a, 1150b and gas inlet 1136a, 1136b are preferably positioned normal (in which $+\beta$, $-\beta=90°$) to central axis 1133 or positioned at an angle $+\beta$ or an angle $-\beta$ (in which $0°<+\beta<90°$ or $0°<-\beta<90°$) from center lines 1176a and 1176b of gas conduit 1150a, 1150b to central axis 1133. Therefore, gas conduit 1150a, 1150b may be positioned horizontally normal to central axis 1133 and, may be angled downwardly at an angle $+\beta$, or may be angled upwardly at an angle $-\beta$ to provide a gas flow towards the walls of gas dispersing channel 1128 rather than directly downward towards substrate 1110 which helps reduce the likelihood of blowing off reactants adsorbed on the surface of substrate 1110. In addition, the diameter of gas conduits 1150a, 1150b may be increasing from delivery lines 1143a, 1143b of valves 1142a, 1142b to gas inlet 1136a, 1136b to help reduce the velocity of the gas flow prior to its entry into gas dispersing channel 1128. For example, gas conduits 1150a, 1150b may contain an inner diameter which is gradually increasing or may contain a plurality of connected conduits having increasing inner diameters.

FIG. 11C depicts gas dispersing channel 1128 containing an inner diameter which decreases within converging channel 1134a from upper portion 1137, along central axis 1133, to throttle 1131. Also, gas dispersing channel 1128 contains an inner diameter which increases within diverging channel 1134b from throttle 1131, along central axis 1133, to lower portion 1135 adjacent lower surface 1160 of chamber lid assembly 1132. In one example, process chamber 1100 adapted to process 300 mm diameter substrates may have the following diameters. The diameter at upper portion 1137 of gas dispersing channel 1128 may be within a range from about 0.5 inches to about 2 inches, preferably, from about 0.75 inches to about 1.5 inches, and more preferably, from 0.8 inches to about 1.2 inches, for example, about 1 inch. The diameter at throttle 1131 of gas dispersing channel 1128 may be within a range from about 0.1 inches to about 1.5 inches, preferably, from about 0.3 inches to about 0.9 inches, and more preferably, from 0.5 inches to about 0.8 inches, for example, about 0.66 inches. The diameter at lower portion 1135 of gas dispersing channel 1128 may be within a range from about 0.5 inches to about 2 inches, preferably, from about 0.75 inches to about 1.5 inches, and more preferably, from 0.8 inches to about 1.2 inches, for example, about 1 inch.

In general, the above dimension apply to gas dispersing channel 1128 adapted to provide a total gas flow of between about 500 sccm and about 3,000 sccm. In other specific embodiments, the dimension may be altered to accommodate a certain gas flow therethrough. In general, a larger gas flow will require a larger diameter of gas dispersing channel 1128.

Not wishing to be bound by theory, it is believed that the diameter of gas dispersing channel 1128, which is gradually decreasing from upper portion 1137 of gas dispersing channel 1128 to throttle 1131 and increasing from throttle 1131 to lower portion 1135 of gas dispersing channel 1128, allows less of an adiabatic expansion of a gas through gas dispersing channel 1128 which helps to control the temperature of the process gas contained in circular flow gas 1174. For instance, a sudden adiabatic expansion of a gas delivered through gas inlet 1136a, 1136b into gas dispersing channel 1128 may result in a drop in the temperature of the gas which may cause condensation of the gas and formation of droplets. On the other hand, gas dispersing channel 1128 that gradually tapers is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 1132). Gas dispersing channel 1128 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

In one embodiment, gas inlets 1136a, 1136b are located adjacent upper portion 1137 of gas dispersing channel 1128. In other embodiments, one or more gas inlets 1136a, 1136b may be located along the length of gas dispersing channel 1128 between upper portion 1137 and lower portion 1135.

Each gas conduit 1150a, 1150b may be positioned at an angle $\alpha$ from the centerline of the gas conduit 1150a, 1150b and from a radius line of gas dispersing channel 1128, similarly as depicted in FIG. 11C of each gas conduits 1150a and 1150b that may be positioned at an angle $\alpha$ from center lines 1146a and 1146b of gas conduits 1150a and 1150b and from radius line from the center of gas dispersing channel 1128. Entry of a gas through gas conduit 1150a, 1150b preferably positioned at an angle $\alpha$ (i.e., when $\alpha>0°$) causes the gas to flow in a circular direction as shown by circular gas flow 1174 (FIGS. 11B-11C). Providing gas at an angle $\alpha$ as opposed to directly straight-on to the walls of the expanding channel (i.e., when $\alpha=0°$) helps to provide a more laminar flow through gas dispersing channel 1128 rather than a turbulent flow. It is believed that a laminar flow through gas dispersing channel 1128 results in an improved purging of the inner surface of gas dispersing channel 1128 and other surfaces of chamber lid assembly 1132. In comparison, a turbulent flow may not uniformly flow across the inner surface of gas dispersing channel 1128 and other surfaces and may contain dead spots or stagnant spots in which there is no gas flow. In one aspect, gas conduits 1150a, 1150b and corresponding gas inlets 1136a, 1136b are spaced out from each other and direct a flow in the same circular direction (i.e., clockwise or counterclockwise).

Not wishing to be bound by theory, FIG. 11C is a cross-sectional view of gas dispersing channel 1128 of chamber lid assembly 1132 showing simplified representations of gas flows therethrough. Although the exact flow pattern through the gas dispersing channel 1128 is not known, it is believed that circular gas flow 1174 (FIGS. 11B-11C) may travel through gas dispersing channel 1128 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. As shown in FIG. 11C, the circular flow may be provided in a "processing region" as opposed to in a compartment separated from substrate 1110. In one aspect, circular gas flow 1174 may help to establish a more efficient purge of gas dispersing channel 1128 due to the sweeping action of the vortex flow pattern across the inner surface of gas dispersing channel 1128.

In one embodiment, FIG. 11C depicts distance 1175 between gas inlets 1136a, 1136b and substrate 1110 long enough that circular gas flow 1174 dissipates to a downwardly flow as a spiral flow across the surface of substrate 1110 may not be desirable. It is believed that circular gas flow 1174 proceeds in a laminar manner efficiently purging the surface of chamber lid assembly 1132 and substrate 1110. In one specific embodiment, the length of distance 1175 between upper portion 1137 of gas dispersing channel 1128 and substrate 1110 may be within a range from about 3 inches to about 8 inches, preferably, from about 3.5 inches to about 7 inches, and more preferably, from about 4 inches to about 6 inches, such as about 5 inches.

Distance 1177a as the length of converging channel 1134a along central axis 1133 within lid cap 1172 between upper portion 1137 of gas dispersing channel 1128 and throttle 1131 and distance 1177b as the length of diverging channel 1134b along central axis 1133 within lid cap 1172 between throttle 1131 and lower surface 1173 of lid cap 1172. In one example, distance 1177a may have a length within a range from about 1 inch to about 4 inches, preferably, from about 1.25 inches to about 3 inches, and more preferably, from 1.5 inches to about 2.5 inches, for example, about 2 inches and distance 1177b may have a length within a range from about 0.5 inches to about 4 inches, preferably, from about 1 inch to about 3 inches, and more preferably, from 1.25 inches to about 1.75 inches, for example, about 1.5 inches.

FIG. 11A depicts that at least a portion of lower surface 1160 of chamber lid assembly 1132 may be tapered from gas dispersing channel 1128 to a peripheral portion of chamber lid assembly 1132 to help provide an improved velocity profile of a gas flow from gas dispersing channel 1128 across the surface of substrate 1110 (i.e., from the center of the substrate to the edge of the substrate). Lower surface 1160 may contain one or more tapered surfaces, such as a straight surface, a concave surface, a convex surface, or combinations thereof. In one embodiment, lower surface 1160 is tapered in the shape of a funnel.

In one example, lower surface 1160 is downwardly sloping to help reduce the variation in the velocity of the process gases traveling between lower surface 1160 of chamber lid assembly 1132 and substrate 1110 while assisting to provide uniform exposure of the surface of substrate 1110 to a reactant gas. In one embodiment, the ratio of the maximum area of the flow section over the minimum area of the flow section between a downwardly sloping lower surface 1160 of chamber lid assembly 1132 and the surface of substrate 1110 is less than about 2, preferably, less than about 1.5, more preferably, less than about 1.3, and more preferably, about 1.

Not wishing to be bound by theory, it is believed that a gas flow traveling at a more uniform velocity across the surface of substrate 1110 helps provide a more uniform deposition of the gas on substrate 1110. It is believed that the velocity of the gas is directly proportional to the concentration of the gas which is in turn directly proportional to the deposition rate of the gas on substrate 1110 surface. Thus, a higher velocity of a gas at a first area of the surface of substrate 1110 versus a second area of the surface of substrate 1110 is believed to provide a higher deposition of the gas on the first area. It is believed that chamber lid assembly 1132 having lower surface 1160, downwardly sloping, provides for more uniform deposition of the gas across the surface of substrate 1110 because lower surface 1160 provides a more uniform velocity and, thus, a more uniform concentration of the gas across the surface of substrate 1110.

FIG. 11A depicts choke 1162 located at a peripheral portion of chamber lid assembly 1132 adjacent the periphery of substrate 1110. Choke 1162, when chamber lid assembly 1132 is assembled to form a processing zone around substrate 1110, contains any member restricting the flow of gas therethrough at an area adjacent the periphery of substrate 1110.

In one specific embodiment, the spacing between choke 1162 and substrate support 1112 is between about 0.04 inches and about 2.0 inches, and preferably between 0.04 inches and about 0.2 inches. The spacing may vary depending on the gases being delivered and the process conditions during deposition. Choke 1162 helps provide a more uniform pressure distribution within the volume or reaction zone 1164 defined between chamber lid assembly 1132 and substrate 1110 by isolating reaction zone 1164 from the non-uniform pressure distribution of pumping zone 1166 (FIG. 11A).

Referring to FIG. 11A, in one aspect, since reaction zone 1164 is isolated from pumping zone 1166, a reactant gas or purge gas needs only adequately fill reaction zone 1164 to ensure sufficient exposure of substrate 1110 to the reactant gas or purge gas. In conventional chemical vapor deposition, prior art chambers are required to provide a combined flow of reactants simultaneously and uniformly to the entire surface of the substrate in order to ensure that the co-reaction of the reactants occurs uniformly across the surface of substrate 1110. In atomic layer deposition, process chamber 1100 sequentially introduces reactants to the surface of substrate 1110 to provide absorption of alternating thin layers of the reactants onto the surface of substrate 1110. As a consequence, atomic layer deposition does not require a flow of a reactant which reaches the surface of substrate 1110 simultaneously. Instead, a flow of a reactant needs to be provided in an amount which is sufficient to adsorb a thin layer of the reactant on the surface of substrate 1110.

Since reaction zone 1164 may contain a smaller volume when compared to the inner volume of a conventional CVD chamber, a smaller amount of gas is required to fill reaction zone 1164 for a particular process in an atomic layer deposition sequence. For example, in one embodiment, the volume of reaction zone 1164 is about 1,000 cm$^3$ or less, preferably 500 cm$^3$ or less, and more preferably 200 cm$^3$ or less for a chamber adapted to process 200 mm diameter substrates. In one embodiment, the volume of reaction zone 1164 is about 3,000 cm$^3$ or less, preferably 1,500 cm$^3$ or less, and more preferably 600 cm$^3$ or less for a chamber adapted to process 300 mm diameter substrates. In one embodiment, substrate support 1112 may be raised or lowered to adjust the volume of reaction zone 1164 for deposition. Because of the smaller volume of reaction zone 1164, less gas, whether a deposition gas or a purge gas, is necessary to be flowed into process chamber 1100. Therefore, the throughput of process chamber 1100 is greater and the waste may be minimized due to the smaller amount of gas used reducing the cost of operation.

Chamber lid assembly 1132 contains lid cap 1172 and lid plate 1170 in which lid cap 1172 and lid plate 1170 form gas dispersing channel 1128, as depicted in FIGS. 11A-11C. An additional plate may be optionally disposed between lid plate 1170 and lid cap 1172. In other embodiments, gas dispersing channel 1128 may be made integrally from a single piece of material.

Chamber lid assembly 1132 may include cooling elements and/or heating elements depending on the particular gas being delivered therethrough. Controlling the temperature of chamber lid assembly 1132 may be used to prevent gas decomposition, deposition, or condensation on chamber lid assembly 1132. For example, water channels (such as coolant channel 1090 in FIG. 10A) may be formed in chamber lid assembly 1132 to cool chamber lid assembly 1132. In another example, heating elements (not shown) may be embedded or may surround components of chamber lid assembly 1132 to heat chamber lid assembly 1132. In one embodiment, components of chamber lid assembly 1132 may be individually heated or cooled. For example, referring to FIG. 11A, chamber lid assembly 1132 may contain lid plate 1170 and lid cap 1172 in which lid plate 1170 and lid cap 1172 form gas dispersing channel 1128. Lid cap 1172 may be maintained at one temperature range and lid plate 1170 may be maintained at another temperature range. For example, lid cap 1172 may be heated by being wrapped in heater tape or by using another heating device to prevent condensation of reactant gases and lid plate 1170 may be maintained at ambient temperature. In another example, lid cap 1172 may be heated and lid plate 1170 may be cooled with water channels formed therethrough to prevent thermal decomposition of reactant gases on lid plate 1170.

The components and parts of chamber lid assembly 1132 may contain materials such as stainless steel, aluminum, nickel-plated aluminum, nickel, alloys thereof, or other suitable materials. In one embodiment, lid cap 1172 and lid plate 1170 may be independently fabricated, machined, forged, or otherwise made from a metal, such as aluminum, an aluminum alloy, steel, stainless steel, alloys thereof, or combinations thereof.

In one embodiment, the inner surfaces of gas dispersing channel 1128 (including both inner surfaces of lid plate 1170 and lid cap 1172) and lower surface 1160 of chamber lid assembly 1132 may contain a mirror polished surface to help produce a laminar flow of a gas along gas dispersing channel 1128 and lower surface 1160 of chamber lid assembly 1132. In another embodiment, the inner surface of gas conduits 1150a, 1150b may be electropolished to help produce a laminar flow of a gas therethrough.

In an alternative embodiment, the inner surfaces of gas dispersing channel 1128 (including both inner surfaces of lid plate 1170 and lid cap 1172) and lower surface 1160 of chamber lid assembly 1132 may contain a roughened surface or machined surfaces to produce more surface area across the surfaces. Roughened surfaces provide better adhesion of undesired accumulated materials on the inner surfaces of lid plate 1170 and lid cap 1172 and lower surface 1160. The undesired films are usually formed as a consequence of conducting a vapor deposition process and may peel or flake from lower surface 1160 and the inner surfaces of gas dispersing channel 1128 to contaminate substrate 1110. In one example, the mean roughness ($R_a$) of lower surface 1160 and/or the inner surfaces of gas dispersing channel 1128 may be at least about 10 µin, such as within a range from about 10 µin (about 0.254 µm) to about 200 µin (about 5.08 µm), preferably, from about 20 µin (about 0.508 µm) to about 100 µin (about 2.54 µm), and more preferably, from about 30 µin (about 0.762 µm) to about 80 µin (about 2.032 µm). In another example, the mean roughness of lower surface 1160 and/or the inner surfaces of gas dispersing channel 1128 may be at least about 100 µin (about 2.54 µm), preferably, within a range from about 200 µin (about 5.08 µm) to about 500 µin (about 12.7 µm).

FIG. 11A depicts control unit 1180, such as a programmed personal computer, work station computer, or the like, coupled to process chamber 1100 to control processing conditions. For example, control unit 1180 may be configured to control flow of various process gases and purge gases from gas sources 1138, 1143, and 1140 through valves 1142a and 1142b during different stages of a substrate process sequence. Illustratively, control unit 1180 contains central processing unit (CPU) 1182, support circuitry 1184, and memory 1186 containing associated control software 1183.

Control unit 1180 may be one of any form of general purpose computer processor that can be used in an industrial setting for controlling various chambers and sub-processors. CPU 1182 may use any suitable memory 1186, such as random access memory, read only memory, floppy disk drive, hard disk, or any other form of digital storage, local or remote. Various support circuits may be coupled to CPU 1182 for supporting process chamber 1100. Control unit 1180 may be coupled to another controller that is located adjacent individual chamber components, such as programmable logic controllers 1148a, 1148b of valves 1142a, 1142b. Bi-directional communications between the control unit 1180 and various other components of process chamber 1100 are handled through numerous signal cables collectively referred to as signal buses 1188, some of which are illustrated in FIG. 11A. In addition to control of process gases and purge gases from gas sources 1138, 1143, 1140 and from programmable logic controllers 1148a, 1148b of valves 1142a, 1142b, control unit 1180 may be configured to be responsible for automated control of other activities used in wafer processing—such as wafer transport, temperature control, chamber evacuation, among other activities, some of which are described elsewhere herein.

Referring to FIGS. 11A-11C, in operation, substrate 1110 is delivered to process chamber 1100 through slit valve 1108 by a robot (not shown). Substrate 1110 is positioned on substrate support 1112 through cooperation of lift pins 1120 and the robot. Substrate support 1112 raises substrate 1110 into close opposition to lower surface 1160 of chamber lid assembly 1132. A first gas flow may be injected into gas dispersing channel 1128 of process chamber 1100 by valve 1142a together or separately (i.e., pulses) with a second gas flow injected into process chamber 1100 by valve 1142b. The first gas flow may contain a continuous flow of a purge gas from purge gas source 1140 and pulses of a reactant gas from reactant gas source 1138 or may contain pulses of a reactant gas from reactant gas source 1138 and pulses of a purge gas from purge gas source 1140. The second gas flow may contain a continuous flow of a purge gas from purge gas source 1140 and pulses of a reactant gas from reactant gas source 1139 or may contain pulses of a reactant gas from reactant gas source 1139 and pulses of a purge gas from purge gas source 1140. Circular gas flow 1174 travels through gas dispersing channel 1128 as a vortex flow which provides a sweeping action across the inner surface of gas dispersing channel 1128. Circular gas flow 1174 dissipates to a downwardly flow towards the surface of substrate 1110. The velocity of the gas flow reduces as it travels through gas dispersing channel 1128. The gas flow then travels across the surface of substrate 1110 and across lower surface 1160 of chamber lid assembly 1132. Lower surface 1160 of chamber lid assembly 1132, which is downwardly sloping, helps reduce the variation of the velocity of the gas flow across the surface of substrate 1110. The gas flow then travels by choke 1162 and into pumping zone 1166 of process chamber 1100. Excess gas, by-products, etc. flow into the pumping channel 1179 and are then exhausted from process chamber 1100 by vacuum system 1178. In one aspect, the gas flow proceeds through gas dispersing channel 1128 and between the surface of substrate 1110 and lower surface 1160 of chamber lid assembly 1132 in a laminar manner which aids in uniform exposure of a reactant gas to the surface of substrate 1110 and efficient purging of inner surfaces of chamber lid assembly 1132.

Process chamber 1100, as illustrated in FIGS. 11A-11C, has been described herein as having a combination of features. In one aspect, process chamber 1100 provides reaction zone 1164 containing a small volume in compared to a conventional CVD chamber. Process chamber 1100 requires a smaller amount of a gas, such as a reactant gas or a purge gas, to fill reaction zone 1164 for a particular process. In another aspect, process chamber 1100 provides chamber lid assembly 1132 having a downwardly sloping or funnel shaped lower surface 1160 to reduce the variation in the velocity profile of a gas flow traveling between the bottom surface of chamber lid assembly 1132 and substrate 1110. In still another aspect, process chamber 1100 provides gas dispersing channel 1128 to reduce the velocity of a gas flow introduced therethrough. In still another aspect, process chamber 1100 provides gas conduits at an angle α from the center of gas dispersing channel 1128. Process chamber 1100 provides other features as described elsewhere herein. Other embodiments of a chamber adapted for atomic layer deposition incorporate one or more of these features.

Multiple Injection Lid Assembly

Figure 12A:
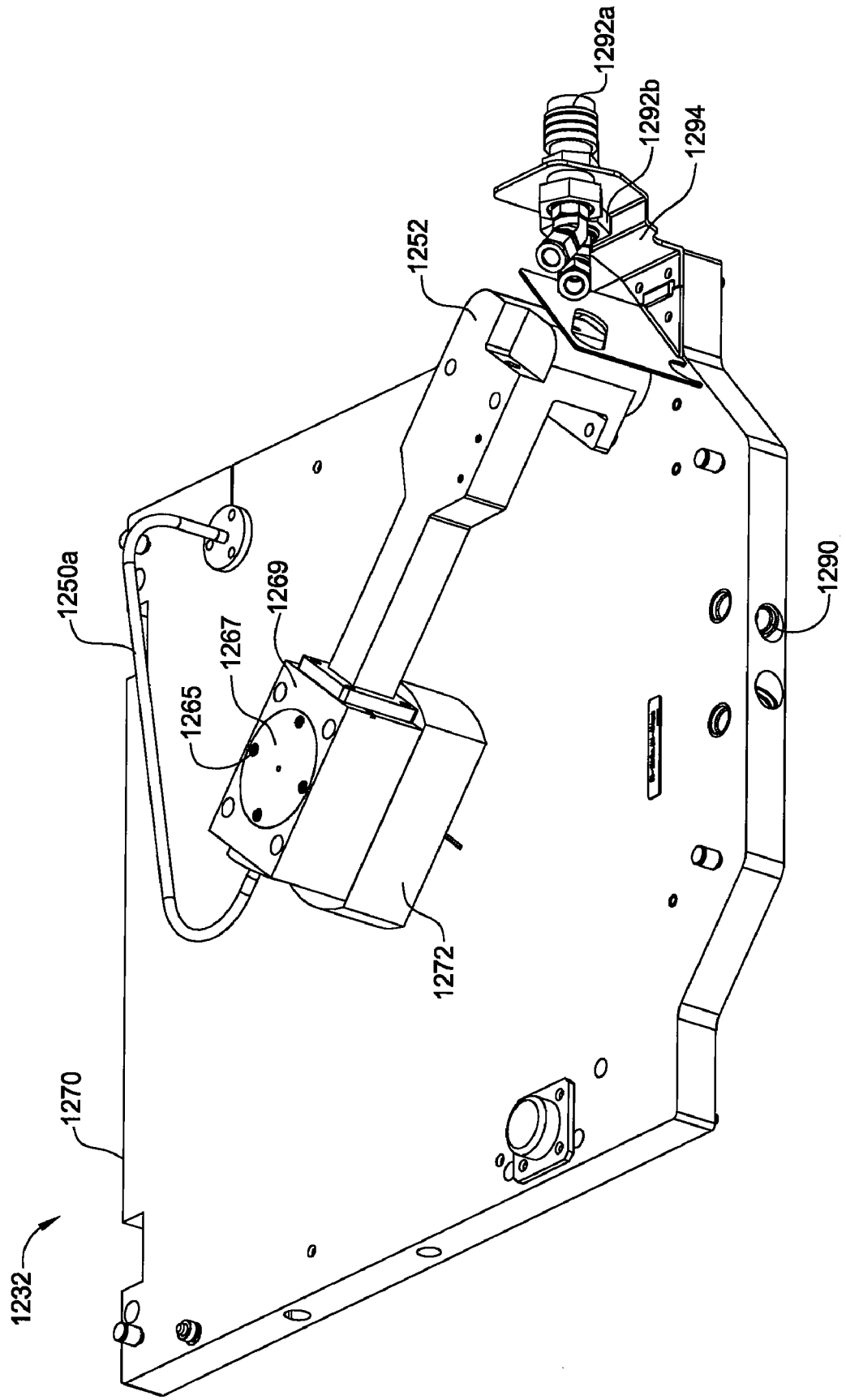
FIGS. 12A-12E depict schematic views of a process chamber lid assembly adapted for atomic layer deposition as described in another embodiment herein.
Figure 12B:
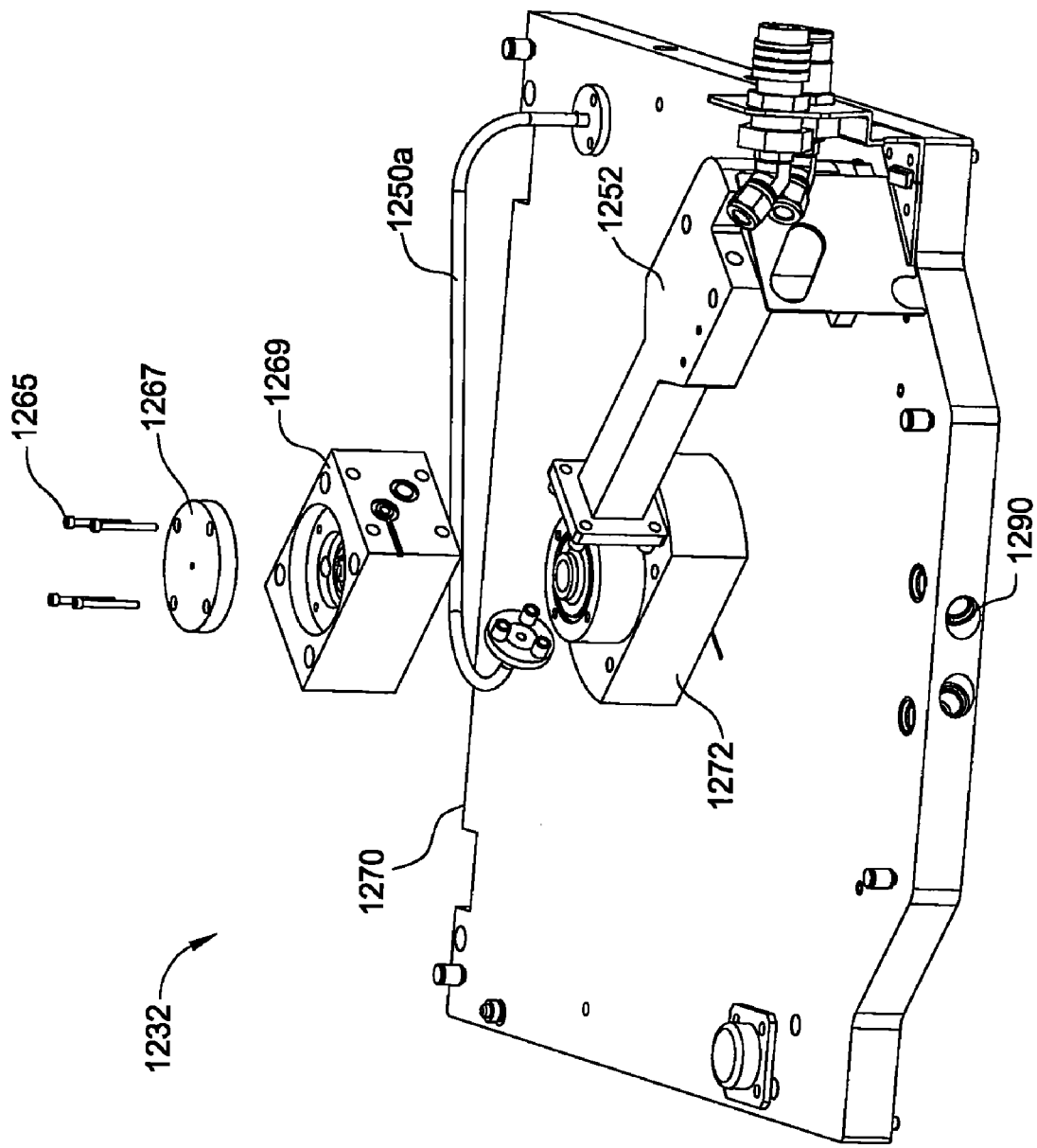

FIGS. 12A-12E, 13A-13C, and 14A-14C depict schematic views of chamber lid assembly 1232 used as a multiple injection lid assembly and adapted for ALD processes as described in another embodiment herein. Chamber lid assembly 1232 contains lid cap 1272 positioned in a centralized portion of lid plate 1270, as illustrated in FIG. 12A. Gas conduit 1250a is coupled to and in fluid communication with lid cap 1272 on one end, while the other end of gas conduit 1250a extends through lid plate 1270 and may be coupled to and in fluid communication with an ALD valve and/or a chemical precursor source or gas source. Alternatively, the end of gas conduit 1250a extending through lid plate 1270 and may be coupled to and in fluid communication with a chemical precursor source or gas source, while an ALD valve is therebetween, such as above lid plate 1270 (not shown). Gas conduit 1250a may be coupled to and in fluid communication with gas passageway 1268a, which provides the precursor gas to pass through multi-injector base 1269. Gas passageway 1268a may be coupled to and in fluid communication with gas annulet 1264a, which is in fluid communication with gas dispersing channel 1228 through slots 1266a (FIGS. 12E, 13C, and 14A-14C).

Figure 12C:
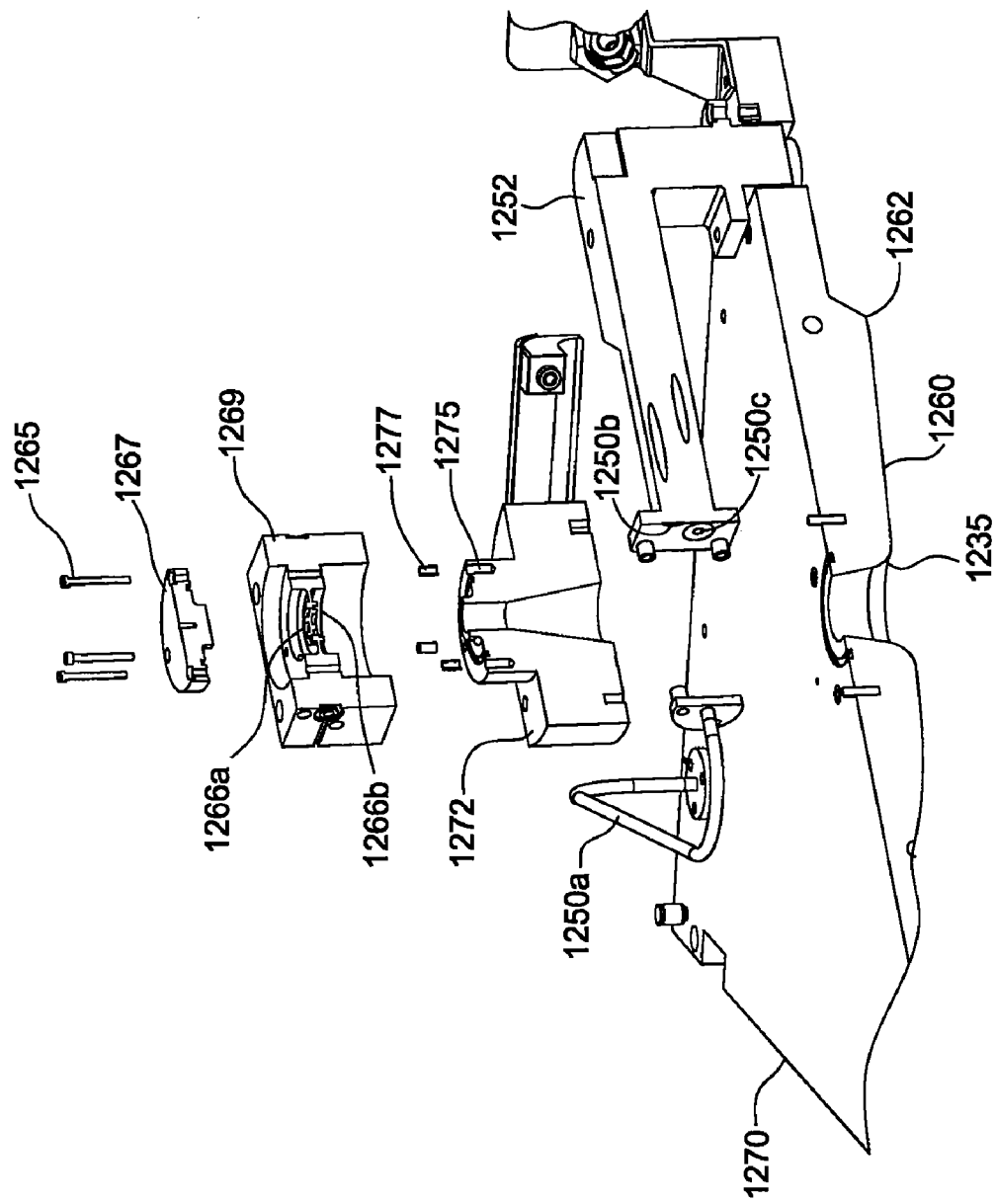
Figure 14A:
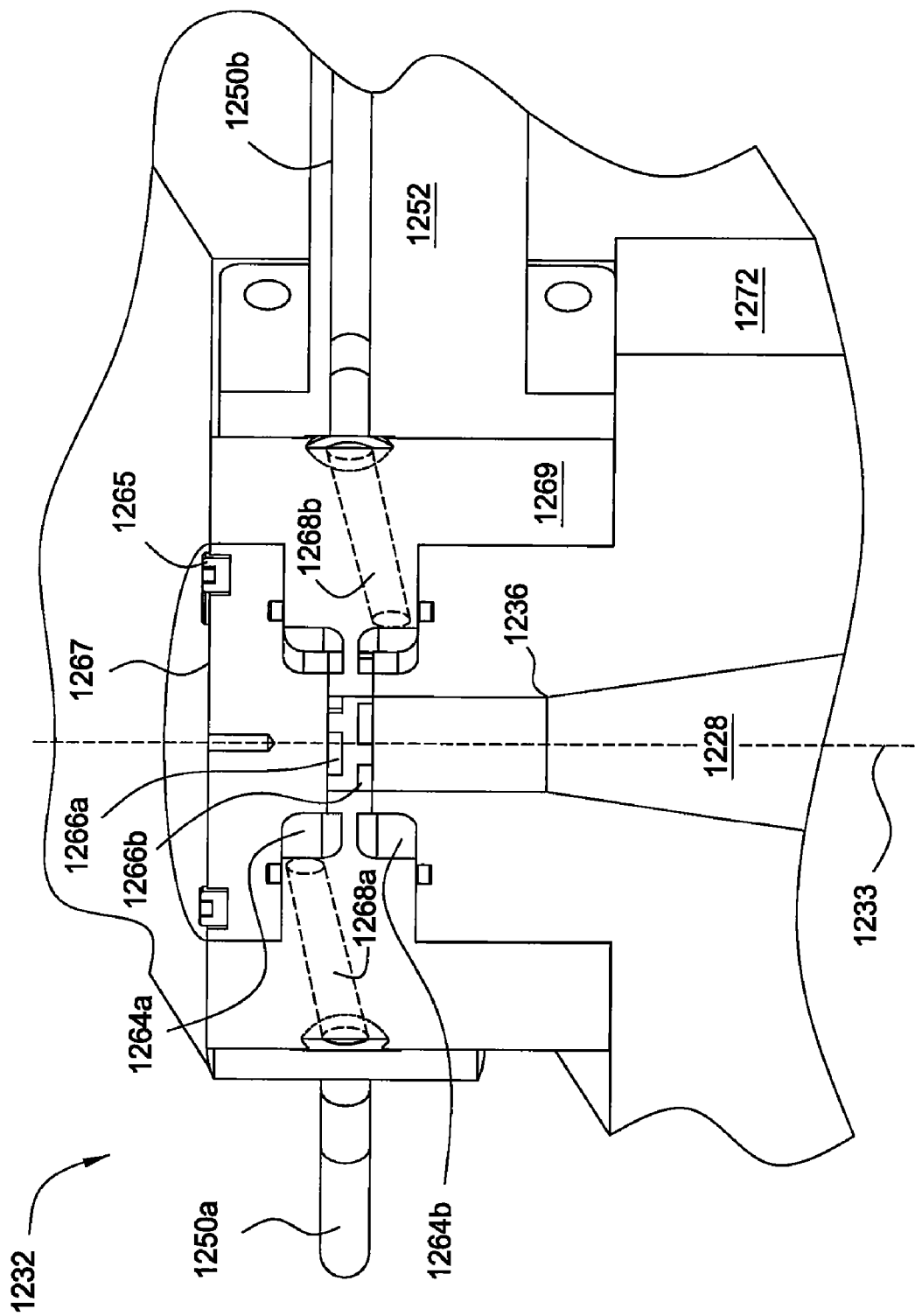
FIGS. 14A-14C depict a schematic view of a gas injection assembly and a gas flow pattern within the process chamber lid assembly of FIGS. 12A-13C as described in embodiments herein.
Figure 14B:
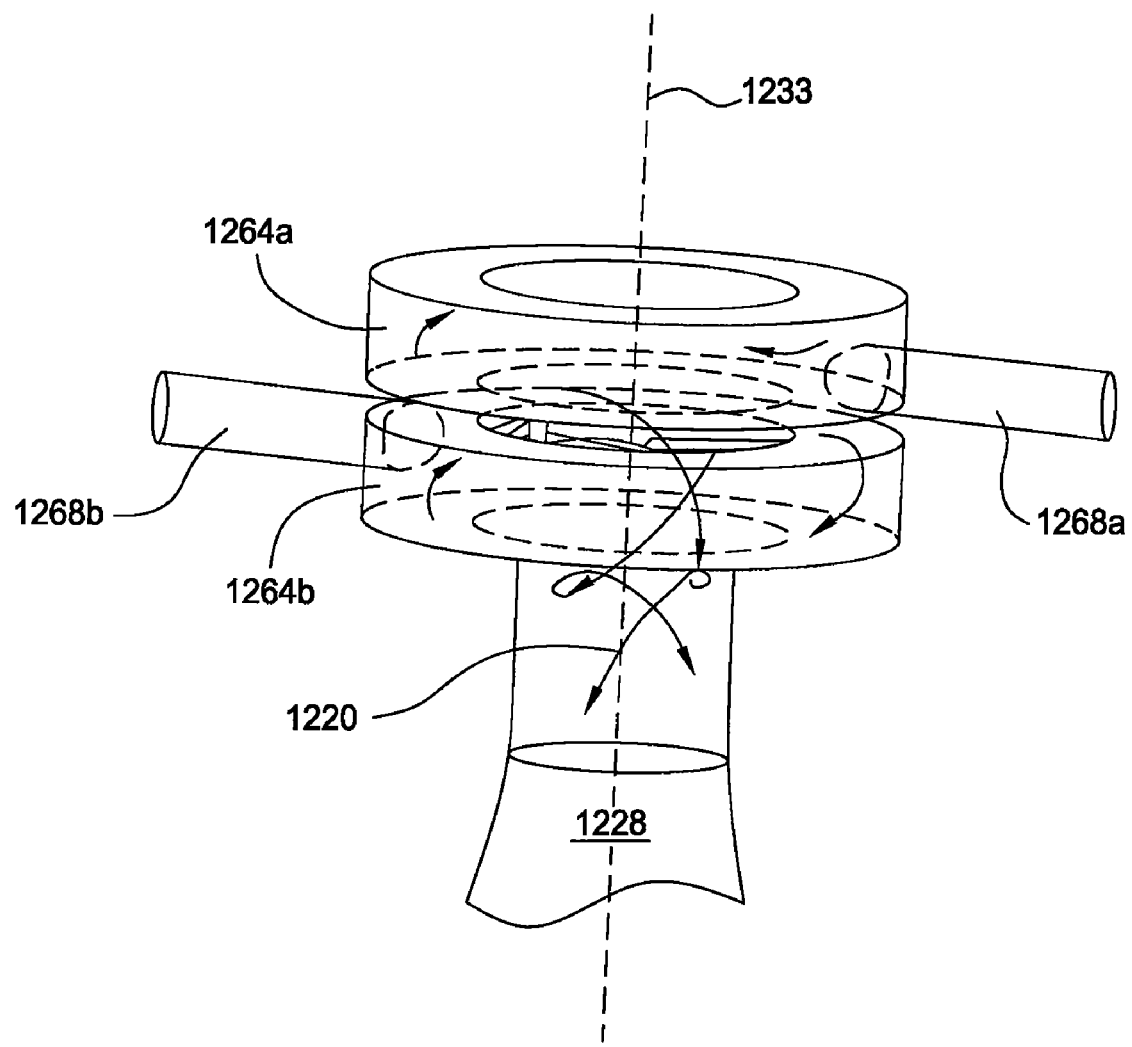
Figure 14C:
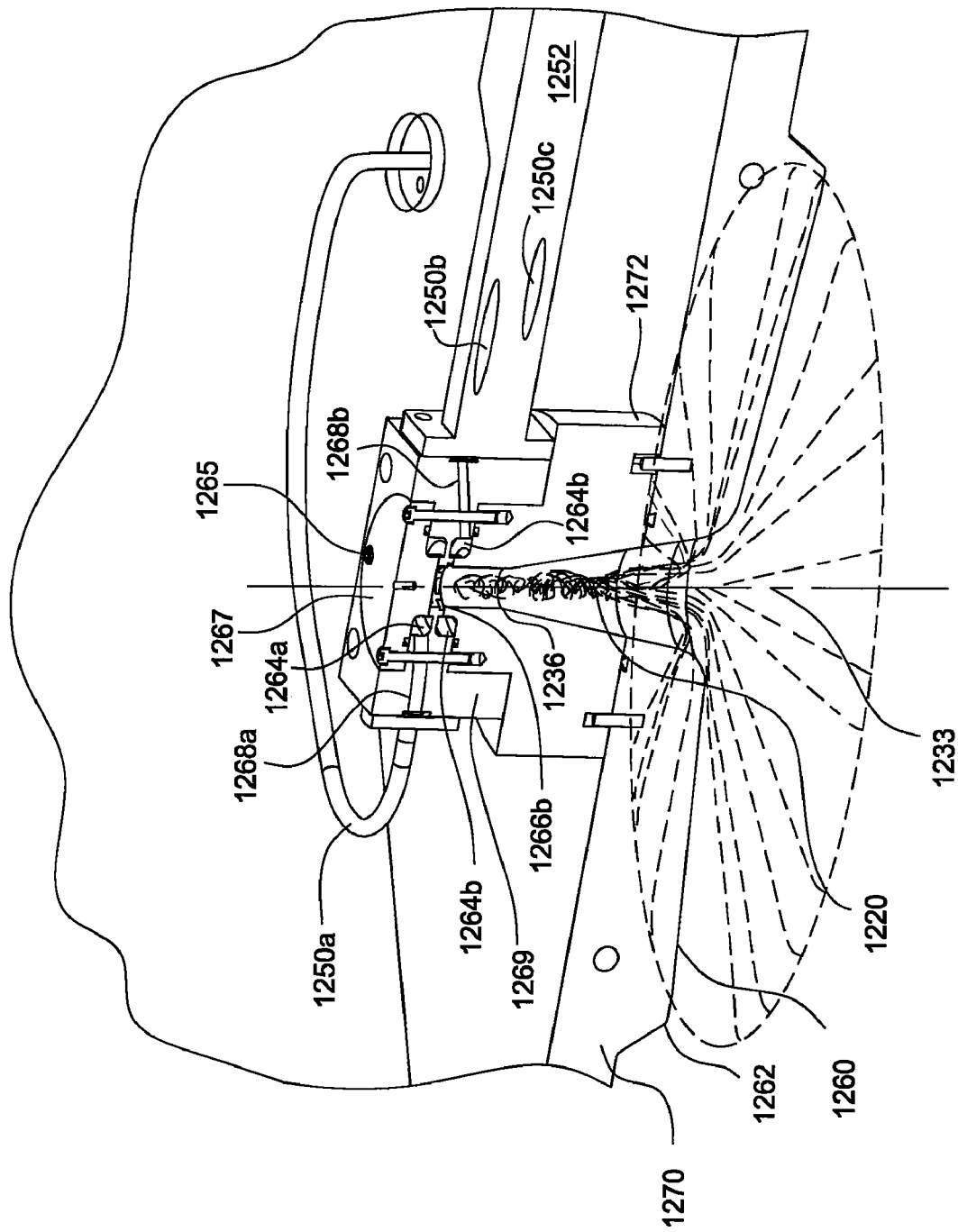

Gas conduit cover 1252 contains at least one gas conduit, or may contain two, three, or more gas conduits. FIG. 12C depicts gas conduit cover 1252 containing gas conduits 1250b and 1250c. In one embodiment, gas conduit 1250b may be coupled to and in fluid communication with lid cap 1272 on one end, while the other end of gas conduit 1250b extends through lid plate 1270 and may be coupled to and in fluid communication with an ALD valve and/or a chemical precursor source or gas source. Alternatively, the end of gas conduit 1250b extending through lid plate 1270 and may be coupled to and in fluid communication with a chemical precursor source or gas source, while an ALD valve is therebetween, such as above lid plate 1270 (not shown). In one example, gas conduit 1250b or 1250c, independently or together, may be coupled to and in fluid communication with gas passageway 1268b. Gas conduit 1250b may be coupled to and in fluid communication with gas passageway 1268b, which provides the precursor gas to pass through multi-injector base 1269. Gas passageway 1268b may be coupled to and in fluid communication with gas annulet 1264b, which is in fluid communication with gas dispersing channel 1228 through slots 1266b (FIGS. 14A-14C).

Conduit 1250c is an optional conduit in some embodiments. Gas conduit 1250c may be coupled to and in fluid communication with lid cap 1272 on one end, while the other end of gas conduit 1250c extends through lid plate 1270 and may be coupled to and in fluid communication with an ALD valve and/or gas source, such as a carrier gas source, a purge gas source, a plasma gas, or a chemical precursor source. In another embodiment, conduit 1250c is may be coupled to and in fluid communication with the top surface of lid cap 1272. In another embodiment, conduit 1250c may be combined with conduit 1250b, such as with a Y-joint, and may be coupled to and in fluid communication with gas passageway 1268b.

FIGS. 12A-12E, 13A-13C, and 14A-14C depict chamber lid assembly 1232 containing multi-injector base 1269 positioned above lid cap 1272 and lid plate 1270. Multi-injector base 1269, lid cap 1272, and lid plate 1270 form gas dispersing channel 1228. Multi-injector base 1269 forms upper portion 1237 of gas dispersing channel 1228, while lid plate 1270 forms lower portion 1235 of gas dispersing channel 1228. An additional plate may be optionally disposed between lid plate 1270 and lid cap 1272. In other embodiments, gas dispersing channel 1228 may be made integrally from a single piece of material.

Figure 12E:
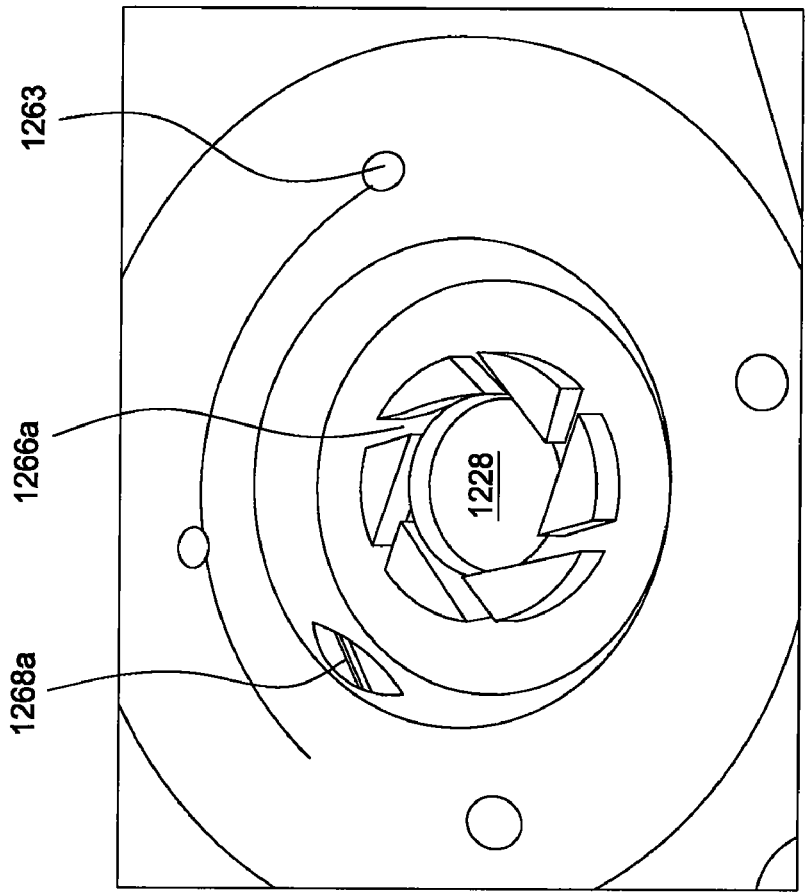
Figure 12D:
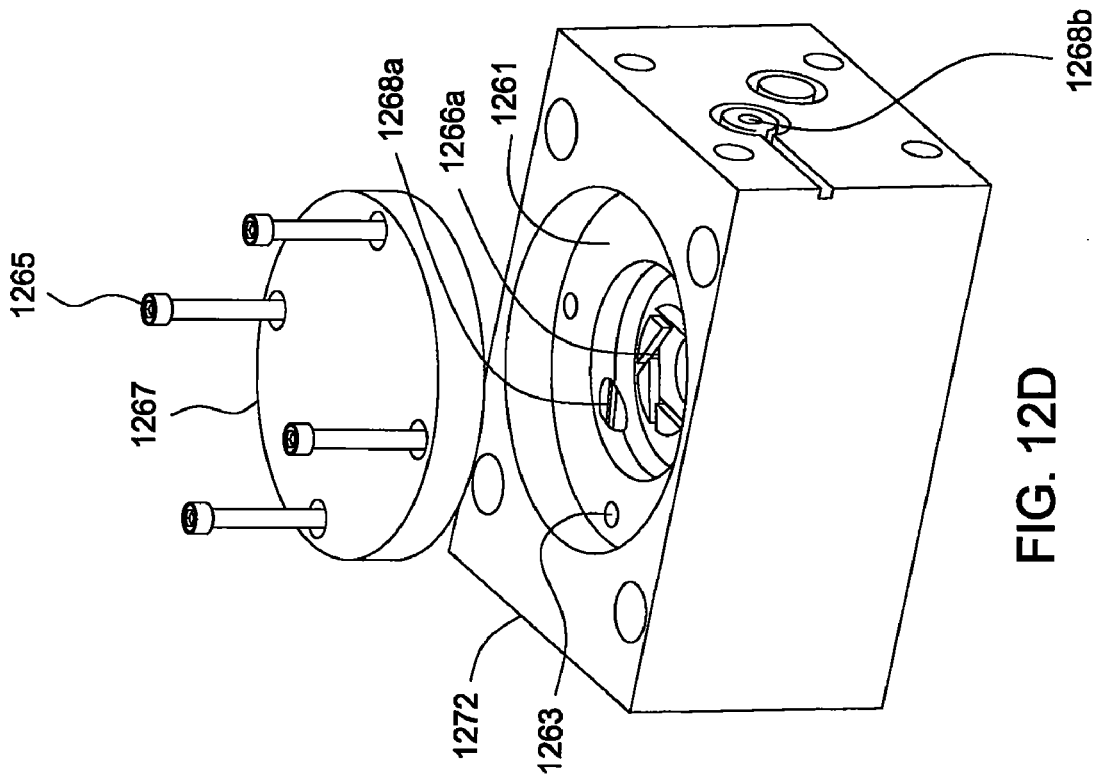

FIGS. 12D-12E illustrate gas passageways 1268a and 1268b passing through multi-injector base 1269. Multi-injector cap 1267 may be positioned on ledge 1261 of multi-injector base 1269 to form gas annulet 1264a therebetween. Similarly, multi-injector base 1269 may be positioned on lid cap 1272 to form gas annulet 1264b therebetween. Pins 1265 may be passed through holes 1263 of multi-injector cap 1267 and into grooves 1275 of multi-injector base to secure these parts together. Similarly, pins 1277 within grooves 1275 connect multi-injector base 1269 and lid cap 1272 (FIG. 12C), as well as pins 1276 within grooves 1274 connect lid plate 1270 and lid cap 1272 (FIG. 13C). During a deposition process, a first process gas may travel from gas passageway 1268a, around gas annulet 1264a, through slots 1266a, and into gas dispersing channel 1228. Similarly, a second process gas may travel from gas passageway 1268b, around gas annulet 1264b, through slots 1266b, and into gas dispersing channel 1228.

Slots 1266a and 1266b provide fluid communication from gas annulets 1264a and 1264b to gas dispersing channel 1228. Slots 1266a and 1266b may be positioned at an angle relative to central axis 1233, such as about tangential to central axis 1233 or gas dispersing channel 1228. In one embodiment, slots 1266a and 1266b are positioned at an angle tangential to gas dispersing channel 1228, such as within a range from about 0° to about 90°, preferably, from about 0° to about 45°, and more preferably, from about 0° to about 20°.

Chamber lid assembly 1232 may include cooling elements and/or heating elements depending on the particular gas being delivered therethrough. Controlling the temperature of chamber lid assembly 1232 may be used to prevent gas decomposition, deposition, or condensation on chamber lid assembly 1232. For example, coolant channel 1290 may be formed in chamber lid assembly 1232 to cool chamber lid assembly 1232. In another example, heating elements (not shown) may be embedded or may surround components of chamber lid assembly 1232 to heat chamber lid assembly 1232. In one embodiment, components of chamber lid assembly 1232 may be individually heated or cooled during a process. For example, referring to FIG. 13C, chamber lid assembly 1232 may contain multi-injector plate 1269, lid plate 1270, and lid cap 1272, which form gas dispersing channel 1228. Multi-injector plate 1269 and lid cap 1272 may be maintained at one temperature and lid plate 1270 may be maintained at another temperature. For example, multi-injector plate 1269 and lid cap 1272 may be heated by being wrapped in heater tape or by using another heating device to prevent condensation of reactant gases and lid plate 1270 may be maintained at ambient temperature. In another example, multi-injector plate 1269 and lid cap 1272 may be heated and lid plate 1270 may be cooled with water channels formed therethrough to prevent thermal decomposition of reactant gases on lid plate 1270. In another example, multi-injector plate 1269 and lid cap 1272 may be heated to one temperature by heater tape or other heating device and lid plate 1270 may be individually heated to a temperature less than, equal to, or greater than the temperature of multi-injector plate 1269 and lid cap 1272.

Chamber lid assembly 1232 contains components that may be made of stainless steel, aluminum, nickel-plated aluminum, nickel, or other suitable materials compatible with the processing to be performed. In one embodiment, multi-injector base 1269, lid cap 1272, and lid plate 1270 may be independently fabricated, machined, forged, or otherwise made from a metal, such as aluminum, an aluminum alloy, steel, stainless steel, alloys thereof, or combinations thereof. In one embodiment, the optional additional plate disposed therebetween contains stainless steel.

In one embodiment, inner surface 1231 of gas dispersing channel 1228 (including both inner surfaces of lid plate 1270 and lid cap 1272) and lower surface 1260 of chamber lid assembly 1232 may contain a mirror polished surface to help produce a laminar flow of a gas along gas dispersing channel 1228 and lower surface 1260 of chamber lid assembly 1232.

In an alternative embodiment, inner surface 1231 of gas dispersing channel 1228 (including both inner surfaces of lid plate 1270 and lid cap 1272) and lower surface 1260 of chamber lid assembly 1232 may contain a roughened surface or machined surfaces to produce more surface area across the surfaces. Roughened surfaces provide better adhesion of undesired accumulated materials on inner surface 1231 and lower surface 1260. The undesired films are usually formed as a consequence of conducting a vapor deposition process and may peel or flake from inner surface 1231 and lower surface 1260 to contaminate substrate 1210. In one example, the mean roughness ($R_a$) of lower surface 1260 and/or inner surface 1231 may be at least about 10 µin, such as within a range from about 10 µin (about 0.254 µm) to about 200 µin (about 5.08 µm), preferably, from about 20 µin (about 0.508 µm) to about 100 µin (about 2.54 µm), and more preferably, from about 30 µin (about 0.762 µm) to about 80 µin (about 2.032 µm). In another example, the mean roughness of lower surface 1260 and/or inner surface 1231 may be at least about 100 µin (about 2.54 µm), preferably, within a range from about 200 µin (about 5.08 µm) to about 500 µin (about 12.7 µm).

FIGS. 13A and 14A-14C depict a cross-sectional view of chamber lid assembly 1232 containing gas dispersing channel 1228 extending through a central portion of lid plate 1270. Gas annulets 1264a and 1264b annularly extend around gas dispersing channel 1228 and central axis 1233. Gas dispersing channel 1228 is usually positioned to extend perpendicular to a substrate that is positioned below chamber lid assembly 1232 during an ALD process. Gas dispersing channel 1228 extends along central axis 1233 of lid cap 1272, through lid plate 1270, and to lower surface 1260. Gas dispersing channel 1228 further extends pass lower surface 1260 and into reaction zone 1064. Lower surface 1260 extends from gas dispersing channel 1228 to choke 1262. Lower surface 1260 is sized and shaped to substantially cover the substrate that is positioned below chamber lid assembly 1232 during the ALD process.

FIGS. 13A and 14A-14C depict chamber lid assembly 1232 configured to expose a substrate to at least two gas sources or chemical precursors. In other examples, chamber lid assembly 1232 may be reconfigured to expose a substrate to a single gas source (as depicted in FIG. 5) or to three or more gas sources or chemical precursors (as depicted in FIG. 6).

Processes gases, as circular gas flow 1220 depicted in FIGS. 14B-14C, are forced to make more revolutions around central axis 1233 of gas dispersing channel 1228 while passing through point 1236, than in similarly configured process chamber in the absence of point 1236. Circular gas flow 1220 may contain a flow pattern, such as a vortex pattern, a helix pattern, a spiral pattern, a twirl pattern, a twist pattern, a coil pattern, a whirlpool pattern, or derivatives thereof. Circular gas flow 1220 may extend at least about 1 revolution around central axis 1233 of gas dispersing channel 1228, preferably, at least about 1.5 revolutions, more preferably, at least about 2 revolutions, more preferably, at least about 3 revolutions, and more preferably, about 4 revolutions or more.

FIGS. 13C and 14C depict gas dispersing channel 1228 containing an inner diameter which stays substantially constant from upper portion 1237, along central axis 1233, to point 1236, in one embodiment. In an alternative embodiment, gas dispersing channel 1228 containing an inner diameter which stays increases or decreases from upper portion 1237, along central axis 1233, to point 1236 (not shown). However, gas dispersing channel 1228 contains an inner diameter which increases from point 1236, along central axis 1233, to lower portion 1235 adjacent lower surface 1260 of chamber lid assembly 1232.

In one example, chamber lid assembly 1232 adapted to process 300 mm diameter substrates may have the following diameters. The diameter at upper portion 1237 of gas dispersing channel 1228 may be within a range from about 0.5 inches to about 2 inches, preferably, from about 0.75 inches to about 1.5 inches, and more preferably, from 0.8 inches to about 1.2 inches, for example, about 1 inch. The diameter at point 1236 of gas dispersing channel 1228 may be within a range from about 0.5 inches to about 2 inches, preferably, from about 0.75 inches to about 1.5 inches, and more preferably, from 0.8 inches to about 1.2 inches, for example, about 1 inch. The diameter at lower portion 1235 of gas dispersing channel 1228 may be within a range from about 1 inch to about 4 inches, preferably, from about 1.5 inches to about 3 inches, and more preferably, from 1.6 inches to about 2.4 inches, for example, about 2 inches. In one embodiment, the above dimensions apply to gas dispersing channel 1228 adapted to provide a gas flow within a range from about 500 sccm and about 3,000 sccm. In other embodiments, the dimensions of gas dispersing channel 1228 may be altered to accommodate a certain gas flow therethrough.

Gas dispersing channel 1228 that gradually tapers is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 1232). Gas dispersing channel 1228 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

In one embodiment, gas annulets 1264a and 1264b circumvents upper portion 1237 of gas dispersing channel 1228, as depicted in FIG. 14A-14C. In other embodiments, one or more gas annulets 1264a and 1264b may be located different positions along the length of gas dispersing channel 1228 between upper portion 1237 and lower portion 1235.

Not wishing to be bound by theory, FIGS. 14B-14C illustrate different views of gas dispersing channel 1228 of chamber lid assembly 1232 showing simplified representations of gas flows therethrough. Although the exact flow pattern through the gas dispersing channel 1228 is not known, it is believed that circular gas flow 1220 may travel from slots 1266a and 1266b through gas dispersing channel 1228 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. The circular flow may be provided in a "processing region" as opposed to in a compartment separated from a substrate. In one aspect, circular gas flow 1220 may help to establish a more efficient purge of gas dispersing channel 1228 due to the sweeping action of the vortex flow pattern across the inner surface of gas dispersing channel 1228.

FIGS. 12C, 13B-13C, and 14C depict that at least a portion of lower surface 1260 of chamber lid assembly 1232 may be tapered from gas dispersing channel 1228 to a peripheral portion of chamber lid assembly 1232 to help provide an improved velocity profile of a gas flow from gas dispersing channel 1228 across the surface of a substrate (i.e., from the center of the substrate to the edge of the substrate). Lower surface 1260 may contain one or more tapered surfaces, such as a straight surface, a concave surface, a convex surface, or combinations thereof. In one embodiment, lower surface 1260 is tapered in the shape of a funnel.

In one example, lower surface 1260 is downwardly sloping to help reduce the variation in the velocity of the process gases traveling between lower surface 1260 of chamber lid assembly 1232 and a substrate while assisting to provide uniform exposure of the surface of a substrate to a reactant gas. In one embodiment, the ratio of the maximum area of the flow section over the minimum area of the flow section between downwardly sloping lower surface 1260 of chamber lid assembly 1232 and the surface of a substrate is less than about 2, preferably, less than about 1.5, more preferably, less than about 1.3, and more preferably, about 1.

Not wishing to be bound by theory, it is believed that a gas flow traveling at a more uniform velocity across the surface of a substrate helps provide a more uniform deposition of the gas on a substrate. It is believed that the velocity of the gas is directly proportional to the concentration of the gas which is in turn directly proportional to the deposition rate of the gas on a substrate surface. Thus, a higher velocity of a gas at a first area of the surface of a substrate versus a second area of the surface of a substrate is believed to provide a higher deposition of the gas on the first area. It is believed that chamber lid assembly 1232 having lower surface 1260, downwardly sloping, provides for more uniform deposition of the gas across the surface of a substrate because lower surface 1260 provides a more uniform velocity and, thus, a more uniform concentration of the gas across the surface of a substrate.

FIGS. 12C and 13C depict choke 1262 at a peripheral portion of chamber lid assembly 1232 adjacent the periphery of where a substrate may be positioned during an ALD process. Choke 1262, when chamber lid assembly 1232 is assembled to form a processing zone around a substrate, may contain any member restricting the flow of gas therethrough at an area adjacent the periphery of the substrate.

Figure 13A:
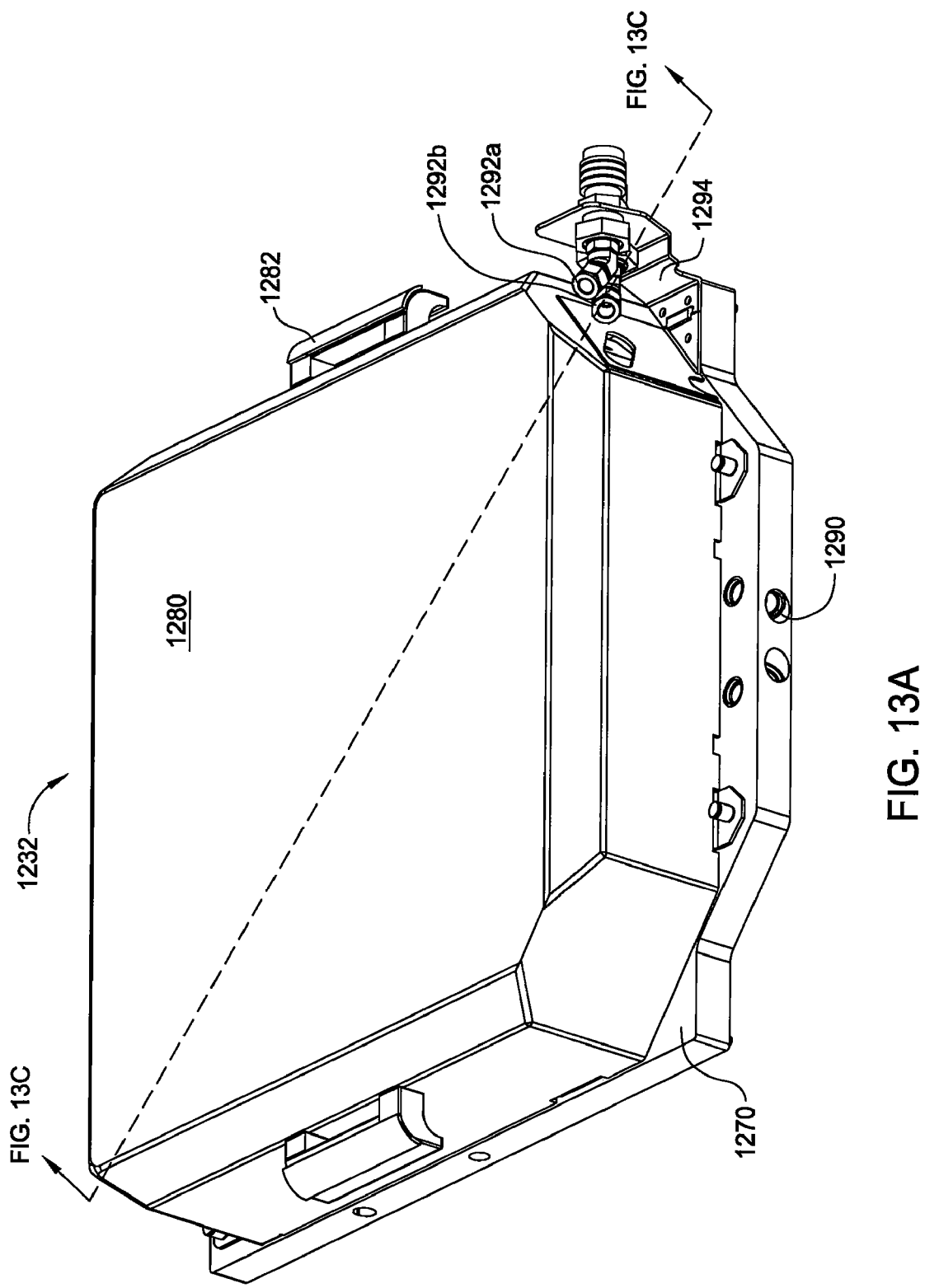
FIGS. 13A-13C depicts other schematic view of the process chamber lid assembly of FIGS. 12A-12E as described in embodiments herein.
Figure 13B:
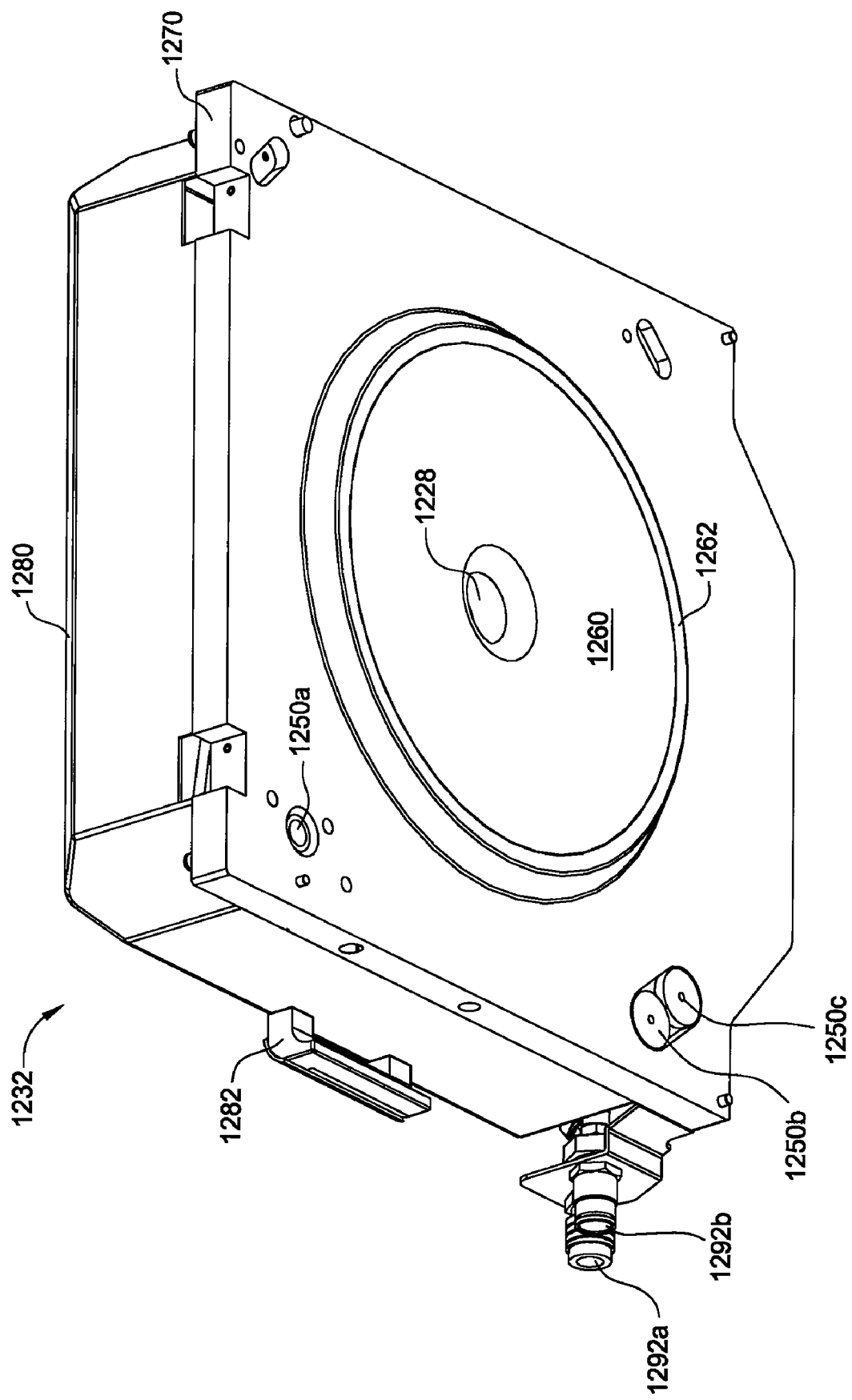
Figure 13C:
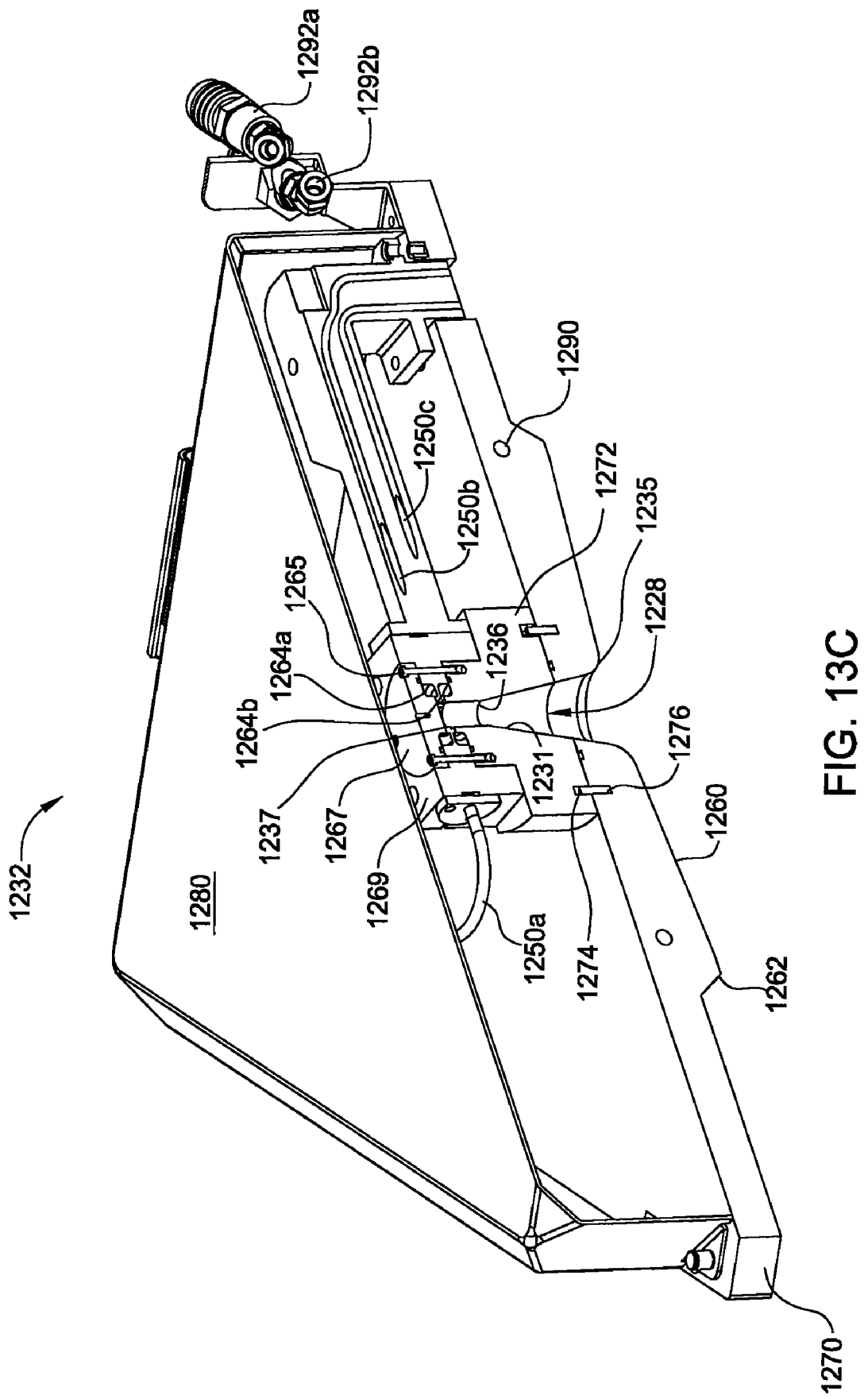

Lid cap 1272, gas conduit 1250a, gas conduit cover 1252, and a portion of upper surface of lid plate 1270 may be covered by chamber lid cover 1280 having handles 1282, as illustrated in FIGS. 13A-13B. The temperature of chamber lid assembly 1232 may be controlled by a liquid cooling system attached to a water jacket, such as coolant channel 1290 extending through lid plate 1270. A fluid coolant, such as water, may be passed through coolant channel 1290 to remove heat from lid plate 1270. Coolant connectors 1292a and 1292b may be connected coolant channel 1270 by a hose or a tube. The other end of coolant connectors 1292a and 1292b may be connected by a hose or a tube to a fluid source and a fluid return, such as an in-house cooling system or an independent cooling system. Coolant connectors 1292a and 1292b may be attached to lid plate 1270 by support bracket 1294. Liquids that may be flowed through coolant channel 1270 include water, oil, alcohols, glycols, glycol ethers, or other organic solvents. In one embodiment, the temperature of lid plate 1270 or chamber lid assembly 1232 may be maintained at a predetermined temperature within a range from about 0° C. to about 100° C., preferably, from about 18° C. to about 65° C., and more preferably, from about 20° C. to about 50° C.

Figure 15A:
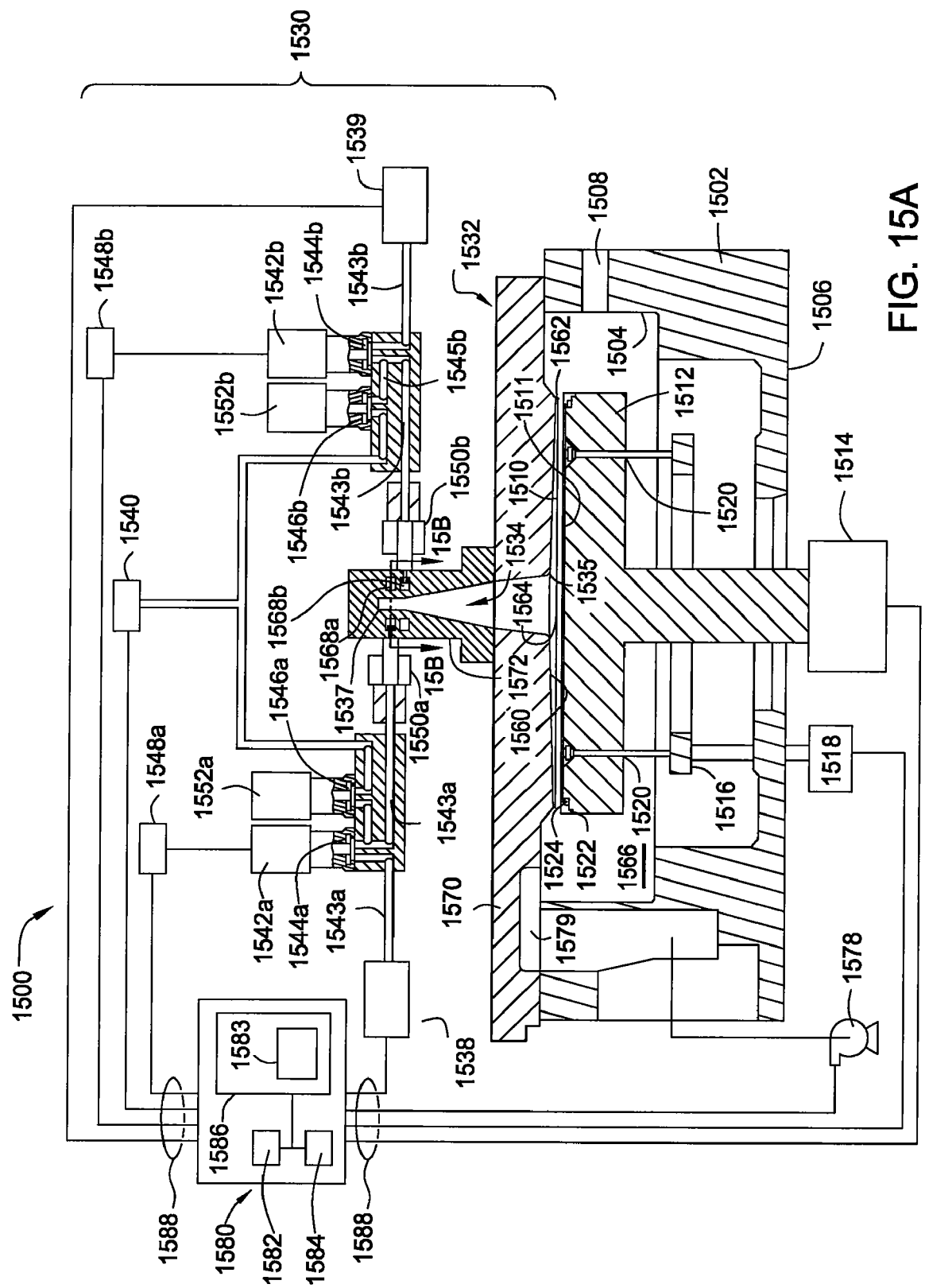

FIGS. 15A-15C are a schematic views of one embodiment of process chamber 1500 including gas delivery system 1530 adapted for ALD processes. Process chamber 1500 contains chamber body 1502 having sidewalls 1504 and bottom 1506. Slit valve 1508 in process chamber 1500 provides access for a robot (not shown) to deliver and retrieve substrate 1510, such as a 200 mm or 300 mm semiconductor wafer or a glass substrate, to and from process chamber 1500.

Substrate support 1512 supports substrate 1510 on substrate receiving surface 1511 in process chamber 1500. Substrate support 1512 is mounted to lift motor 1514 for raising and lowering substrate support 1512 and substrate 1510 disposed thereon. Lift plate 1516 connected to lift motor 1518 is mounted in process chamber 1500 and raises and lowers lift pins 1520 movably disposed through substrate support 1512. Lift pins 1520 raise and lower substrate 1510 over the surface of substrate support 1512. Substrate support 1512 may include a vacuum chuck (not shown), an electrostatic chuck (not shown), or a clamp ring (not shown) for securing substrate 1510 to substrate support 1512 during a deposition process.

The temperature of substrate support 1512 may be adjusted to control the temperature of substrate 1510 disposed thereon. For example, substrate support 1512 may be heated using an embedded heating element, such as a resistive heater (not shown), or may be heated using radiant heat, such as heating lamps (not shown) disposed above substrate support 1512. Purge ring 1522 may be disposed on substrate support 1512 to define purge channel 1524 which provides a purge gas to a peripheral portion of substrate 1510 to prevent deposition thereon.

Gas delivery system 1530 is disposed at an upper portion of chamber body 1502 to provide a gas, such as a process gas and/or a purge gas, to process chamber 1500. FIGS. 15A-15C depict gas delivery system 1530 configured to expose substrate 1510 to at least two gas sources or chemical precursors. In other examples, gas delivery system 1530 may be reconfigured to expose substrate 1510 to a single gas source (as depicted in FIG. 5) or to three or more gas sources or chemical precursors (as depicted in FIG. 6). Vacuum system 1578 is in communication with pumping channel 1579 to evacuate any desired gases from process chamber 1500 and to help maintain a desired pressure or a desired pressure range inside pumping zone 1566 of process chamber 1500.

In one embodiment, gas delivery system 1530 contains chamber lid assembly 1532 having gas dispersing channel 1534 extending through a central portion of chamber lid assembly 1532. Gas dispersing channel 1534 extends perpendicular towards substrate receiving surface 1511 and also extends along central axis 1533 of gas dispersing channel 1534, through lid plate 1570, and to lower surface 1560. In one example, a portion of gas dispersing channel 1534 is substantially cylindrical along central axis 1533 within upper portion 1537 and a portion of gas dispersing channel 1534 that tapers away from central axis 1533 within lower portion 1535 of gas dispersing channel 1534. Gas dispersing channel 1534 further extends pass lower surface 1560 and into reaction zone 1564. Lower surface 1560 extends from lower portion 1535 of gas dispersing channel 1534 to choke 1562. Lower surface 1560 is sized and shaped to substantially cover substrate 1510 disposed on substrate receiving surface 1511 of substrate support 1512.

Processes gases, as circular gas flow 1574, are forced to make revolutions around central axis 1533 of gas dispersing channel 1534 while passing along central axis 1533. Circular gas flow 1574 may contain a flow pattern, such as a vortex pattern, a helix pattern, a spiral pattern, a twirl pattern, a twist pattern, a coil pattern, a whirlpool pattern, or derivatives thereof. Circular gas flow 1574 may extend at least about 1 revolution around central axis 1533 of gas dispersing channel 1534, preferably, at least about 1.5 revolutions, more preferably, at least about 2 revolutions, more preferably, at least about 3 revolutions, and more preferably, about 4 revolutions or more.

Gas dispersing channel 1534 has gas inlets 1536a, 1536b to provide gas flows from two similar pairs of valves 1542a/1552a, 1542b/1552b, which may be provided together and/or separately. In one configuration, valve 1542a and valve 1542b are coupled to separate reactant gas sources but are preferably coupled to the same purge gas source. For example, valve 1542a is coupled to reactant gas source 1538 and valve 1542b is coupled to reactant gas source 1539, and both valves 1542a, 1542b are coupled to purge gas source 1540. Each valve 1542a, 1542b includes delivery line 1543a, 1543b having valve seat assembly 1544a, 1544b and each valve 1552a, 1552b includes purge line 1545a, 1545b having valve seat assembly 1546a, 1546b. Delivery line 1543a, 1543b is in fluid communication with reactant gas sources 1538 and 1539 and is in fluid communication with gas inlet 1536a, 1536b of gas dispersing channel 1534. Valve seat assembly 1544a, 1544b of the delivery line 1543a, 1543b controls the flow of the reactant gas from reactant gas sources 1538 and 1539 to gas dispersing channel 1534. Purge line 1545a, 1545b is in communication with purge gas source 1540 and intersects delivery line 1543a, 1543b downstream of valve seat assembly 1544a, 1544b of delivery line 1543a, 1543b. Valve seat assembly 1546a, 1546b of purge line 1545a, 1545b controls the flow of the purge gas from purge gas source 1540 to gas dispersing channel 1534. If a carrier gas is used to deliver reactant gases from reactant gas sources 1538 and 1539, preferably the same gas is used as a carrier gas and a purge gas (i.e., an argon gas used as a carrier gas and a purge gas).

Each valve seat assembly 1544a, 1544b, 1546a, 1546b may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 1548a, 1548b may be coupled to valves 1542a, 1542b to control actuation of the diaphragms of valve seat assemblies 1544a, 1544b, 1546a, 1546b of valves 1542a, 1542b. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 1542*a*, 1542*b* may be a zero dead volume valve to enable flushing of a reactant gas from delivery line 1543*a*, 1543*b* when valve seat assembly 1544*a*, 1544*b* is closed. For example, purge line 1545*a*, 1545*b* may be positioned adjacent valve seat assembly 1544*a*, 1544*b* of delivery line 1543*a*, 1543*b*. When valve seat assembly 1544*a*, 1544*b* is closed, purge line 1545*a*, 1545*b* may provide a purge gas to flush delivery line 1543*a*, 1543*b*. In one embodiment, purge line 1545*a*, 1545*b* is positioned slightly spaced from valve seat assembly 1544*a*, 1544*b* of delivery line 1543*a*, 1543*b* so that a purge gas is not directly delivered into valve seat assembly 1544*a*, 1544*b* when open. A zero dead volume valve as used herein is defined as a valve which has negligible dead volume (i.e., not necessary zero dead volume).

Each valve pair 1542*a*/1552*a*, 1542*b*/1552*b* may be adapted to provide a combined gas flow and/or separate gas flows of the reactant gas and the purge gas. In reference to valve pair 1542*a*/1552*a*, one example of a combined gas flow of the reactant gas and the purge gas includes a continuous flow of a purge gas from purge gas source 1540 through purge line 1545*a* and pulses of a reactant gas from reactant gas source 1538 through delivery line 1543*a*. The continuous flow of the purge gas may be provided by leaving the diaphragm of valve seat assembly 1546*a* of purge line 1545*a* open. The pulses of the reactant gas from reactant gas source 1538 may be provided by opening and closing the diaphragm of valve seat assembly 1544*a* of delivery line 1543*a*. In reference to valve pair 1542*a*/1552*a*, one example of separate gas flows of the reactant gas and the purge gas includes pulses of a purge gas from purge gas source 1540 through purge line 1545*a* and pulses of a reactant gas from reactant gas source 1538 through delivery line 1543*a*. The pulses of the purge gas may be provided by opening and closing the diaphragm of valve seat assembly 1546*a* of purge line 1545*a*. The pulses of the reactant gas from reactant gas source 1538 may be provided by opening and closing the diaphragm of valve seat assembly 1544*a* of delivery line 1543*a*.

Delivery lines 1543*a*, 1543*b* of valves 1542*a*, 1542*b* may be coupled to gas inlets 1536*a*, 1536*b* through gas conduits 1550*a*, 1550*b*. Gas conduits 1550*a*, 1550*b* may be integrated or may be separate from valves 1542*a*, 1542*b*. In one aspect, valves 1542*a*, 1542*b* are coupled in close proximity to gas dispersing channel 1534 to reduce any unnecessary volume of delivery line 1543*a*, 1543*b* and gas conduits 1550*a*, 1550*b* between valves 1542*a*, 1542*b* and gas inlets 1536*a*, 1536*b*.

Not wishing to be bound by theory, it is believed that the diameter of gas dispersing channel 1534, which is constant from upper portion 1537 of gas dispersing channel 1534 to some point along central axis 1533 and increasing from this point to lower portion 1535 of gas dispersing channel 1534, allows less of an adiabatic expansion of a gas through gas dispersing channel 1534 which helps to control the temperature of the process gas contained in circular flow gas 1574. For instance, a sudden adiabatic expansion of a gas delivered into gas dispersing channel 1534 may result in a drop in the temperature of the gas which may cause condensation of the gas and formation of droplets. On the other hand, gas dispersing channel 1534 that gradually tapers is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 1532). Gas dispersing channel 1534 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

FIGS. 15B-15C depict the pathway gases travel to gas dispersing channel 1534, as described in embodiments herein. Process gasses are delivered from gas conduits 1550*a* and 1550*b* through gas inlets 1536*a* and 1536*b*, into gas annulets 1568*a* and 1568*b*, through slots 1569*a* and 1569*b*, and into gas dispersing channel 1534. FIG. 15B illustrates a pathway for a process gas or precursor gas to travel, that is, from gas conduit 1550*a* through gas inlet 1536*a*, into gas annulet 1568*a*, through slots 1569*a*, and into gas dispersing channel 1534. A second pathway (e.g., mirror image of FIG. 15B) extends from gas conduit 1550*b* through gas inlet 1536*b*, into gas annulet 1568*b*, through slots 1569*b*, and into gas dispersing channel 1534, as depicted in FIG. 15C. Both of these pathways circumvent upper portion 1537 of gas dispersing channel 1534.

Slots 1569*a* and 1569*b* provide fluid communication from gas annulets 1568*a* and 1568*b* to gas dispersing channel 1534. Slots 1569*a* and 1569*b* may be positioned at an angle relative to central axis 1533, such as about tangential to central axis 1533 or gas dispersing channel 1534. In one embodiment, slots 1569*a* and 1569*b* are positioned at an angle tangential to gas dispersing channel 1534, such as within a range from about 0° to about 90°, preferably, from about 0° to about 45°, and more preferably, from about 0° to about 20°.

Not wishing to be bound by theory, FIG. 15C is a cross-sectional view of gas dispersing channel 1534 of chamber lid assembly 1532 showing simplified representations of gas flows therethrough. Although the exact flow pattern through the gas dispersing channel 1534 is not known, it is believed that circular gas flow 1574 (FIG. 15C) may travel from slots 1569*a* and 1569*b* through gas dispersing channel 1534 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. As shown in FIG. 15C, the circular flow may be provided in a "processing region" as opposed to in a compartment separated from substrate 1510. In one aspect, circular gas flow 1574 may help to establish a more efficient purge of gas dispersing channel 1534 due to the sweeping action of the vortex flow pattern across the inner surface of gas dispersing channel 1534.

In one embodiment, FIG. 15C depicts distance 1575 between point 1576*a* at the surface of substrate 1510 and point 1576*b* at upper portion 1537 of gas dispersing channel 1534. Distance 1575 is long enough that circular gas flow 1574 dissipates to a downwardly flow as a spiral flow across the surface of substrate 1510 may not be desirable. It is believed that circular gas flow 1574 proceeds in a laminar manner efficiently purging the surface of chamber lid assembly 1532 and substrate 1510. In another embodiment, distance 1575 or gas dispersing channel 1534 extending along central axis 1533 has a length within a range from about 3 inches to about 9 inches, preferably, from about 3.5 inches to about 7 inches, and more preferably, from about 4 inches to about 6 inches, such as about 5 inches.

FIG. 15A depicts that at least a portion of lower surface 1560 of chamber lid assembly 1532 may be tapered from gas dispersing channel 1534 to a peripheral portion of chamber lid assembly 1532 to help provide an improved velocity profile of a gas flow from gas dispersing channel 1534 across the surface of substrate 1510 (i.e., from the center of the substrate to the edge of the substrate). Lower surface 1560 may contain one or more tapered surfaces, such as a straight surface, a concave surface, a convex surface, or combinations thereof. In one embodiment, lower surface 1560 is tapered in the shape of a funnel.

In one example, lower surface 1560 is downwardly sloping to help reduce the variation in the velocity of the process gases traveling between lower surface 1560 of chamber lid assembly 1532 and substrate 1510 while assisting to provide uniform exposure of the surface of substrate 1510 to a reactant gas. In one embodiment, the ratio of the maximum area of the flow section over the minimum area of the flow section between a downwardly sloping lower surface 1560 of chamber lid assembly 1532 and the surface of substrate 1510 is less than about 2, preferably, less than about 1.5, more preferably, less than about 1.3, and more preferably, about 1.

Not wishing to be bound by theory, it is believed that a gas flow traveling at a more uniform velocity across the surface of substrate 1510 helps provide a more uniform deposition of the gas on substrate 1510. It is believed that the velocity of the gas is directly proportional to the concentration of the gas which is in turn directly proportional to the deposition rate of the gas on substrate 1510 surface. Thus, a higher velocity of a gas at a first area of the surface of substrate 1510 versus a second area of the surface of substrate 1510 is believed to provide a higher deposition of the gas on the first area. It is believed that chamber lid assembly 1532 having lower surface 1560, downwardly sloping, provides for more uniform deposition of the gas across the surface of substrate 1510 because lower surface 1560 provides a more uniform velocity and, thus, a more uniform concentration of the gas across the surface of substrate 1510.

FIG. 15A depicts choke 1562 located at a peripheral portion of chamber lid assembly 1532 adjacent the periphery of substrate 1510. Choke 1562, when chamber lid assembly 1532 is assembled to form a processing zone around substrate 1510, contains any member restricting the flow of gas therethrough at an area adjacent the periphery of substrate 1510.

In one specific embodiment, the spacing between choke 1562 and substrate support 1512 is between about 0.04 inches and about 2.0 inches, and preferably between 0.04 inches and about 0.2 inches. The spacing may vary depending on the gases being delivered and the process conditions during deposition. Choke 1562 helps provide a more uniform pressure distribution within the volume or reaction zone 1564 defined between chamber lid assembly 1532 and substrate 1510 by isolating reaction zone 1564 from the non-uniform pressure distribution of pumping zone 1566 (FIG. 15A).

Referring to FIG. 15A, in one aspect, since reaction zone 1564 is isolated from pumping zone 1566, a reactant gas or purge gas needs only adequately fill reaction zone 1564 to ensure sufficient exposure of substrate 1510 to the reactant gas or purge gas. In conventional chemical vapor deposition, prior art chambers are required to provide a combined flow of reactants simultaneously and uniformly to the entire surface of the substrate in order to ensure that the co-reaction of the reactants occurs uniformly across the surface of substrate 1510. In atomic layer deposition, process chamber 1500 sequentially introduces reactants to the surface of substrate 1510 to provide absorption of alternating thin layers of the reactants onto the surface of substrate 1510. As a consequence, atomic layer deposition does not require a flow of a reactant which reaches the surface of substrate 1510 simultaneously. Instead, a flow of a reactant needs to be provided in an amount which is sufficient to adsorb a thin layer of the reactant on the surface of substrate 1510.

Since reaction zone 1564 may contain a smaller volume when compared to the inner volume of a conventional CVD chamber, a smaller amount of gas is required to fill reaction zone 1564 for a particular process in an atomic layer deposition sequence. For example, in one embodiment, the volume of reaction zone 1564 is about 1,000 cm$^3$ or less, preferably 500 cm$^3$ or less, and more preferably 200 cm$^3$ or less for a chamber adapted to process 200 mm diameter substrates. In one embodiment, the volume of reaction zone 1564 is about 3,000 cm$^3$ or less, preferably 1,500 cm$^3$ or less, and more preferably 600 cm$^3$ or less for a chamber adapted to process 300 mm diameter substrates. In one embodiment, substrate support 1512 may be raised or lowered to adjust the volume of reaction zone 1564 for deposition. Because of the smaller volume of reaction zone 1564, less gas, whether a deposition gas or a purge gas, is necessary to be flowed into process chamber 1500. Therefore, the throughput of process chamber 1500 is greater and the waste may be minimized due to the smaller amount of gas used reducing the cost of operation.

Chamber lid assembly 1532 has been shown in FIGS. 15A-15C as containing lid cap 1572 and lid plate 1570 in which lid cap 1572 and lid plate 1570 form gas dispersing channel 1534. In one embodiment, process chamber 1500 contains lid cap 1572 having gas annulets 1568a and 1568b and slots 1569a and 1569b, as shown in FIGS. 15A-15C. In another embodiment, process chamber 1500 may contain a lid cap, gas annulets, and slots, as shown in FIGS. 12A-14C. An additional plate may be optionally disposed between lid plate 1570 and lid cap 1572 (not shown). The additional plate may be used to adjust (e.g., increase) the distance between lid cap 1572 and lid plate 1570 therefore respectively changing the length of dispersing channel 1534 formed therethrough. In another embodiment, the optional additional plate disposed between lid plate 1570 and lid cap 1572 contains stainless steel. In other embodiments, gas dispersing channel 1534 may be made integrally from a single piece of material.

Chamber lid assembly 1532 may include cooling elements and/or heating elements depending on the particular gas being delivered therethrough. Controlling the temperature of chamber lid assembly 1532 may be used to prevent gas decomposition, deposition, or condensation on chamber lid assembly 1532. For example, water channels (such as coolant channel 1290 In FIG. 12A) may be formed in chamber lid assembly 1532 to cool chamber lid assembly 1532. In another example, heating elements (not shown) may be embedded or may surround components of chamber lid assembly 1532 to heat chamber lid assembly 1532. In one embodiment, components of chamber lid assembly 1532 may be individually heated or cooled. For example, referring to FIG. 15A, chamber lid assembly 1532 may contain lid plate 1570 and lid cap 1572 in which lid plate 1570 and lid cap 1572 form gas dispersing channel 1534. Lid cap 1572 may be maintained at one temperature range and lid plate 1570 may be maintained at another temperature range. For example, lid cap 1572 may be heated by being wrapped in heater tape or by using another heating device to prevent condensation of reactant gases and lid plate 1570 may be maintained at ambient temperature. In another example, lid cap 1572 may be heated and lid plate 1570 may be cooled with water channels formed therethrough to prevent thermal decomposition of reactant gases on lid plate 1570.

The components and parts of chamber lid assembly 1532 may contain materials such as stainless steel, aluminum, nickel-plated aluminum, nickel, alloys thereof, or other suitable materials. In one embodiment, lid cap 1572 and lid plate 1570 may be independently fabricated, machined, forged, or otherwise made from a metal, such as aluminum, an aluminum alloy, steel, stainless steel, alloys thereof, or combinations thereof.

In one embodiment, inner surface 1531 of gas dispersing channel 1534 (including both inner surfaces of lid plate 1570 and lid cap 1572) and lower surface 1560 of chamber lid assembly 1532 may contain a mirror polished surface to help produce a laminar flow of a gas along gas dispersing channel 1534 and lower surface 1560 of chamber lid assembly 1532. In another embodiment, the inner surface of gas conduits 1550a and 1550b may be electropolished to help produce a laminar flow of a gas therethrough.

In an alternative embodiment, inner surface 1531 of gas dispersing channel 1534 (including both inner surfaces of lid plate 1570 and lid cap 1572) and lower surface 1560 of chamber lid assembly 1532 may contain a roughened surface or machined surfaces to produce more surface area across the surfaces. Roughened surfaces provide better adhesion of undesired accumulated materials on inner surface 1531 and lower surface 1560. The undesired films are usually formed as a consequence of conducting a vapor deposition process and may peel or flake from inner surface 1531 and lower surface 1560 to contaminate substrate 1510. In one example, the mean roughness ($R_a$) of lower surface 1560 and/or inner surface 1531 may be at least about 10 μin, such as within a range from about 10 μin (about 0.254 μm) to about 200 μin (about 5.08 μm), preferably, from about 20 μin (about 0.508 μm) to about 100 μin (about 2.54 μm), and more preferably, from about 30 μin (about 0.762 μm) to about 80 μin (about 2.032 μm). In another example, the mean roughness of lower surface 1560 and/or inner surface 1531 may be at least about 100 μin (about 2.54 μm), preferably, within a range from about 200 μin (about 5.08 μm) to about 500 μin (about 12.7 μm).

FIG. 15A depicts control unit 1580, such as a programmed personal computer, work station computer, or the like, coupled to process chamber 1500 to control processing conditions. For example, control unit 1580 may be configured to control flow of various process gases and purge gases from gas sources 1538, 1539, and 1540 through valves 1542a and 1542b during different stages of a substrate process sequence. Illustratively, control unit 1580 contains central processing unit (CPU) 1582, support circuitry 1584, and memory 1586 containing associated control software 1583.

Control unit 1580 may be one of any form of general purpose computer processor that can be used in an industrial setting for controlling various chambers and sub-processors. CPU 1582 may use any suitable memory 1586, such as random access memory, read only memory, floppy disk drive, hard disk, or any other form of digital storage, local or remote. Various support circuits may be coupled to CPU 1582 for supporting process chamber 1500. Control unit 1580 may be coupled to another controller that is located adjacent individual chamber components, such as programmable logic controllers 1548a, 1548b of valves 1542a, 1542b. Bi-directional communications between the control unit 1580 and various other components of process chamber 1500 are handled through numerous signal cables collectively referred to as signal buses 1588, some of which are illustrated in FIG. 15A. In addition to control of process gases and purge gases from gas sources 1538, 1539, 1540 and from programmable logic controllers 1548a, 1548b of valves 1542a, 1542b, control unit 1580 may be configured to be responsible for automated control of other activities used in wafer processing—such as wafer transport, temperature control, chamber evacuation, among other activities, some of which are described elsewhere herein.

Referring to FIGS. 15A-15C, in operation, substrate 1510 is delivered to process chamber 1500 through slit valve 1508 by a robot (not shown). Substrate 1510 is positioned on substrate support 1512 through cooperation of lift pins 1520 and the robot. Substrate support 1512 raises substrate 1510 into close opposition to lower surface 1560 of chamber lid assembly 1532. A first gas flow may be injected into gas dispersing channel 1534 of process chamber 1500 by valve 1542a together or separately (i.e., pulses) with a second gas flow injected into process chamber 1500 by valve 1542b. The first gas flow may contain a continuous flow of a purge gas from purge gas source 1540 and pulses of a reactant gas from reactant gas source 1538 or may contain pulses of a reactant gas from reactant gas source 1538 and pulses of a purge gas from purge gas source 1540. The second gas flow may contain a continuous flow of a purge gas from purge gas source 1540 and pulses of a reactant gas from reactant gas source 1539 or may contain pulses of a reactant gas from reactant gas source 1539 and pulses of a purge gas from purge gas source 1540.

Circular gas flow 1574 travels through gas dispersing channel 1534 as a vortex flow which provides a sweeping action across the inner surface of gas dispersing channel 1534. Circular gas flow 1574 dissipates to a downwardly flow towards the surface of substrate 1510. The velocity of the gas flow reduces as it travels through gas dispersing channel 1534. The gas flow then travels across the surface of substrate 1510 and across lower surface 1560 of chamber lid assembly 1532. Lower surface 1560 of chamber lid assembly 1532, which is downwardly sloping, helps reduce the variation of the velocity of the gas flow across the surface of substrate 1510. The gas flow then travels by choke 1562 and into pumping zone 1566 of process chamber 1500. Excess gas, by-products, etc. flow into the pumping channel 1579 and are then exhausted from process chamber 1500 by vacuum system 1578. In one aspect, the gas flow proceeds through gas dispersing channel 1534 and between the surface of substrate 1510 and lower surface 1560 of chamber lid assembly 1532 in a laminar manner which aids in uniform exposure of a reactant gas to the surface of substrate 1510 and efficient purging of inner surfaces of chamber lid assembly 1532.

Process chamber 1500, as illustrated in FIGS. 15A-15C, has been described herein as having a combination of features. In one aspect, process chamber 1500 provides reaction zone 1564 containing a small volume in compared to a conventional CVD chamber. Process chamber 1500 requires a smaller amount of a gas, such as a reactant gas or a purge gas, to fill reaction zone 1564 for a particular process. In another aspect, process chamber 1500 provides chamber lid assembly 1532 having a downwardly sloping or funnel shaped lower surface 1560 to reduce the variation in the velocity profile of a gas flow traveling between the bottom surface of chamber lid assembly 1532 and substrate 1510. In still another aspect, process chamber 1500 provides gas dispersing channel 1534 to reduce the velocity of a gas flow introduced therethrough. In still another aspect, process chamber 1500 provides gas conduits at an angle α from the center of gas dispersing channel 1534. Process chamber 1500 provides other features as described elsewhere herein. Other embodiments of a chamber adapted for atomic layer deposition incorporate one or more of these features.

Extended Cap Lid Assembly

In another embodiment, FIGS. 16A-16E depict schematic views of chamber lid assembly 1632 with an extended cap adapted for ALD processes. FIGS. 17A-17D depict a schematic cross-sectional view of process chamber 1700 containing extended lid cap 1772 and gas delivery system 1730 adapted for ALD processes as described in another embodiment herein.

Figure 16A:
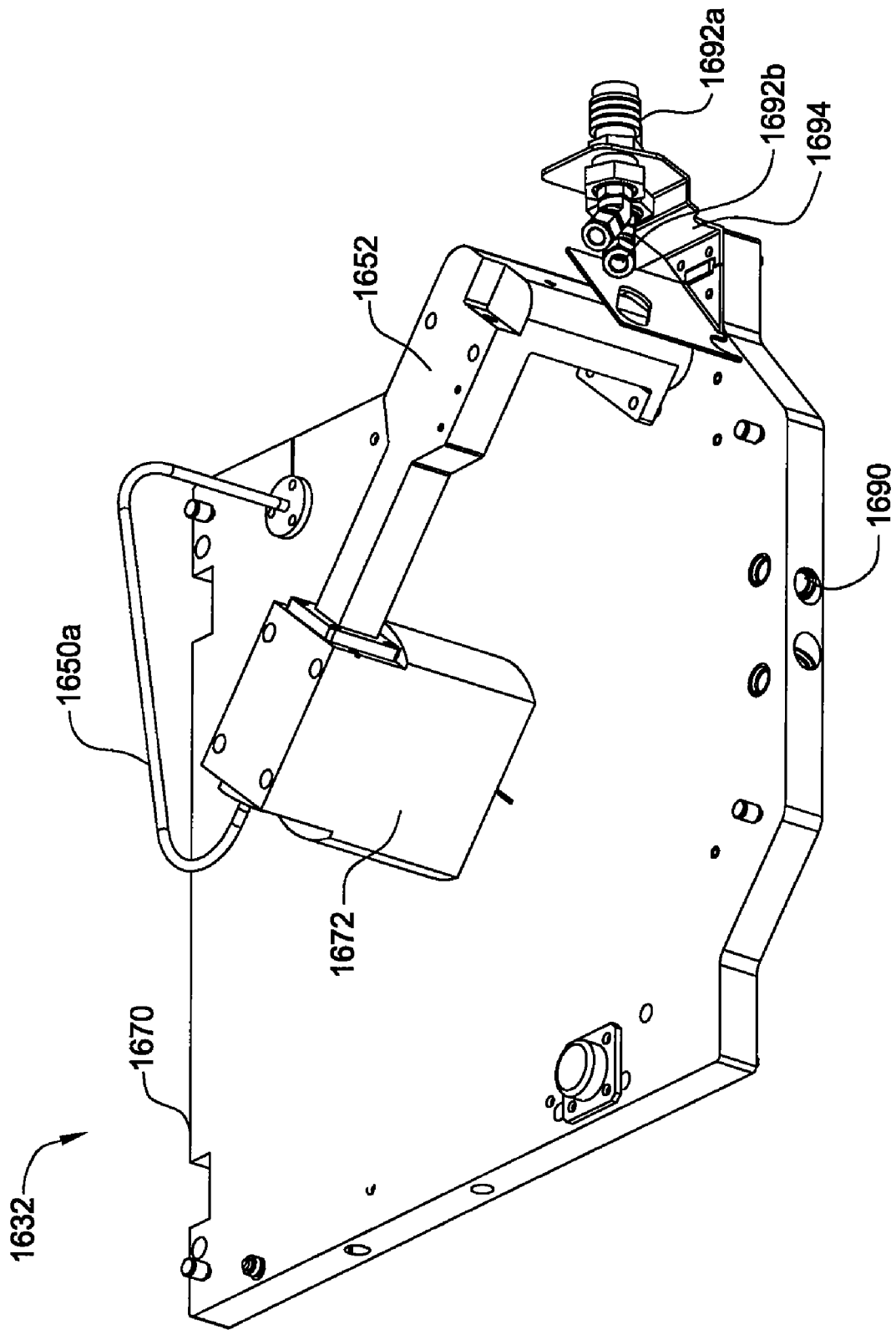

In one embodiment, chamber lid assembly 1632 contains lid cap 1672 positioned in a centralized portion of lid plate 1670, as illustrated in FIG. 16A. Gas conduit 1650*a* is coupled to and in fluid communication with lid cap 1672 on one end, while the other end of gas conduit 1650*a* extends through lid plate 1670 and may be coupled to and in fluid communication with an ALD valve and a chemical precursor source. In one embodiment, gas conduit 1650*a* may be directly coupled to and in fluid communication with gas dispersing channel 1628. Alternatively, gas conduit 1650*a* may be indirectly coupled to and in fluid communication with gas dispersing channel 1628.

Figure 16B:
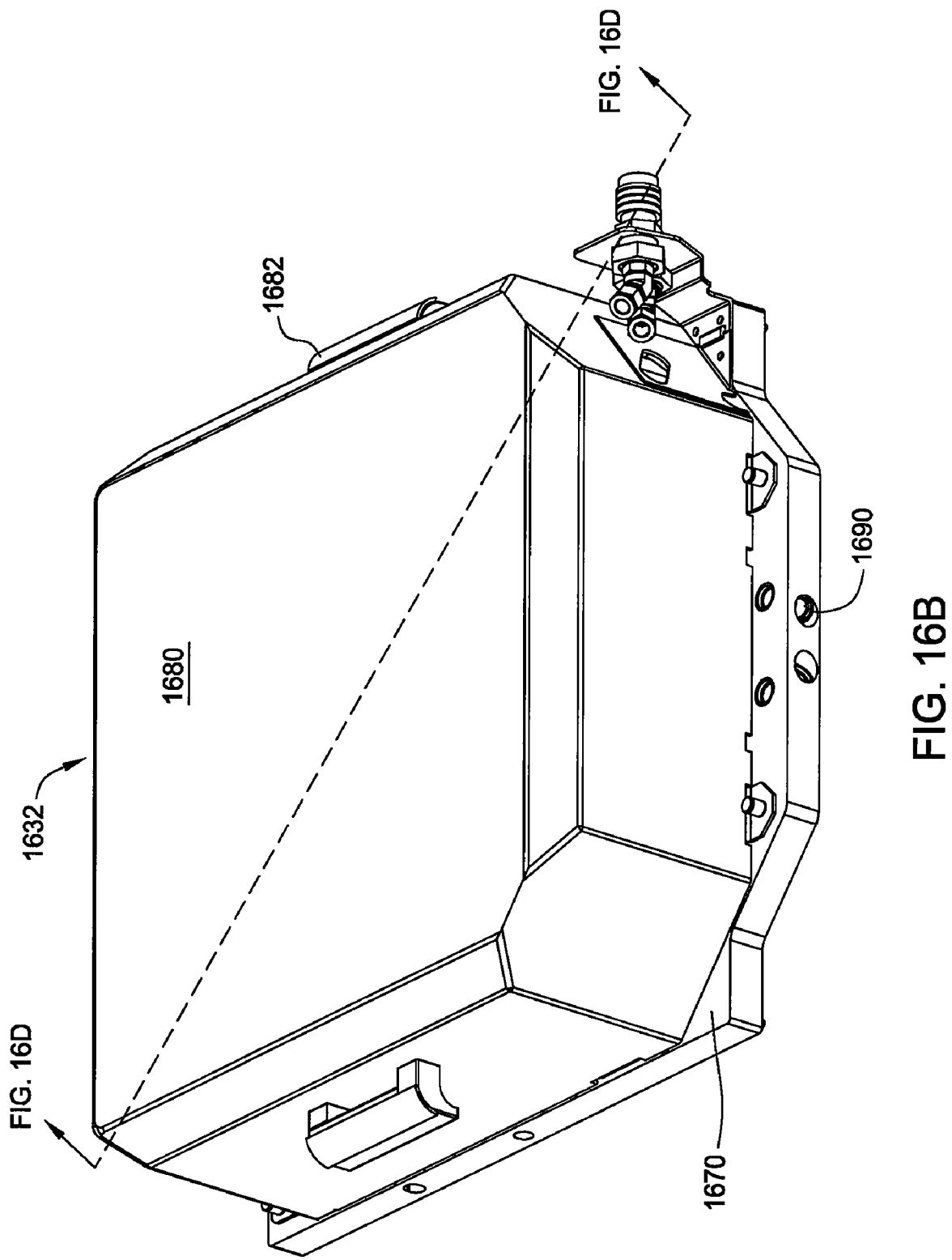
Figure 16C:
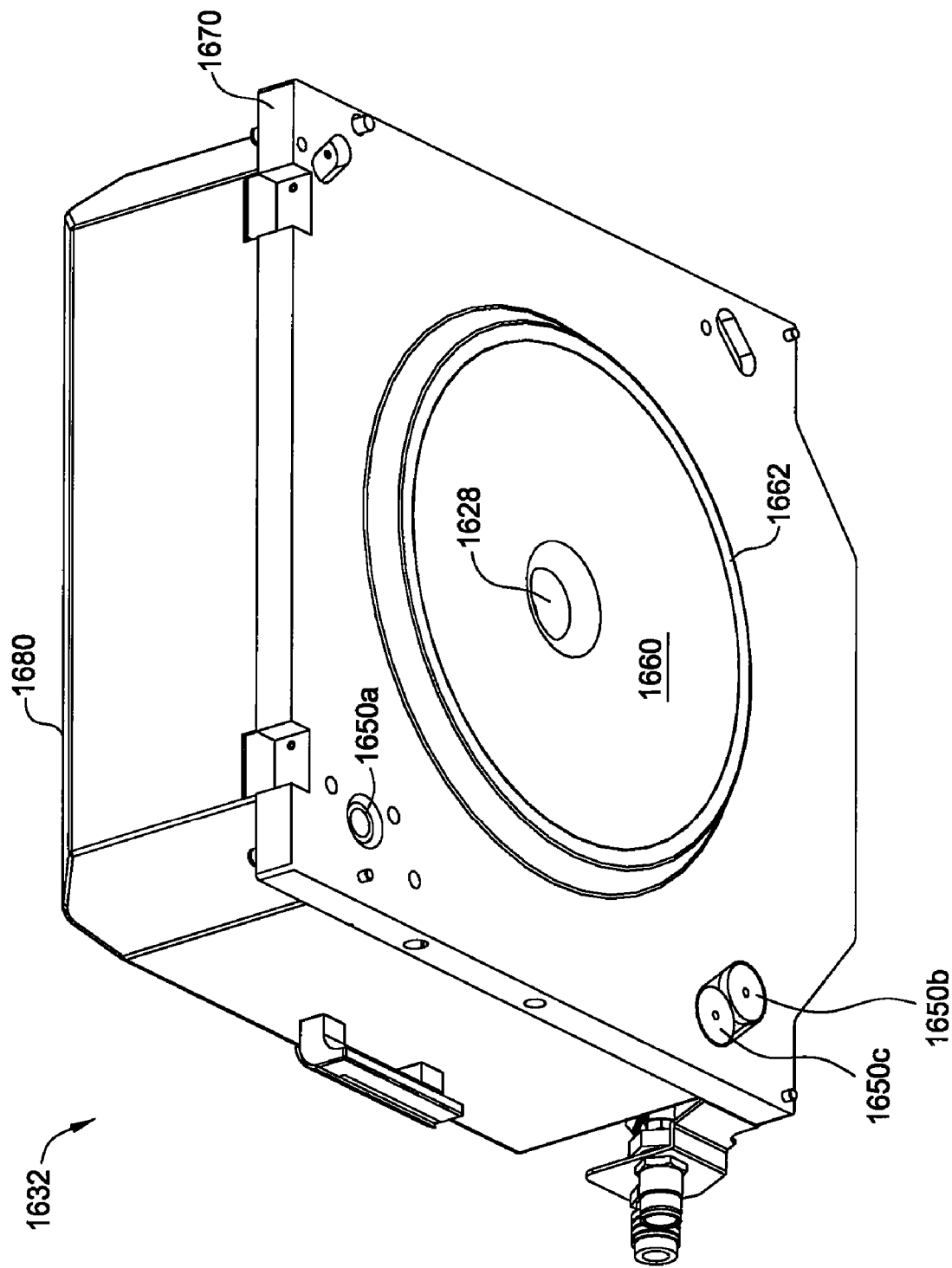
Figure 16D:
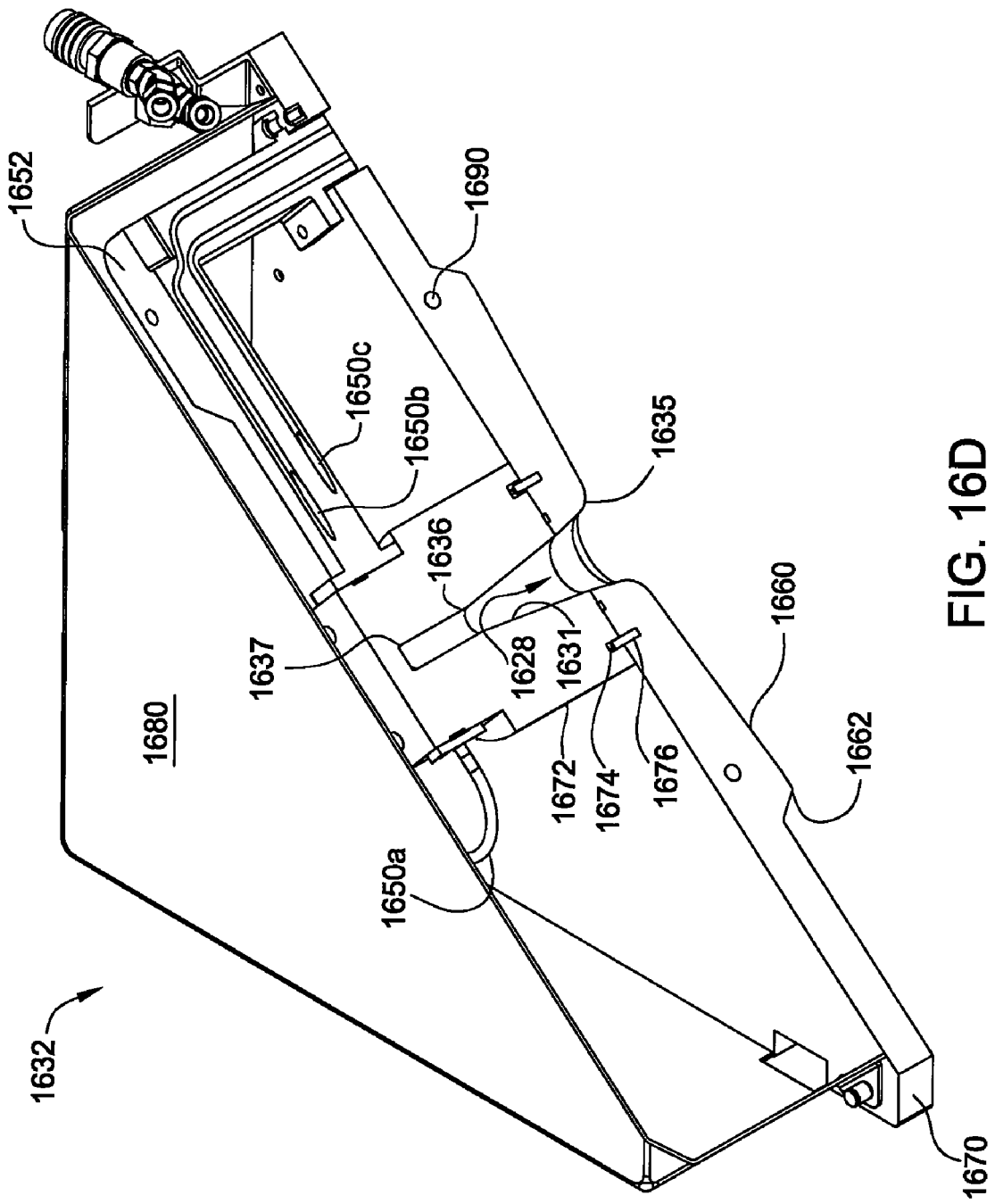

Gas conduit cover 1652 contains at least one gas conduit, or may contain two, three, or more gas conduits. FIGS. 16B-16D depict gas conduit cover 1652 containing gas conduits 1650*b* and 1650*c*. In one embodiment, gas conduit 1650*b* may be coupled to and in fluid communication with lid cap 1672 on one end, while the other end of gas conduit 1650*b* extends through lid plate 1670 and may be coupled to and in fluid communication with an ALD valve and a chemical precursor source. In another embodiment, gas conduit 1650*b* or 1650*c* may be directly coupled to and in fluid communication with gas dispersing channel 1628. Alternatively, gas conduit 1650*b* or 1650*c* may be indirectly coupled to and in fluid communication with gas dispersing channel 1628.

Conduit 1650*c* is an optional conduit in some embodiments. Gas conduit 1650*c* may be coupled to and in fluid communication with lid cap 1672 on one end, while the other end of gas conduit 1650*c* extends through lid plate 1670 and may be coupled to and in fluid communication with an ALD valve and gas source, such as a carrier gas source, a purge gas source, a plasma gas, or a chemical precursor source. In another embodiment, conduit 1650*c* is may be coupled to and in fluid communication with the top surface of lid cap 1672. In another embodiment, conduit 1650*c* may be combined with conduit 1650*b*, such as with a Y-joint, and may be coupled to and in fluid communication with gas passageway 1668*b*.

FIGS. 16D-16E depict chamber lid assembly 1632 containing lid cap 1672 and lid plate 1670 in which lid cap 1672 and lid plate 1670 form gas dispersing channel 1628. An additional plate may be optionally disposed between lid plate 1670 and lid cap 1672 (not shown). Pins 1676 within grooves 1674 connect lid plate 1670 and lid cap 1672 (FIG. 16D). The additional plate may be used to adjust (e.g., increase) the distance between lid cap 1672 and lid plate 1670 therefore respectively changing the length of gas dispersing channel 1628 formed therethrough. In another embodiment, the optional additional plate disposed between lid plate 1670 and lid cap 1672 contains stainless steel. In other embodiments, gas dispersing channel 1628 may be made integrally from a single piece of material.

Chamber lid assembly 1632 may include cooling elements and/or heating elements depending on the particular gas being delivered therethrough. Controlling the temperature of chamber lid assembly 1632 may be used to prevent gas decomposition, deposition, or condensation on chamber lid assembly 1632. For example, coolant channel 1690 may be formed in chamber lid assembly 1632 to cool chamber lid assembly 1632. In another example, heating elements (not shown) may be embedded or may surround components of chamber lid assembly 1632 to heat chamber lid assembly 1632.

In one embodiment, components of chamber lid assembly 1632 may be individually heated or cooled. For example, referring to FIGS. 16D-16E, chamber lid assembly 1632 may contain lid plate 1670 and lid cap 1672 in which lid plate 1670 and lid cap 1672 form gas dispersing channel 1628. Lid cap 1672 may be maintained at one temperature range and lid plate 1670 may be maintained at another temperature range. For example, lid cap 1672 may be heated by being wrapped in heater tape or by using another heating device to prevent condensation of reactant gases and lid plate 1670 may be maintained at ambient temperature. In another example, lid cap 1672 may be heated and lid plate 1670 may be cooled with water channels formed therethrough to prevent thermal decomposition of reactant gases on lid plate 1670.

Chamber lid assembly 1632 contains components that may be made of stainless steel, aluminum, nickel-plated aluminum, nickel, or other suitable materials. In one embodiment, lid cap 1672 and lid plate 1670 may be independently fabricated, machined, forged, or otherwise made from a metal, such as aluminum, an aluminum alloy, steel, stainless steel, alloys thereof, or combinations thereof.

In one embodiment, inner surface 1631 of gas dispersing channel 1628 (including both inner surfaces of lid plate 1670 and lid cap 1672) and lower surface 1660 of chamber lid assembly 1632 may contain a mirror polished surface to help produce a laminar flow of a gas along expanding channel 1634 and lower surface 1660 of chamber lid assembly 1632. In another embodiment, the inner surface of gas conduits 1650*a*, 1650*b* may be electropolished to help produce a laminar flow of a gas therethrough.

In an alternative embodiment, inner surface 1631 of gas dispersing channel 1628 (including both inner surfaces of lid plate 1670 and lid cap 1672) and lower surface 1660 of chamber lid assembly 1632 may contain a roughened surface or machined surfaces to produce more surface area across the surfaces. Roughened surfaces provide better adhesion of undesired accumulated materials on inner surface 1631 and lower surface 1660. The undesired films are usually formed as a consequence of conducting a vapor deposition process and may peel or flake from inner surface 1631 and lower surface 1660 to contaminate substrate 1610. In one example, the mean roughness ($R_a$) of lower surface 1660 and/or inner surface 1631 may be at least about 10 μin, such as within a range from about 10 μin (about 0.254 μm) to about 200 μin (about 5.08 μm), preferably, from about 20 μin (about 0.508 μm) to about 100 μin (about 2.54 μm), and more preferably, from about 30 μin (about 0.762 μm) to about 80 μin (about 2.032 μm). In another example, the mean roughness of lower surface 1660 and/or inner surface 1631 may be at least about 100 μin (about 2.54 μm), preferably, within a range from about 200 μin (about 5.08 μm) to about 500 μin (about 12.7 μm).

FIGS. 16D-16E depict a cross-sectional view of chamber lid assembly 1632 containing gas dispersing channel 1628 extending through a central portion of lid plate 1670. Gas dispersing channel 1628 is usually positioned to extend perpendicular to a substrate that is positioned below chamber lid assembly 1632 during an ALD process. Gas dispersing channel 1628 extends along central axis 1633 of lid cap 1672, through lid plate 1670, and to lower surface 1660. Gas dispersing channel 1628 further extends pass lower surface 1660 and into reaction zone 1064. Lower surface 1660 extends from gas dispersing channel 1628 to choke 1662. Lower surface 1660 is sized and shaped to substantially cover the substrate that is positioned below chamber lid assembly 1632 during the ALD process.

FIGS. 16A-16E depict chamber lid assembly 1632 configured to expose a substrate to at least two gas sources or chemical precursors. In other examples, chamber lid assembly 1632 may be reconfigured to expose a substrate to a single gas source (as depicted in FIG. 5) or to three or more gas sources or chemical precursors (as depicted in FIG. 6).

Processes gases, as circular gas flow 1620 depicted in FIG. 16E, are forced to make revolutions around central axis 1633 of gas dispersing channel 1628 while passing along central axis 1633. Circular gas flow 1620 may contain a flow pattern, such as a vortex pattern, a helix pattern, a spiral pattern, a twirl pattern, a twist pattern, a coil pattern, a whirlpool pattern, or derivatives thereof. Circular gas flow 1620 may extend at least about 1 revolution around central axis 1633 of gas dispersing channel 1628, preferably, at least about 1.5 revolutions, more preferably, at least about 2 revolutions, more preferably, at least about 3 revolutions, and more preferably, about 4 revolutions or more.

Figure 17A:
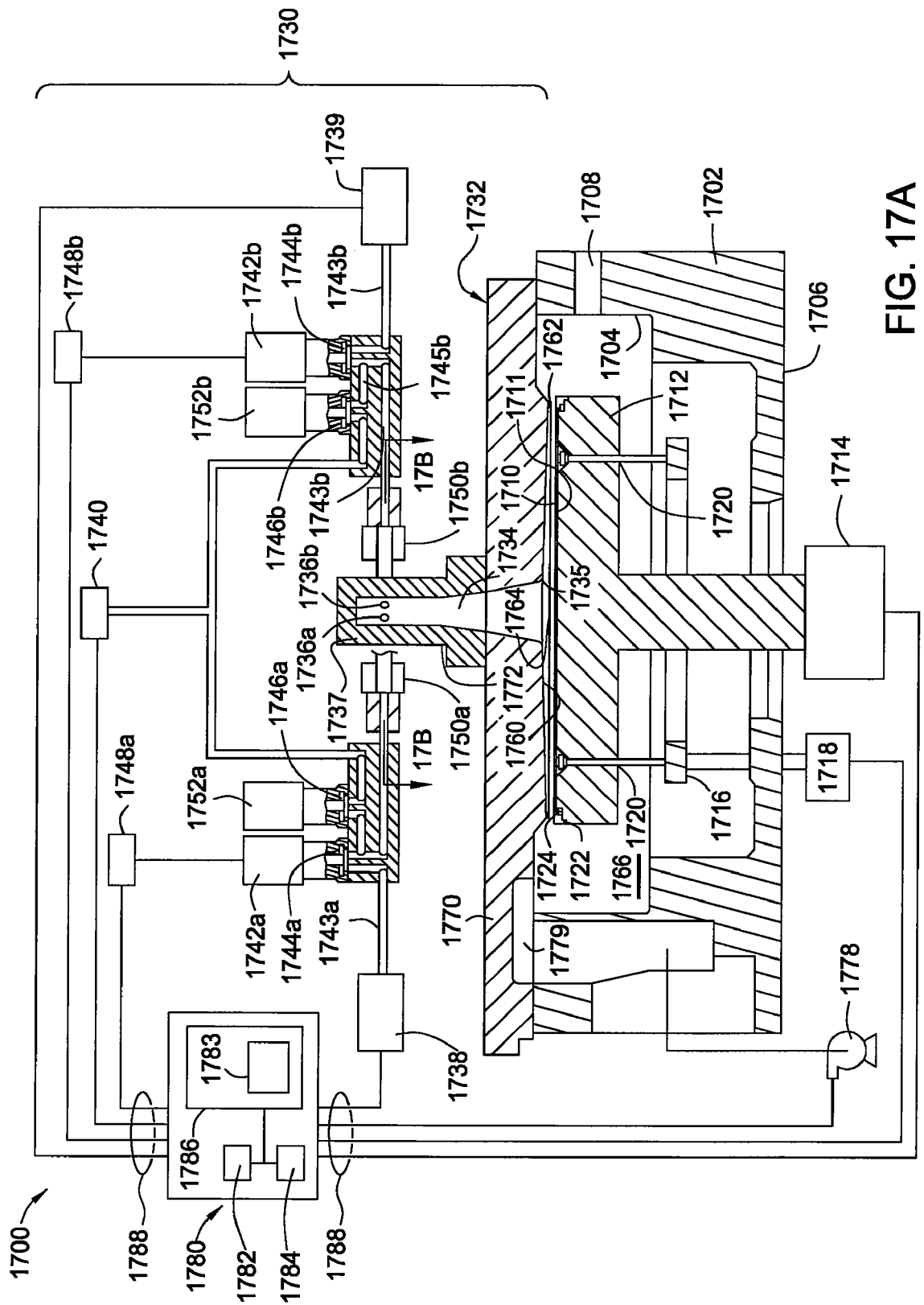
FIGS. 17A-17D depict a schematic cross-sectional view of a process chamber including a lid assembly and a gas delivery apparatus adapted for atomic layer deposition as described in another embodiment herein.

In one embodiment, FIGS. 16A-16E depict gas conduits 1650a, 1650b, and 1650c and gas passageways 1668a and 1668b, which may be positioned in a variety of angles relative to central axis 1633 of gas dispersing channel 1628. Gas conduits 1650a, 1650b, and 1650c and/or gas passageways 1668a and 1668b provide process gases through gas inlets 1638a and 1638b and into gas dispersing channel 1628. Each gas conduit 1650a, 1650b, or 1650c or gas passageway 1668a or 1668b is preferably positioned normal (in which +β, −β=90°) to central axis 1633 or positioned at an angle +β or an angle −β (in which 0°<+β<90° or 0°<−β<90°, as shown in FIG. 17C for central axis 1733) from a center line of each gas conduit 1650a, 1650b, or 1650c or gas passageways 1668a or 1668b to central axis 1633. Therefore, gas conduits 1650a, 1650b, and 1650c and gas passageways 1668a and 1668b may be positioned horizontally normal to central axis 1633 and, may be angled downwardly at an angle +β, or may be angled upwardly at an angle −β to provide a gas flow towards the walls of gas dispersing channel 1628 from gas inlets 1638a and 1638b rather than directly downward towards a substrate which helps reduce the likelihood of blowing off reactants adsorbed on the surface of a substrate.

In addition, the diameter of gas conduits 1650a, 1650b, and 1650c and gas passageways 1668a and 1668b may be increasing from the delivery lines or ALD valves to gas inlets 1638a and 1638b to help reduce the velocity of the gas flow prior to its entry into gas dispersing channel 1628. For example, gas conduits 1650a, 1650b, 1650c and gas passageways 1668a and 1668b may contain an inner diameter which is gradually increasing or may contain a plurality of connected conduits having increasing inner diameters.

FIGS. 16D-16E depict gas dispersing channel 1628 containing an inner diameter which stays substantially constant from upper portion 1637, along central axis 1633, to point 1636, in one embodiment. In an alternative embodiment, gas dispersing channel 1628 containing an inner diameter which stays increases or decreases from upper portion 1637, along central axis 1633, to point 1636 (not shown). However, gas dispersing channel 1628 contains an inner diameter which increases from point 1636, along central axis 1633, to lower portion 1635 adjacent lower surface 1660 of chamber lid assembly 1632.

In one example, chamber lid assembly 1632 adapted to process 300 mm diameter substrates may have the following diameters. The diameter at upper portion 1637 of gas dispersing channel 1628 may be within a range from about 0.5 inches to about 2 inches, preferably, from about 0.75 inches to about 1.5 inches, and more preferably, from 0.8 inches to about 1.2 inches, for example, about 1 inch. The diameter at point 1636 of gas dispersing channel 1628 may be within a range from about 0.5 inches to about 2 inches, preferably, from about 0.75 inches to about 1.5 inches, and more preferably, from 0.8 inches to about 1.2 inches, for example, about 1 inch. The diameter at lower portion 1635 of gas dispersing channel 1628 may be within a range from about 1 inch to about 4 inches, preferably, from about 1.5 inches to about 3 inches, and more preferably, from 1.6 inches to about 2.4 inches, for example, about 2 inches.

In general, the above dimension apply to gas dispersing channel 1628 adapted to provide a total gas flow of between about 500 sccm and about 3,000 sccm. In other specific embodiments, the dimension may be altered to accommodate a certain gas flow therethrough. In general, a larger gas flow will require a larger diameter of gas dispersing channel 1628.

Gas dispersing channel 1628 that gradually tapers is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 1632). Gas dispersing channel 1628 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

In one embodiment, gas inlets 1638a and 1638b are located adjacent upper portion 1637 of gas dispersing channel 1628, as depicted in FIG. 16E. In other embodiments, one or more gas inlets 1638a and 1638b may be located within upper portion 1637 of gas dispersing channel 1628.

Figure 17B:
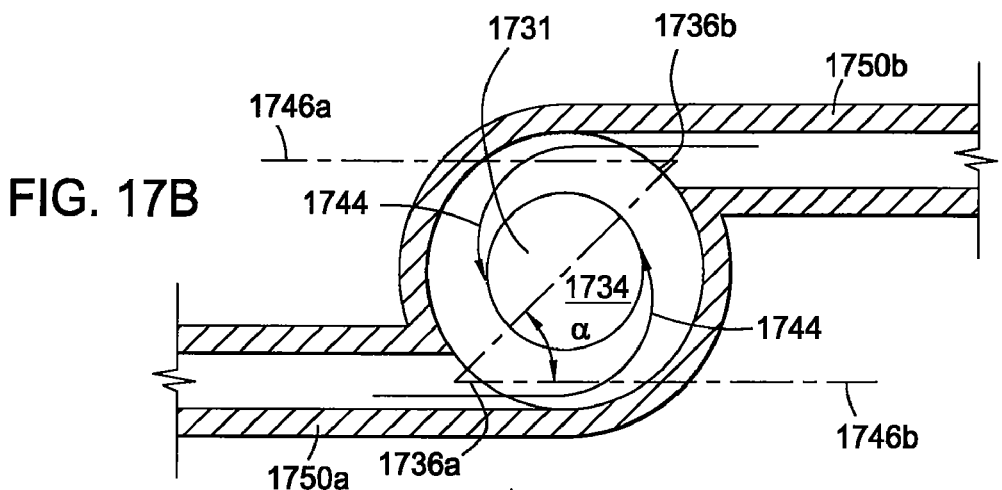
Figure 17C:
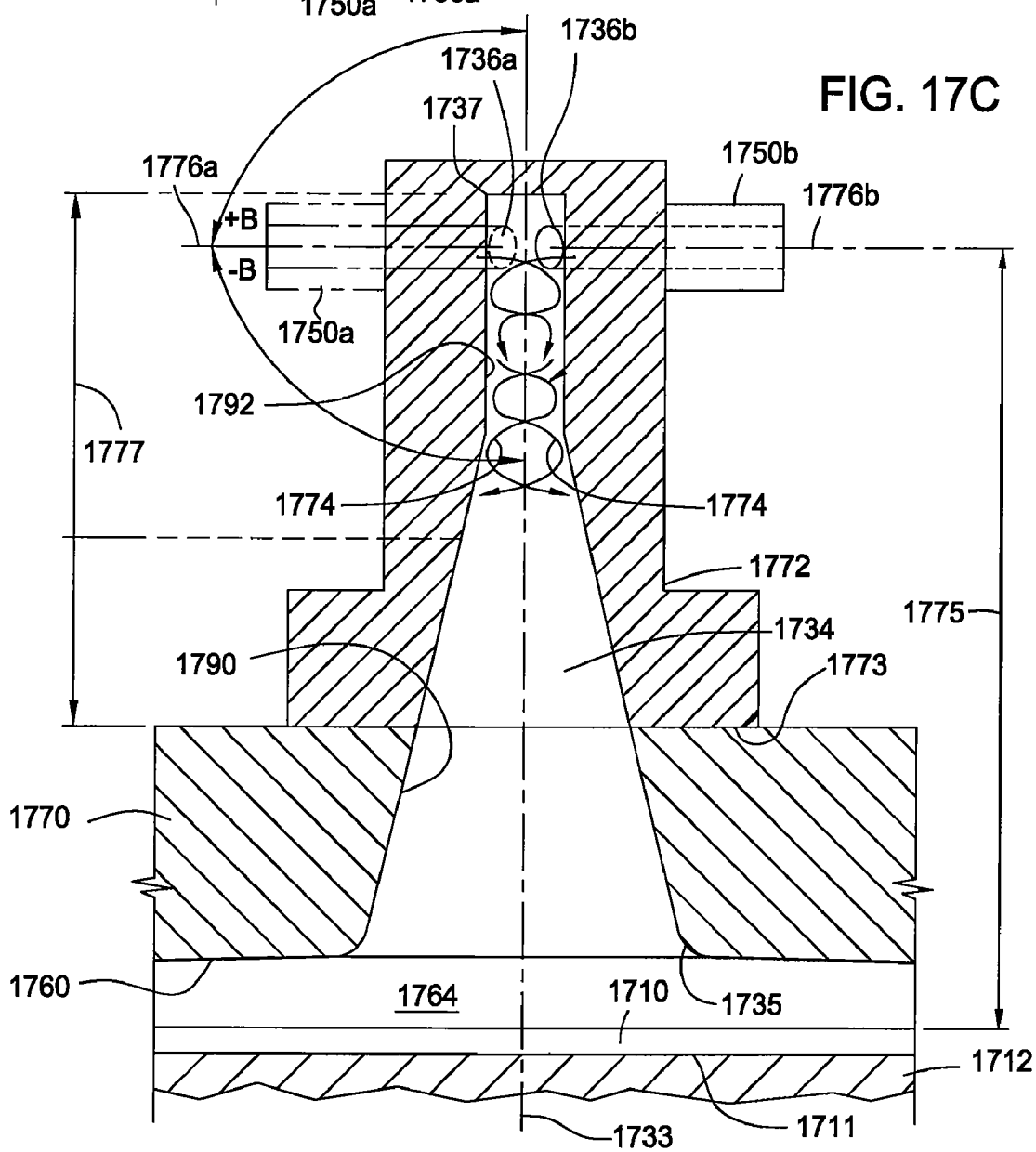

Each gas conduit 1650a, 1650b, and 1650c and gas passageways 1668a and 1668b may be positioned at an angle α from the centerline of the gas conduit and from a radius line of gas dispersing channel 1628, similarly as depicted in FIGS. 17B-17C, of each gas conduits 1750a and 1750b that may be positioned at an angle α from center lines 1776a and 1776b of gas conduits 1750a and 1750b and from radius line from the center of gas dispersing channel 1734. Entry of a gas through gas conduits 1650a, 1650b, and 1650c and gas passageways 1668a and 1668b preferably positioned at an angle α (i.e., when α>0°) causes the gas to flow in a circular direction as shown by circular gas flow 1620 (FIG. 16E). Providing gas at an angle α as opposed to directly straight-on to the walls of the expanding channel (i.e., when α=0°) helps to provide a more laminar flow through gas dispersing channel 1628 rather than a turbulent flow. It is believed that a laminar flow through gas dispersing channel 1628 results in an improved purging of the inner surface of gas dispersing channel 1628 and other surfaces of chamber lid assembly 1632. In comparison, a turbulent flow may not uniformly flow across the inner surface of gas dispersing channel 1628 and other surfaces and may contain dead spots or stagnant spots in which there is no gas flow. In one aspect, gas conduits 1650a, 1650b, and 1650c and gas passageways 1668a and 1668b and corresponding gas inlets 1638a and 1638b, which are spaced out from each other and direct a flow in the same circular direction (i.e., clockwise or counter-clockwise).

Not wishing to be bound by theory, FIG. 16E is a cross-sectional view of gas dispersing channel 1628 of chamber lid assembly 1632 showing simplified representations of gas flows therethrough. Although the exact flow pattern through the gas dispersing channel 1628 is not known, it is believed that circular gas flow 1620 may travel through gas dispersing channel 1628 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. The circular flow may be provided in a "processing region" as opposed to in a compartment separated from a substrate. In one aspect, circular gas flow 1620 may help to establish a more efficient purge of gas dispersing channel 1628 due to the sweeping action of the vortex flow pattern across the inner surface of gas dispersing channel 1628.

FIGS. 16C-16E depict that at least a portion of lower surface 1660 of chamber lid assembly 1632 may be tapered from gas dispersing channel 1628 to a peripheral portion of chamber lid assembly 1632 to help provide an improved velocity profile of a gas flow from gas dispersing channel 1628 across the surface of a substrate (i.e., from the center of the substrate to the edge of the substrate). Lower surface 1660 may contain one or more tapered surfaces, such as a straight surface, a concave surface, a convex surface, or combinations thereof. In one embodiment, lower surface 1660 is tapered in the shape of a funnel.

In one example, lower surface 1660 is downwardly sloping to help reduce the variation in the velocity of the process gases traveling between lower surface 1660 of chamber lid assembly 1632 and a substrate while assisting to provide uniform exposure of the surface of a substrate to a reactant gas. In one embodiment, the ratio of the maximum area of the flow section over the minimum area of the flow section between a downwardly sloping lower surface 1660 of chamber lid assembly 1632 and the surface of a substrate is less than about 2, preferably, less than about 1.5, more preferably, less than about 1.3, and more preferably, about 1.

Not wishing to be bound by theory, it is believed that a gas flow traveling at a more uniform velocity across the surface of a substrate helps provide a more uniform deposition of the gas on a substrate. It is believed that the velocity of the gas is directly proportional to the concentration of the gas which is in turn directly proportional to the deposition rate of the gas on a substrate surface. Thus, a higher velocity of a gas at a first area of the surface of a substrate versus a second area of the surface of a substrate is believed to provide a higher deposition of the gas on the first area. It is believed that chamber lid assembly 1632 having lower surface 1660, downwardly sloping, provides for more uniform deposition of the gas across the surface of a substrate because lower surface 1660 provides a more uniform velocity and, thus, a more uniform concentration of the gas across the surface of a substrate.

FIGS. 16C-16E depict choke 1662 at a peripheral portion of chamber lid assembly 1632 adjacent the periphery of where a substrate may be positioned during an ALD process. Choke 1662, when chamber lid assembly 1632 is assembled to form a processing zone around a substrate, may contain any member restricting the flow of gas therethrough at an area adjacent the periphery of the substrate.

Lid cap 1672, gas conduit 1650*a*, gas conduit cover 1652, and a portion of upper surface of lid plate 1670 may be covered by chamber lid cover 1680 having handles 1682, as illustrated in FIGS. 16B-16D. The temperature of chamber lid assembly 1632 may be controlled by a liquid cooling system attached to a water jacket, such as coolant channel 1690 extending through lid plate 1670. A fluid coolant, such as water, may be passed through coolant channel 1690 to remove heat from lid plate 1670. Coolant connectors 1692*a* and 1692*b* may be connected coolant channel 1670 by a hose or a tube. The other end of coolant connectors 1692*a* and 1692*b* may be connected by a hose or a tube to a fluid source and a fluid return, such as an in-house cooling system or an independent cooling system. Coolant connectors 1692*a* and 1692*b* may be attached to lid plate 1670 by support bracket 1694. Liquids that may be flowed through coolant channel 1670 include water, oil, alcohols, glycols, glycol ethers, or other organic solvents. In one embodiment, the temperature of lid plate 1670 or chamber lid assembly 1632 may be maintained at a predetermined temperature within a range from about 0° C. to about 100° C., preferably, from about 18° C. to about 65° C., and more preferably, from about 20° C. to about 50° C.

FIGS. 17A-17D are schematic views of one embodiment of process chamber 1700 containing gas delivery system 1730 adapted for ALD processes. Process chamber 1700 contains chamber body 1702 having sidewalls 1704 and bottom 1706. Slit valve 1708 in process chamber 1700 provides access for a robot (not shown) to deliver and retrieve substrate 1710, such as a 200 mm or 300 mm semiconductor wafer or a glass substrate, to and from process chamber 1700.

Substrate support 1712 supports substrate 1710 on substrate receiving surface 1711 in process chamber 1700. Substrate support 1712 is mounted to lift motor 1714 for raising and lowering substrate support 1712 and substrate 1710 disposed thereon. Lift plate 1716 connected to lift motor 1718 is mounted in process chamber 1700 and raises and lowers lift pins 1720 movably disposed through substrate support 1712. Lift pins 1720 raise and lower substrate 1710 over the surface of substrate support 1712. Substrate support 1712 may include a vacuum chuck (not shown), an electrostatic chuck (not shown), or a clamp ring (not shown) for securing substrate 1710 to substrate support 1712 during a deposition process.

The temperature of substrate support 1712 may be adjusted to control the temperature of substrate 1710 disposed thereon. For example, substrate support 1712 may be heated using an embedded heating element, such as a resistive heater (not shown), or may be heated using radiant heat, such as heating lamps (not shown) disposed above substrate support 1712. Purge ring 1722 may be disposed on substrate support 1712 to define purge channel 1724 which provides a purge gas to a peripheral portion of substrate 1710 to prevent deposition thereon.

Gas delivery system 1730 is disposed at an upper portion of chamber body 1702 to provide a gas, such as a process gas and/or a purge gas, to process chamber 1700. FIGS. 17A-17D depict gas delivery system 1730 configured to expose substrate 1710 to at least two gas sources or chemical precursors. In other examples, gas delivery system 1730 may be reconfigured to expose substrate 1710 to a single gas source (as depicted in FIG. 5) or to three or more gas sources or chemical precursors (as depicted in FIG. 6). Vacuum system 1778 is in communication with pumping channel 1779 to evacuate any desired gases from process chamber 1700 and to help maintain a desired pressure or a desired pressure range inside pumping zone 1766 of process chamber 1700.

In one embodiment, gas delivery system 1730 contains chamber lid assembly 1732 having gas dispersing channel 1734 extending through a central portion of chamber lid assembly 1732. Lid cap 1772 may contain a cylindrical portion of gas dispersing channel 1734, such as narrow portion 1754. Lid cap 1772 also contains a diverging or expanding portion of gas dispersing channel 1734, such as in expanding portion 1756. Gas dispersing channel 1734 extends towards substrate receiving surface 1711 and along central axis 1733 of gas dispersing channel 1734, through lid plate 1770, and to lower surface 1760. In one example, a portion of gas dispersing channel 1734 stays substantially cylindrical along central axis 1733 within upper portion 1737 and a portion of gas dispersing channel 1734 that tapers away from central axis 1733 within lower portion 1735 of gas dispersing channel 1734. Gas dispersing channel 1734 further extends pass lower surface 1760 and into reaction zone 1764. Lower surface 1760 extends from lower portion 1735 of gas dispersing channel 1734 to choke 1762. Lower surface 1760 is sized and shaped to substantially cover substrate 1710 disposed on substrate receiving surface 1711 of substrate support 1712.

Processes gases, as circular gas flow 1774, are forced to make revolutions around central axis 1733 of gas dispersing channel 1734 while passing along central axis 1733. Circular gas flow 1774 may contain a flow pattern, such as a vortex pattern, a helix pattern, a spiral pattern, a twirl pattern, a twist pattern, a coil pattern, a whirlpool pattern, or derivatives thereof. Circular gas flow 1774 may extend at least about 1 revolution around central axis 1733 of gas dispersing channel 1734, preferably, at least about 1.5 revolutions, more preferably, at least about 2 revolutions, more preferably, at least about 3 revolutions, and more preferably, about 4 revolutions or more.

Gas dispersing channel 1734 has gas inlets 1736a, 1736b to provide gas flows from two similar pairs of valves 1742a/1752a, 1742b/1752b, which may be provided together and/or separately. In one configuration, valve 1742a and valve 1742b are coupled to separate reactant gas sources but are preferably coupled to the same purge gas source. For example, valve 1742a is coupled to reactant gas source 1738 and valve 1742b is coupled to reactant gas source 1739, and both valves 1742a, 1742b are coupled to purge gas source 1740. Each valve 1742a, 1742b includes delivery line 1743a, 1743b having valve seat assembly 1744a, 1744b and each valve 1752a, 1752b includes purge line 1745a, 1745b having valve seat assembly 1746a, 1746b. Delivery line 1743a, 1743b is in fluid communication with reactant gas source 1738, 1739 and is in fluid communication with gas inlet 1736a, 1736b of gas dispersing channel 1734. Valve seat assembly 1744a, 1744b of the delivery line 1743a, 1743b controls the flow of the reactant gas from reactant gas source 1738, 1739 to gas dispersing channel 1734. Purge line 1745a, 1745b is in fluid communication with purge gas source 1740 and intersects delivery line 1743a, 1743b downstream of valve seat assembly 1744a, 1744b of delivery line 1743a, 1743b. Valve seat assembly 1746a, 1746b of purge line 1745a, 1745b controls the flow of the purge gas from purge gas source 1740 to gas dispersing channel 1734. If a carrier gas is used to deliver reactant gases from reactant gas source 1738, 1739, preferably the same gas is used as a carrier gas and a purge gas (i.e., an argon gas used as a carrier gas and a purge gas).

Each valve seat assembly 1744a, 1744b, 1746a, 1746b may contain a diaphragm (not shown) and a valve seat (not shown). The diaphragm may be biased open or closed and may be actuated closed or open respectively. The diaphragms may be pneumatically actuated or may be electrically actuated. Pneumatically actuated valves include pneumatically actuated valves available from Fujikin, Inc. and Veriflo Division, Parker Hannifin, Corp. Electrically actuated valves include electrically actuated valves available from Fujikin, Inc. For example, an ALD valve that may be used is the Fujikin Model No. FPR-UDDFAT-21-6.35-PI-ASN or the Fujikin Model No. FPR-NHDT-21-6.35-PA-AYT. Programmable logic controllers 1748a, 1748b may be coupled to valves 1742a, 1742b to control actuation of the diaphragms of valve seat assemblies 1744a, 1744b, 1746a, 1746b of valves 1742a, 1742b. Pneumatically actuated valves may provide pulses of gases in time periods as low as about 0.020 seconds. Electrically actuated valves may provide pulses of gases in time periods as low as about 0.005 seconds. An electrically actuated valve typically requires the use of a driver coupled between the valve and the programmable logic controller.

Each valve 1742a, 1742b may be a zero dead volume valve to enable flushing of a reactant gas from delivery line 1743a, 1743b when valve seat assembly 1744a, 1744b is closed. For example, purge line 1745a, 1745b may be positioned adjacent valve seat assembly 1744a, 1744b of delivery line 1743a, 1743b. When valve seat assembly 1744a, 1744b is closed, purge line 1745a, 1745b may provide a purge gas to flush delivery line 1743a, 1743b. In one embodiment, purge line 1745a, 1745b is positioned slightly spaced from valve seat assembly 1744a, 1744b of delivery line 1743a, 1743b so that a purge gas is not directly delivered into valve seat assembly 1744a, 1744b when open. A zero dead volume valve as used herein is defined as a valve which has negligible dead volume (i.e., not necessary zero dead volume).

Each valve pair 1742a/1752a, 1742b/1752b may be adapted to provide a combined gas flow and/or separate gas flows of the reactant gas and the purge gas. In reference to valve pair 1742a/1752a, one example of a combined gas flow of the reactant gas and the purge gas includes a continuous flow of a purge gas from purge gas source 1740 through purge line 1745a and pulses of a reactant gas from reactant gas source 1738 through delivery line 1743a. The continuous flow of the purge gas may be provided by leaving the diaphragm of valve seat assembly 1746a of purge line 1745a open. The pulses of the reactant gas from reactant gas source 1738 may be provided by opening and closing the diaphragm of valve seat assembly 1744a of delivery line 1743a. In reference to valve pair 1742a/1752a, one example of separate gas flows of the reactant gas and the purge gas includes pulses of a purge gas from purge gas source 1740 through purge line 1745a and pulses of a reactant gas from reactant gas source 1738 through delivery line 1743a. The pulses of the purge gas may be provided by opening and closing the diaphragm of valve seat assembly 1746a of purge line 1745a. The pulses of the reactant gas from reactant gas source 1738 may be provided by opening and closing the diaphragm of valve seat assembly 1744a of delivery line 1743a.

Delivery lines 1743a, 1743b of valves 1742a, 1742b may be coupled to gas inlets 1736a, 1736b through gas conduits 1750a, 1750b. Gas conduits 1750a, 1750b may be integrated or may be separate from valves 1742a, 1742b. In one aspect, valves 1742a, 1742b are coupled in close proximity to gas dispersing channel 1734 to reduce any unnecessary volume of delivery line 1743a, 1743b and gas conduits 1750a, 1750b between valves 1742a, 1742b and gas inlets 1736a, 1736b.

Not wishing to be bound by theory, it is believed that the diameter of gas dispersing channel 1734, which is constant from upper portion 1737 of gas dispersing channel 1734 to some point along central axis 1733 and increasing from this point to lower portion 1735 of gas dispersing channel 1734, allows less of an adiabatic expansion of a gas through gas dispersing channel 1734 which helps to control the temperature of the process gas contained in circular flow gas 1774. For instance, a sudden adiabatic expansion of a gas delivered through gas inlet 1736a, 1736b into gas dispersing channel 1734 may result in a drop in the temperature of the gas which may cause condensation of the gas and formation of droplets. On the other hand, gas dispersing channel 1734 that gradually tapers is believed to provide less of an adiabatic expansion of a gas. Therefore, more heat may be transferred to or from the gas, and, thus, the temperature of the gas may be more easily controlled by controlling the surrounding temperature of the gas (i.e., controlling the temperature of chamber lid assembly 1732). Gas dispersing channel 1734 may gradually taper and contain one or more tapered inner surfaces, such as a tapered straight surface, a concave surface, a convex surface, or combinations thereof or may contain sections of one or more tapered inner surfaces (i.e., a portion tapered and a portion non-tapered).

In one embodiment, gas inlets 1736a, 1736b are located adjacent upper portion 1737 of gas dispersing channel 1734.

In other embodiments, one or more gas inlets 1736a, 1736b may be located along the length of gas dispersing channel 1734 between upper portion 1737 and lower portion 1735.

FIG. 17B illustrates that each gas conduit 1750a, 1750b may be positioned at an angle α from center lines 1776a and 1776b to central axis 1733 of gas dispersing channel 1734. Entry of a gas through gas conduit 1750a, 1750b preferably positioned at an angle α (i.e., when α>0°) causes the gas to flow in a circular direction as shown by circular gas flow 1774. Providing gas at an angle α as opposed to directly straight-on to the walls of the expanding channel (i.e., when α=0°) helps to provide a more laminar flow through gas dispersing channel 1734 rather than a turbulent flow. It is believed that a laminar flow through gas dispersing channel 1734 results in an improved purging of the inner surface of gas dispersing channel 1734 and other surfaces of chamber lid assembly 1732. In comparison, a turbulent flow may not uniformly flow across the inner surface of gas dispersing channel 1734 and other surfaces and may contain dead spots or stagnant spots in which there is no gas flow. In one aspect, gas conduits 1750a, 1750b and corresponding gas inlets 1736a, 1736b are spaced out from each other and direct a flow in the same circular direction (i.e., clockwise or counter-clockwise).

FIG. 17C illustrates that each gas conduit 1750a or 1750b or gas inlet 1736a or 1736b may be positioned in any relationship to central axis 1733 of gas dispersing channel 1734. Each gas conduits 1750a or 1750b and gas inlet 1736a, 1736b are preferably positioned normal (in which +β, −β=90°) to the central axis 1733 or positioned at an angle +β or an angle −β (in which 0°<+β<90° or 0°<−β<90°) from the center line 1776a, 1776b of gas conduits 1750a and 1750b to the central axis 1733. Therefore, gas conduits 1750a and 1750b may be positioned horizontally normal to the central axis 1733 as shown in FIG. 17C, may be angled downwardly at an angle +β, or may be angled upwardly at an angle −β to provide a gas flow towards the walls of gas dispersing channel 1734 rather than directly downward towards substrate 1710 which helps reduce the likelihood of blowing off reactants adsorbed on the surface of substrate 1710. In addition, the diameter of gas conduits 1750a, 1750b may be increasing from delivery lines 1743a, 1743b of valves 1742a, 1742b to gas inlet 1736a, 1736b to help reduce the velocity of the gas flow prior to its entry into gas dispersing channel 1734. For example, gas conduits 1750a, 1750b may contain an inner diameter which is gradually increasing or may contain a plurality of connected conduits having increasing inner diameters.

Not wishing to be bound by theory, FIG. 17C is a cross-sectional view of gas dispersing channel 1734 of chamber lid assembly 1732 showing simplified representations of gas flows therethrough. Although the exact flow pattern through the gas dispersing channel 1734 is not known, it is believed that circular gas flow 1774 (FIG. 17C) may travel through gas dispersing channel 1734 with a circular flow pattern, such as a vortex flow, a helix flow, a spiral flow, a swirl flow, a twirl flow, a twist flow, a coil flow, a corkscrew flow, a curl flow, a whirlpool flow, derivatives thereof, or combinations thereof. As shown in FIG. 17C, the circular flow may be provided in a "processing region" as opposed to in a compartment separated from substrate 1710. In one aspect, circular gas flow 1774 may help to establish a more efficient purge of gas dispersing channel 1734 due to the sweeping action of the vortex flow pattern across the inner surface of gas dispersing channel 1734.

In one embodiment, FIG. 17C depicts distance 1775 between center lines 1776a and 1776b of gas conduits 1750a and 1750b and the surface of substrate 1710. Distance 1777 is illustrated between upper portion 1737 of gas dispersing channel 1734 and lower surface 1773 of lid cap 1772. Distances 1775 and 1777 are long enough that circular gas flow 1774 dissipates to a downwardly flow as a spiral flow across the surface of substrate 1710 may not be desirable. It is believed that circular gas flow 1774 proceeds in a laminar manner efficiently purging the surface of chamber lid assembly 1732 and substrate 1710. In one embodiment, the length of distance 1777 is within a range from about 4 inches to about 8 inches, preferably, from about 4.5 inches to about 7 inches, and more preferably, from about 5 inches to about 6 inches, such as about 5.5 inches. In another embodiment, the length of distance 1775 or gas dispersing channel 1734 extending along central axis 1733 is within a range from about 5 inches to about 12 inches, preferably, from about 6 inches to about 10 inches, and more preferably, from about 7 inches to about 9 inches, such as about 8 inches.

FIGS. 17A and 17C depict that at least a portion of lower surface 1760 of chamber lid assembly 1732 may be tapered from gas dispersing channel 1734 to a peripheral portion of chamber lid assembly 1732 to help provide an improved velocity profile of a gas flow from gas dispersing channel 1734 across the surface of substrate 1710 (i.e., from the center of the substrate to the edge of the substrate). Lower surface 1760 may contain one or more tapered surfaces, such as a straight surface, a concave surface, a convex surface, or combinations thereof. In one embodiment, lower surface 1760 is tapered in the shape of a funnel.

In one example, lower surface 1760 is downwardly sloping to help reduce the variation in the velocity of the process gases traveling between lower surface 1760 of chamber lid assembly 1732 and substrate 1710 while assisting to provide uniform exposure of the surface of substrate 1710 to a reactant gas. In one embodiment, the ratio of the maximum area of the flow section over the minimum area of the flow section between a downwardly sloping lower surface 1760 of chamber lid assembly 1732 and the surface of substrate 1710 is less than about 2, preferably, less than about 1.5, more preferably, less than about 1.3, and more preferably, about 1.

Not wishing to be bound by theory, it is believed that a gas flow traveling at a more uniform velocity across the surface of substrate 1710 helps provide a more uniform deposition of the gas on substrate 1710. It is believed that the velocity of the gas is directly proportional to the concentration of the gas which is in turn directly proportional to the deposition rate of the gas on substrate 1710 surface. Thus, a higher velocity of a gas at a first area of the surface of substrate 1710 versus a second area of the surface of substrate 1710 is believed to provide a higher deposition of the gas on the first area. It is believed that chamber lid assembly 1732 having lower surface 1760, downwardly sloping, provides for more uniform deposition of the gas across the surface of substrate 1710 because lower surface 1760 provides a more uniform velocity and, thus, a more uniform concentration of the gas across the surface of substrate 1710.

FIG. 17A depicts choke 1762 located at a peripheral portion of chamber lid assembly 1732 adjacent the periphery of substrate 1710. Choke 1762, when chamber lid assembly 1732 is assembled to form a processing zone around substrate 1710, contains any member restricting the flow of gas therethrough at an area adjacent the periphery of substrate 1710.

In one specific embodiment, the spacing between choke 1762 and substrate support 1712 is between about 0.04 inches and about 2.0 inches, and preferably between 0.04 inches and about 0.2 inches. The spacing may vary depending on the gases being delivered and the process conditions during deposition. Choke 1762 helps provide a more uniform pressure distribution within the volume or reaction zone 1764 defined between chamber lid assembly 1732 and substrate 1710 by isolating reaction zone 1764 from the non-uniform pressure distribution of pumping zone 1766.

Referring to FIG. 17A, in one aspect, since reaction zone 1764 is isolated from pumping zone 1766, a reactant gas or purge gas needs only adequately fill reaction zone 1764 to ensure sufficient exposure of substrate 1710 to the reactant gas or purge gas. In conventional chemical vapor deposition, prior art chambers are required to provide a combined flow of reactants simultaneously and uniformly to the entire surface of the substrate in order to ensure that the co-reaction of the reactants occurs uniformly across the surface of substrate 1710. In atomic layer deposition, process chamber 1700 sequentially introduces reactants to the surface of substrate 1710 to provide absorption of alternating thin layers of the reactants onto the surface of substrate 1710. As a consequence, atomic layer deposition does not require a flow of a reactant which reaches the surface of substrate 1710 simultaneously. Instead, a flow of a reactant needs to be provided in an amount which is sufficient to adsorb a thin layer of the reactant on the surface of substrate 1710.

Since reaction zone 1764 may contain a smaller volume when compared to the inner volume of a conventional CVD chamber, a smaller amount of gas is required to fill reaction zone 1764 for a particular process in an atomic layer deposition sequence. For example, in one embodiment, the volume of reaction zone 1764 is about 1,000 $cm^3$ or less, preferably 500 $cm^3$ or less, and more preferably 200 $cm^3$ or less for a chamber adapted to process 200 mm diameter substrates. In one embodiment, the volume of reaction zone 1764 is about 3,000 $cm^3$ or less, preferably 1,500 $cm^3$ or less, and more preferably 600 $cm^3$ or less for a chamber adapted to process 300 mm diameter substrates. In one embodiment, substrate support 1712 may be raised or lowered to adjust the volume of reaction zone 1764 for deposition. Because of the smaller volume of reaction zone 1764, less gas, whether a deposition gas or a purge gas, is necessary to be flowed into process chamber 1700. Therefore, the throughput of process chamber 1700 is greater and the waste may be minimized due to the smaller amount of gas used reducing the cost of operation.

Chamber lid assembly 1732 has been shown in FIGS. 17A-17D as containing lid cap 1772 and lid plate 1770 in which lid cap 1772 and lid plate 1770 form gas dispersing channel 1734. An additional plate may be optionally disposed between lid plate 1770 and lid cap 1772 (not shown). The additional plate may be used to adjust (e.g., increase) the distance between lid cap 1772 and lid plate 1770 therefore respectively changing the length of gas dispersing channel 1734 formed therethrough. In another embodiment, the optional additional plate disposed between lid plate 1770 and lid cap 1772 contains stainless steel. In other embodiments, gas dispersing channel 1734 may be made integrally from a single piece of material.

Chamber lid assembly 1732 may include cooling elements and/or heating elements depending on the particular gas being delivered therethrough. Controlling the temperature of chamber lid assembly 1732 may be used to prevent gas decomposition, deposition, or condensation on chamber lid assembly 1732. For example, water channels (such as coolant channel 1690 shown in FIG. 16A) may be formed in chamber lid assembly 1732 to cool chamber lid assembly 1732. In another example, heating elements (not shown) may be embedded or may surround components of chamber lid assembly 1732 to heat chamber lid assembly 1732. In one embodiment, components of chamber lid assembly 1732 may be individually heated or cooled. For example, referring to FIG. 17A, chamber lid assembly 1732 may contain lid plate 1770 and lid cap 1772 in which lid plate 1770 and lid cap 1772 form gas dispersing channel 1734. Lid cap 1772 may be maintained at one temperature range and lid plate 1770 may be maintained at another temperature range. For example, lid cap 1772 may be heated by being wrapped in heater tape or by using another heating device to prevent condensation of reactant gases and lid plate 1770 may be maintained at ambient temperature. In another example, lid cap 1772 may be heated and lid plate 1770 may be cooled with water channels formed therethrough to prevent thermal decomposition of reactant gases on lid plate 1770.

The components and parts of chamber lid assembly 1732 may contain materials such as stainless steel, aluminum, nickel-plated aluminum, nickel, alloys thereof, or other suitable materials. In one embodiment, lid cap 1772 and lid plate 1770 may be independently fabricated, machined, forged, or otherwise made from a metal, such as aluminum, an aluminum alloy, steel, stainless steel, alloys thereof, or combinations thereof.

FIG. 17A depicts control unit 1780, such as a programmed personal computer, work station computer, or the like, coupled to process chamber 1700 to control processing conditions. For example, control unit 1780 may be configured to control flow of various process gases and purge gases from gas sources 1738, 1739, and 1740 through valves 1742*a* and 1742*b* during different stages of a substrate process sequence. Illustratively, control unit 1780 contains central processing unit (CPU) 1782, support circuitry 1784, and memory 1786 containing associated control software 1783.

Control unit 1780 may be one of any form of general purpose computer processor that can be used in an industrial setting for controlling various chambers and sub-processors. CPU 1782 may use any suitable memory 1786, such as random access memory, read only memory, floppy disk drive, hard disk, or any other form of digital storage, local or remote. Various support circuits may be coupled to CPU 1782 for supporting process chamber 1700. Control unit 1780 may be coupled to another controller that is located adjacent individual chamber components, such as programmable logic controllers 1748*a*, 1748*b* of valves 1742*a*, 1742*b*. Bi-directional communications between the control unit 1780 and various other components of process chamber 1700 are handled through numerous signal cables collectively referred to as signal buses 1788, some of which are illustrated in FIG. 17A. In addition to control of process gases and purge gases from gas sources 1738, 1739, 1740 and from programmable logic controllers 1748*a*, 1748*b* of valves 1742*a*, 1742*b*, control unit 1780 may be configured to be responsible for automated control of other activities used in wafer processing—such as wafer transport, temperature control, chamber evacuation, among other activities, some of which are described elsewhere herein.

Referring to FIGS. 17A-17C, in operation, substrate 1710 is delivered to process chamber 1700 through slit valve 1708 by a robot (not shown). Substrate 1710 is positioned on substrate support 1712 through cooperation of lift pins 1720 and the robot. Substrate support 1712 raises substrate 1710 into close opposition to lower surface 1760 of chamber lid assembly 1732. A first gas flow may be injected into gas dispersing channel 1734 of process chamber 1700 by valve 1742*a* together or separately (i.e., pulses) with a second gas flow injected into process chamber 1700 by valve 1742*b*. The first gas flow may contain a continuous flow of a purge gas from purge gas source 1740 and pulses of a reactant gas from reactant gas source 1738 or may contain pulses of a reactant gas from reactant gas source 1738 and pulses of a purge gas from purge gas source 1740. The second gas flow may contain a continuous flow of a purge gas from purge gas source 1740 and pulses of a reactant gas from reactant gas source 1739 or may contain pulses of a reactant gas from reactant gas source 1739 and pulses of a purge gas from purge gas source 1740. Circular gas flow 1774 travels through gas dispersing channel 1734 as a vortex flow which provides a sweeping action across the inner surface of gas dispersing channel 1734. Circular gas flow 1774 dissipates to a downwardly flow towards the surface of substrate 1710. The velocity of the gas flow reduces as it travels through gas dispersing channel 1734. The gas flow then travels across the surface of substrate 1710 and across lower surface 1760 of chamber lid assembly 1732. Lower surface 1760 of chamber lid assembly 1732, which is downwardly sloping, helps reduce the variation of the velocity of the gas flow across the surface of substrate 1710. The gas flow then travels by choke 1762 and into pumping zone 1766 of process chamber 1700. Excess gas, by-products, etc. flow into the pumping channel 1779 and are then exhausted from process chamber 1700 by vacuum system 1778. In one aspect, the gas flow proceeds through gas dispersing channel 1734 and between the surface of substrate 1710 and lower surface 1760 of chamber lid assembly 1732 in a laminar manner which aids in uniform exposure of a reactant gas to the surface of substrate 1710 and efficient purging of inner surfaces of chamber lid assembly 1732.

Process chamber 1700, as illustrated in FIGS. 17A-17D, has been described herein as having a combination of features. In one aspect, process chamber 1700 provides reaction zone 1764 containing a small volume in compared to a conventional CVD chamber. Process chamber 1700 requires a smaller amount of a gas, such as a reactant gas or a purge gas, to fill reaction zone 1764 for a particular process. In another aspect, process chamber 1700 provides chamber lid assembly 1732 having a downwardly sloping or funnel shaped lower surface 1760 to reduce the variation in the velocity profile of a gas flow traveling between the bottom surface of chamber lid assembly 1732 and substrate 1710. In still another aspect, process chamber 1700 provides gas dispersing channel 1734 to reduce the velocity of a gas flow introduced therethrough. In still another aspect, process chamber 1700 provides gas conduits at an angle α from the center of gas dispersing channel 1734. Process chamber 1700 provides other features as described elsewhere herein. Other embodiments of a chamber adapted for atomic layer deposition incorporate one or more of these features.

In some embodiments, gas dispersing channel 1734 within process chamber 1700 may have roughened or machined surfaces to produce more surface area across the surfaces. Roughened surfaces provide better adhesion of undesired accumulated materials on inner surface 1790 of lid cap 1772 and lower surface 1760 of lid plate 1770. The undesired films are usually formed as a consequence of conducting a vapor deposition process and may peel or flake from inner surface 1790 and lower surface 1760 to contaminate substrate 1710.

Figure 17D:
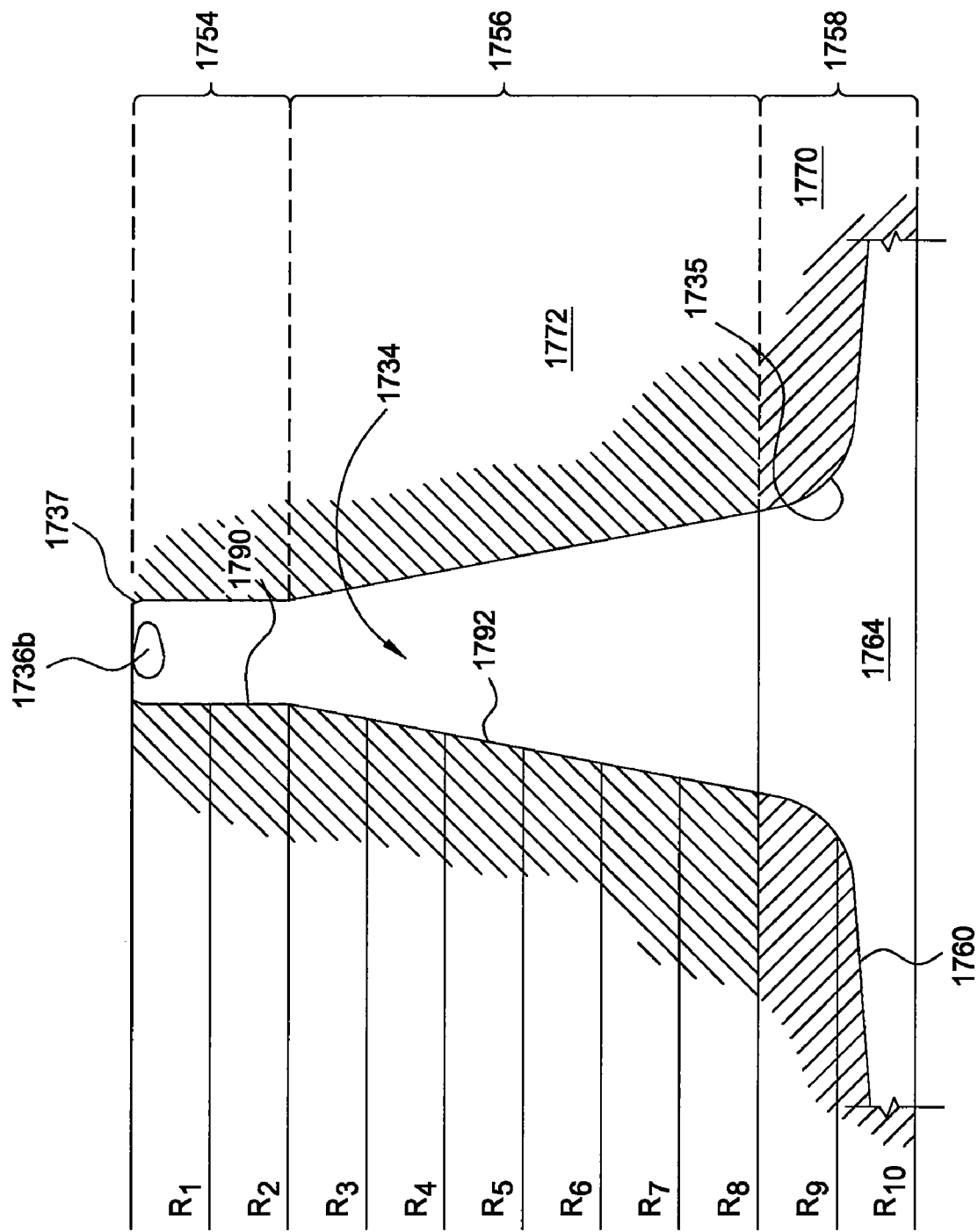

In another embodiment, multiple surfaces form a gradient of roughened surfaces across regions $R_1$ to $R_{10}$ on inner surfaces 1790 and 1792 of lid cap 1772 and lower surface 1760 of lid plate 1770, as depicted in FIG. 17D. For example, narrow portion 1754 of lid cap 1772 contains inner surface 1790 and is depicted in regions $R_1$ to $R_2$. Expanding portion 1756 of lid cap 1772 contains inner surface 1792 and is depicted in regions $R_3$ to $R_8$. Also, lower portion 1758 of lid plate 1770 contains lower surface 1760 and is depicted in regions $R_9$ to $R_{10}$.

In some embodiments, a mean surface roughness of gas dispersing channel 1734 may increase along central axis 1733, for example, from $R_1$ to $R_{10}$. In another example, the mean surface roughness of gas dispersing channel 1734 may increase from gas inlets 1736a and 1736b extending along central axis 1733 towards substrate receiving surface 1711. In another example, the mean surface roughness of gas dispersing channel 1734 may increase from inner surface 1790 to inner surface 1792 and further to lower surface 1760. In another example, the mean surface roughness of gas dispersing channel 1734 may increase from upper portion 1737 to lower portion 1735.

In one embodiment, narrow portion 1754 of lid cap 1772 contains inner surface 1790 having a mean roughness ($R_a$) of at least about 10 μin (about 0.254 μm), such as within a range from about 10 μin (about 0.254 μm) to about 50 μin (about 1.27 μm), preferably, from about 20 μin (about 0.508 μm) to about 45 μin (about 1.143 μm), and more preferably, from about 30 μin (about 0.762 μm) to about 40 μin (about 1.016 μm). Expanding portion 1756 of lid cap 1772 contains inner surface 1792 having a mean roughness of at least about 35 μin (about 0.89 μm), such as within a range from about 35 μin (about 0.89 μm) to about 70 μin (about 1.78 μm), preferably, from about 40 μin (about 1.016 μm) to about 65 μin (about 1.65 μm), and more preferably, from about 45 μin (about 1.143 μm) to about 60 μin (about 1.52 μm). Lower portion 1758 of lid plate 1770 contains lower surface 1760 having a mean roughness of at least about 35 μin (about 0.89 μm), such as within a range from about 35 μin (about 0.89 μm) to about 70 μin (about 1.78 μm), preferably, from about 40 μin (about 1.016 μm) to about 65 μin (about 1.65 μm), and more preferably, from about 45 μin (about 1.143 μm) to about 60 μin (about 1.52 μm).

In one example, narrow portion 1754 of lid cap 1772 contains region $R_1$ having an $R_a$ of inner surface 1790 within a range from about 32 μin to about 36 μin, such as about 34 μin, and region $R_2$ having an $R_a$ of inner surface 1790 within a range from about 34 μin to about 42 μin, such as about 38 μin. Expanding portion 1756 of lid cap 1772 contains region $R_3$ having an $R_a$ of inner surface 1792 within a range from about 40 μin to about 50 μin, such as about 45 μin, region $R_4$ having an $R_a$ of inner surface 1790 within a range from about 44 μin to about 60 μin, such as about 51 μin, region $R_5$ having an $R_a$ of inner surface 1792 within a range from about 48 μin to about 68 μin, such as about 58 μin, region $R_6$ having an $R_a$ of inner surface 1790 within a range from about 46 μin to about 64 μin, such as about 55 μin, region $R_7$ having an $R_a$ of inner surface 1792 within a range from about 48 μin to about 68 μin, such as about 57 μin, and region $R_8$ having an $R_a$ of inner surface 1790 within a range from about 48 μin to about 68 μin, such as about 57 μin. Also, lower portion 1758 of lid plate 1770 contains region $R_9$ having an $R_a$ of lower surface 1760 within a range from about 46 μin to about 64 μin, such as about 55 μin, and region $R_{10}$ having an $R_a$ of lower surface 1760 within a range from about 46 μin to about 64 μin, such as about 55 μin.

FIGS. 18A-18H depict schematic views of chamber lid caps adapted for ALD processes as described in alternative embodiments herein. The gas delivery assemblies 1800a, 1800c, 1800e, and 1800g may be advantageously used to implement ALD processes and may be incorporated with other embodiments described herein, such as process chambers 200, 800, and 900 with gas delivery systems 230, 830, and 930 as described in FIGS. 1-8, or chamber lid assemblies 1032, 1232, and 1632 and process chambers 1100, 1500, and 1700 as described in FIGS. 10A-17D.

Figure 18A:
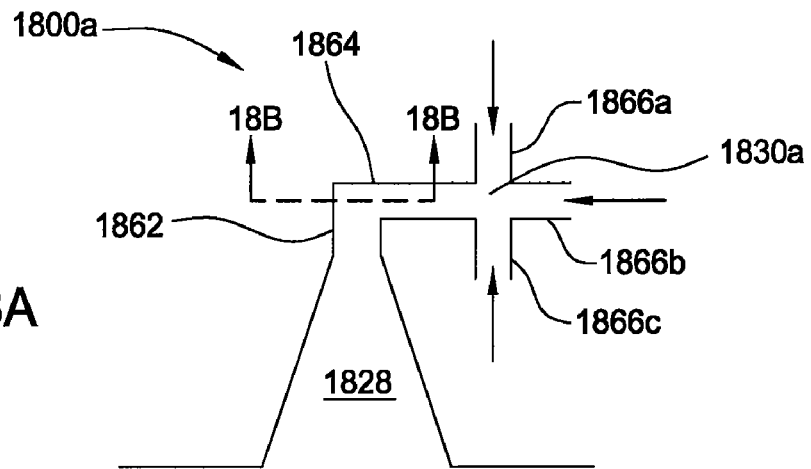
FIGS. 18A-18H depict schematic views of chamber lid caps adapted for atomic layer deposition as described in alternative embodiments herein.
Figure 18B:
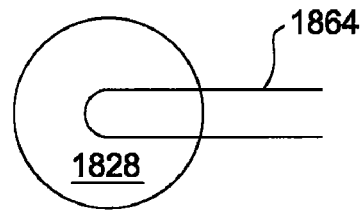

FIGS. 18A-18B depict gas delivery assembly 1800a containing main gas conduit 1864 coupled to and in fluid communication with gas inlet 1862, as described in one embodiment. Gas inlet 1862 is axially positioned above gas dispersing channel 1828, which expands towards a process region of the deposition chamber. Main gas conduit 1864 may connect with gas inlet at a 90° angle (as shown in FIGS. 18A-18B) or at an angle greater than or less than 90° (not shown). Gas conduits 1866*a*, 1866*b*, and 1866*c* are coupled to and in fluid communication with main gas conduit 1864. Each of gas conduits 1866*a*, 1866*b*, and 1866*c* may be connected to at least one gas source, such as a precursor gas source, a process gas source, a carrier gas source, or a purge gas source. Gases coming from gas sources flow through gas conduits 1866*a*, 1866*b*, and 1866*c* before entering main gas conduit 1864. Gases may merge at point 1830*a* if simultaneously flowing from gas conduits 1866*a*, 1866*b*, and 1866*c*. Subsequently, gases flow into gas dispersing channel 1828 by gas inlet 1862.

Figure 18C:
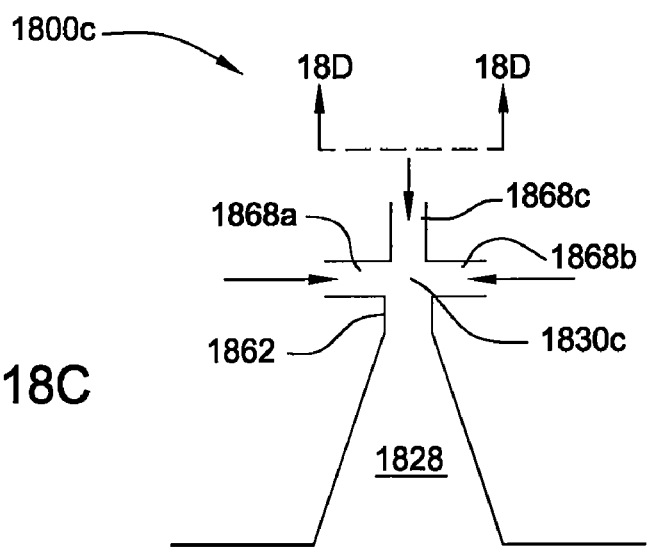
Figure 18D:
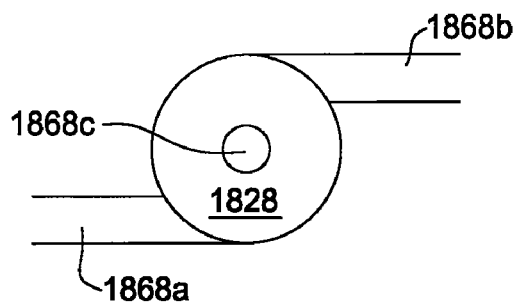

FIGS. 18C-18D depict gas delivery assembly 1800*c*, similarly to the configuration of gas delivery assembly 1800*a*, but without main gas conduit 1864, as described in another embodiment. Gas delivery assembly 1800*c* contains gas inlet 1862 axially positioned above gas dispersing channel 1828, which expands towards a process region of the deposition chamber. Gas conduits 1868*a*, 1868*b*, and 1868*c* are coupled to and in fluid communication directly with gas inlet 1862. Gas inlet 1862 may connect with gas conduits 1868*a* and 1868*b* at a 90° angle (as shown in FIGS. 18B-18C) or at an angle greater than or less than 90° (not shown). Each of gas conduits 1868*a*, 1868*b*, and 1868*c* may be connected to at least one gas source, such as a precursor gas source, a process gas source, a carrier gas source, or a purge gas source. Gases may merge at point 1830*c*, just above gas inlet 1862, if simultaneously flowing from gas conduits 1868*a*, 1868*b*, and 1868*c*. Thereafter, gases flow into gas dispersing channel 1828 by gas inlet 1862.

Figure 18E:
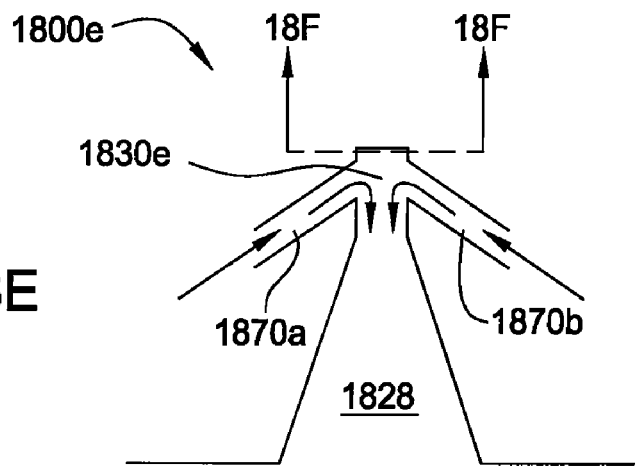
Figure 18F:
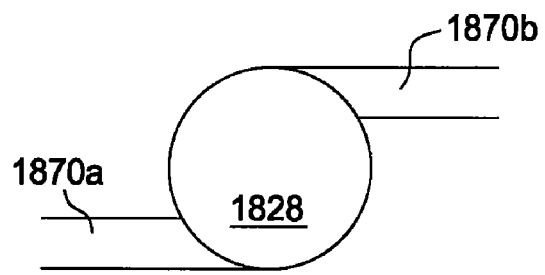

FIGS. 18E-18F depict gas delivery assembly 1800*e*, similarly to the configuration of gas delivery assembly 1800*c*, but without a gas conduit, as described in another embodiment. Gas delivery assembly 1800*e* contains gas inlet 1862 axially positioned above gas dispersing channel 1828, which expands towards a process region of the deposition chamber. Gas conduits 1870*a* and 1870*b* are coupled to and in fluid communication directly with gas inlet 1862. In one embodiment, gas inlet 1862 connects to gas conduits 1870*a* and 1870*b* at an angle of less than 90°, measured from the central axis of gas dispersing channel 1828, such as, within a range from about 10° to about 85°, preferably, from about 20° to about 75°, and more preferably, from about 30° to about 60°, foe example, about 45°. Each of gas conduits 1870*a* and 1870*b* may be connected to at least one gas source, such as a precursor gas source, a process gas source, a carrier gas source, or a purge gas source. Gases may merge at point 1830*e*, just above gas inlet 1862, if simultaneously flowing from gas conduits 1870*a* and 1870*b*, then flow into gas dispersing channel 1828.

Figure 18G:
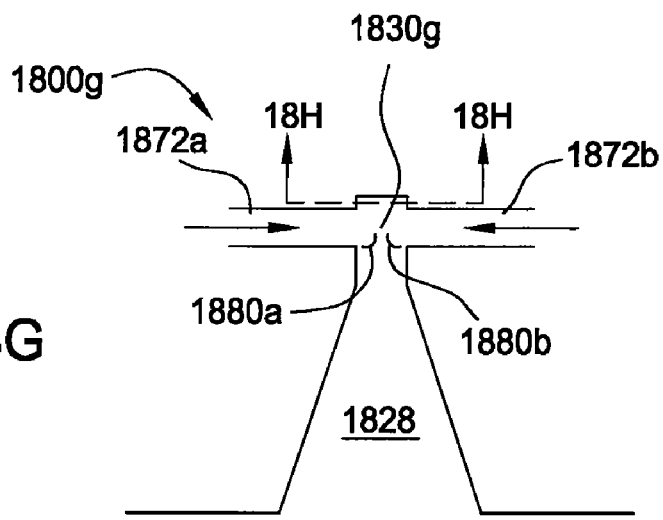
Figure 18H:
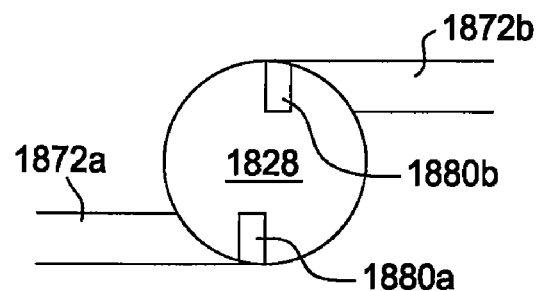

FIGS. 18G-18H depict gas delivery assembly 1800*g*, as described in another embodiment. Gas delivery assembly 1800*g* contains gas inlet 1862 axially positioned above gas dispersing channel 1828, which expands towards a process region of the deposition chamber. Gas conduits 1872*a* and 1872*b* are coupled to and in fluid communication directly with gas inlet 1862. In one embodiment, gas inlet 1862 connects to gas conduits 1872*a* and 1872*b* at an angle of about 90°, measured from the central axis of gas dispersing channel 1828 (as shown in FIGS. 18G-18H). Alternatively, conduits 1872*a* and 1872*b* may connect with gas inlet 1862 at an angle greater than or less than 90° (not shown). Baffles 1880*a* and 1880*b* may be positioned within the gaseous flow path of conduits 1872*a* and 1872*b* and direct gases towards each other and/or in an upwards direction. Each of gas conduits 1872*a* and 1872*b* may be connected to at least one gas source, such as a precursor gas source, a process gas source, a carrier gas source, or a purge gas source. Gases may merge at point 1830*g*, just above gas inlet 1862 and baffles 1880*a* and 1880*b*, if simultaneously flowing from gas conduits 1872*a* and 1872*b*. Subsequently, the process gas flows into gas dispersing channel 1828.

"Atomic layer deposition" (ALD), "cyclical deposition," or "cyclical layer deposition" as used herein refers to the sequential introduction of two or more reactive compounds to deposit a layer of material on a substrate surface. The two, three, or more reactive compounds may alternatively be introduced into a reaction zone or process region of a process chamber. The reactive compounds may be in a state of gas, plasma, vapor, fluid or other state of matter useful for a vapor deposition process. Usually, each reactive compound is separated by a time delay to allow each compound to adhere and/or react on the substrate surface. In one aspect, a first precursor or compound A is pulsed into the reaction zone followed by a first time delay. Next, a second precursor or compound B is pulsed into the reaction zone followed by a second delay. Compound A and compound B react to form a deposited material. During each time delay a purge gas is introduced into the process chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film thickness of the deposited material is formed on the substrate surface. In either scenario, the ALD process of pulsing compound A, purge gas, pulsing compound B and purge gas is a cycle. A cycle can start with either compound A or compound B and continue the respective order of the cycle until achieving a film with the desired thickness. In an alternative embodiment, a first precursor containing compound A, a second precursor containing compound B and a third precursor containing compound C are each separately pulsed into the process chamber. Alternatively, a pulse of a first precursor may overlap in time with a pulse of a second precursor while a pulse of a third precursor does not overlap in time with either pulse of the first and second precursors. "Process gas" as used herein refers to a single gas, multiple gases, a gas containing a plasma, combinations of gas(es) and/or plasma(s). A process gas may contain at least one reactive compound for a vapor deposition process. The reactive compounds may be in a state of gas, plasma, vapor, fluid or other state of matter useful for a vapor deposition process. Also, a process may contain a purge gas or a carrier gas and not contain a reactive compound.

"Substrate" or "substrate surface," as used herein, refers to any substrate or material surface formed on a substrate upon which film processing is performed. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, quartz, and any other materials such as metals, metal nitrides, metal alloys, and other conductive materials, depending on the application. Barrier layers, metals or metal nitrides on a substrate surface may include titanium, titanium nitride, titanium silicide nitride, tungsten, tungsten nitride, tungsten silicide nitride, tantalum, tantalum nitride, or tantalum silicide nitride. Substrates may have various dimensions, such as 200 mm or 300 mm diameter wafers, as well as, rectangular or square panes. Substrates include semiconductor substrates, display substrates (e.g., LCD), solar panel substrates, and other types of substrates. Unless otherwise noted, embodiments and examples described herein are preferably conducted on substrates with a 200 mm diameter or a 300 mm diameter, more preferably, a 300 mm diameter. Substrates on which embodiments of the invention may be useful include, but are not limited to semiconductor wafers, such as crystalline silicon (e.g., Si<100> or Si<111>), silicon oxide, glass, quartz, strained silicon, silicon germanium, doped or undoped polysilicon, doped or undoped silicon wafers and patterned or non-patterned wafers. Substrates may be exposed to a pretreatment process to polish, etch, reduce, oxidize, hydroxylate, anneal and/or bake the substrate surface.

While foregoing is directed to the preferred embodiment of the invention, other and further embodiments of the invention may be devised without departing from the basic scope thereof, and the scope thereof is determined by the claims that follow.

The invention claimed is:

1. A chamber for processing substrates, comprising:
   a substrate support comprising a substrate receiving surface; and
   a chamber lid assembly comprising:
      an expanding channel extending along a central axis at a central portion of the chamber lid assembly;
      a tapered bottom surface extending from the expanding channel to a peripheral portion of the chamber lid assembly, wherein the tapered bottom surface is shaped and sized to substantially cover the substrate receiving surface;
      a first conduit coupled to a first gas passageway, wherein the first gas passageway surrounds the expanding channel and comprises a first plurality of inlets extending into the expanding channel; and
      a second conduit coupled to a second gas passageway, wherein the second gas passageway surrounds the expanding channel and comprises a second plurality of inlets extending into the expanding channel, and the first plurality of inlets and the second plurality of inlets are positioned to provide a circular gas flow pattern through the expanding channel.

2. The chamber of claim 1, wherein the first gas passageway is positioned directly above the second gas passageway.

3. The chamber of claim 2, wherein the first gas passageway and the second gas passageway both surround an upper portion of the expanding channel.

4. The chamber of claim 1, wherein the first plurality of inlets and the second plurality of inlets are independently positioned to direct gas at an inner surface of the expanding channel.

5. The chamber of claim 4, wherein the circular gas flow pattern comprises a flow pattern selected from the group consisting of vortex, helix, spiral, twirl, twist, coil, whirlpool, and derivatives thereof.

6. The chamber of claim 5, wherein the circular gas flow pattern extends at least about 1.5 revolutions around the central axis of the expanding channel.

7. The chamber of claim 6, wherein the circular gas flow pattern extends at least about 4 revolutions around the central axis of the expanding channel.

8. The chamber of claim 1, wherein a first valve is coupled to the first conduit and a second valve is coupled to the second conduit, and a first gas source is in fluid communication to the first valve and a second gas source is in fluid communication to the second valve.

9. The chamber of claim 8, wherein the first and second valves enable an atomic layer deposition process with a pulse time of about 2 seconds or less.

10. The chamber of claim 9, wherein the pulse time is within a range from about 0.05 seconds to about 0.5 seconds.

11. The chamber of claim 1, further comprising a reaction zone having a volume of about 3,000 cm$^3$ or less, wherein the reaction zone is defined between the tapered bottom surface and the substrate receiving surface.

12. The chamber of claim 11, wherein the volume is about 1,500 cm$^3$ or less.

13. The chamber of claim 12, wherein the volume is about 600 cm$^3$ or less.

14. A chamber for processing substrates, comprising:
    a substrate support comprising a substrate receiving surface; and
    a chamber lid assembly comprising:
       an expanding channel extending along a central axis at a central portion of the chamber lid assembly;
       a first conduit coupled to a first gas passageway, wherein the first gas passageway surrounds the expanding channel and comprises a first plurality of inlets extending into the expanding channel;
       a second conduit coupled to a second gas passageway, wherein the second gas passageway surrounds the expanding channel and comprises a second plurality of inlets extending into the expanding channel, wherein the first gas passageway is positioned directly above the second gas passageway, and the first plurality of inlets and the second plurality of inlets are positioned to provide a circular gas flow pattern through the expanding channel; and
       a first valve coupled to the first conduit and a second valve coupled to the second conduit, where the first and second valves enable an atomic layer deposition process with a pulse time of about 2 seconds or less.

15. The chamber of claim 14, wherein the pulse time is within a range from about 0.05 seconds to about 0.5 seconds.

16. The chamber of claim 14, wherein the chamber lid assembly further comprises a tapered bottom surface extending from the expanding channel to a peripheral portion of the chamber lid assembly.

17. The chamber of claim 16, wherein the tapered bottom surface is shaped and sized to substantially cover the substrate receiving surface.

18. The chamber of claim 14, wherein a first gas source is in fluid communication to the first valve and a second gas source is in fluid communication to the second valve.

19. The chamber of claim 14, wherein the first plurality of inlets and the second plurality of inlets are independently positioned to direct gas at an inner surface of the expanding channel.

20. The chamber of claim 19, wherein the circular gas flow pattern comprises a flow pattern selected from the group consisting of vortex, helix, spiral, twirl, twist, coil, whirlpool, and derivatives thereof.

21. The chamber of claim 20, wherein the circular gas flow pattern extends at least about 1.5 revolutions around the central axis of the expanding channel.

22. The chamber of claim 21, wherein the circular gas flow pattern extends at least about 4 revolutions around the central axis of the expanding channel.

23. The chamber of claim 22, wherein the chamber lid assembly further comprises a tapered bottom surface extending from the expanding channel to a peripheral portion of the chamber lid assembly, the chamber further comprises a reaction zone having a volume of about 3,000 cm$^3$ or less, and the reaction zone is defined between the tapered bottom surface and the substrate receiving surface.

24. The chamber of claim 23, wherein the volume is about 1,500 cm$^3$ or less.

* * * * *